United States Patent [19]

Kusuda et al.

[11] Patent Number: 5,451,977
[45] Date of Patent: Sep. 19, 1995

[54] SELF-SCANNING LIGHT-EMITTING ARRAY AND A DRIVING METHOD OF THE ARRAY

[75] Inventors: Yukihisa Kusuda; Kiyoshi Tone, both of Tsukuba; Ken Yamashita, Tsuchiura; Shuhei Tanaka, Tsukuba, all of Japan

[73] Assignee: Nippon Sheet Glass Co., Ltd., Osaka, Japan

[21] Appl. No.: 84,766

[22] Filed: Jun. 28, 1993

Related U.S. Application Data

[63] Continuation of Ser. No. 860,203, Mar. 26, 1992, abandoned, which is a continuation of Ser. No. 324,197, Mar. 16, 1989, abandoned.

[30] Foreign Application Priority Data

| Mar. 18, 1988 | [JP] | Japan | 63-65392 |
| Jul. 1, 1988 | [JP] | Japan | 63-164353 |
| Sep. 30, 1988 | [JP] | Japan | 63-246629 |
| Sep. 30, 1988 | [JP] | Japan | 63-246630 |
| Oct. 19, 1988 | [JP] | Japan | 63-263402 |

[51] Int. Cl.$^6$ ............................... G09G 3/32
[52] U.S. Cl. ........................ 345/44; 345/82; 257/21
[58] Field of Search ............ 340/782, 762, 766, 719, 340/718; 358/475, 482, 483; 307/13, 461, 464; 257/21, 22, 80, 81, 82, 83, 84; 345/39, 44, 46, 82, 84, 205, 206, 214, 215

[56] References Cited

U.S. PATENT DOCUMENTS

| 2,856,544 | 10/1988 | Ross | 377/104 |
| 2,922,898 | 1/1960 | Henisch | 377/104 |
| 3,175,099 | 3/1965 | Sato | 377/104 |
| 3,448,294 | 6/1969 | Henderson | 307/13 |
| 3,680,049 | 7/1972 | Tsukada | 340/166 EL |
| 3,696,389 | 10/1972 | Fenner | 340/324 R |
| 3,991,359 | 11/1976 | Thompson et al. | 307/13 |
| 4,316,156 | 2/1982 | Scifres et al. | 357/17 |
| 4,672,219 | 6/1987 | Iwabuchi et al. | 358/482 |
| 4,757,210 | 7/1988 | Bharat et al. | 357/30 |
| 4,819,048 | 4/1989 | Mand et al. | 357/38 |
| 4,829,357 | 5/1989 | Kasahara | 357/38 |
| 4,943,970 | 7/1990 | Bradley | 357/17 |

FOREIGN PATENT DOCUMENTS

| 0210898 | 2/1987 | France | G09G 3/20 |
| 2099221 | 12/1982 | United Kingdom | H01L 25/00 |

OTHER PUBLICATIONS

"Light Spot Scanner of Gallium Arsenide Strip" Solid State Electronics vol. 20, No. 5, (1977).
Patent Abstracts of Japan, vol. 10, No. 46 (Feb. 1986) JP-A-60 201 679.
Patent Abstracts of Japan, vol. II, No. 99 (Mar. 1987) JP-A-61 248 483.

*Primary Examiner*—Ulysses Weldon
*Assistant Examiner*—Xiao M. Wil
*Attorney, Agent, or Firm*—Parmelee, Bollinger & Bramblett

[57] ABSTRACT

A self-scanning light-emitting element array is disclosed. A coupled array of light-emitting elements is constituted so that a light-emitting element which is turned on influences a light-emitting element to be turned on next so that its threshold level is changed. When each element is clock-driven by a common drive pulse, the change in threshold level is shifted in the array direction, so that a turn-on operation is transferred in a clock period of the drive pulse.

15 Claims, 38 Drawing Sheets

F I G. 52
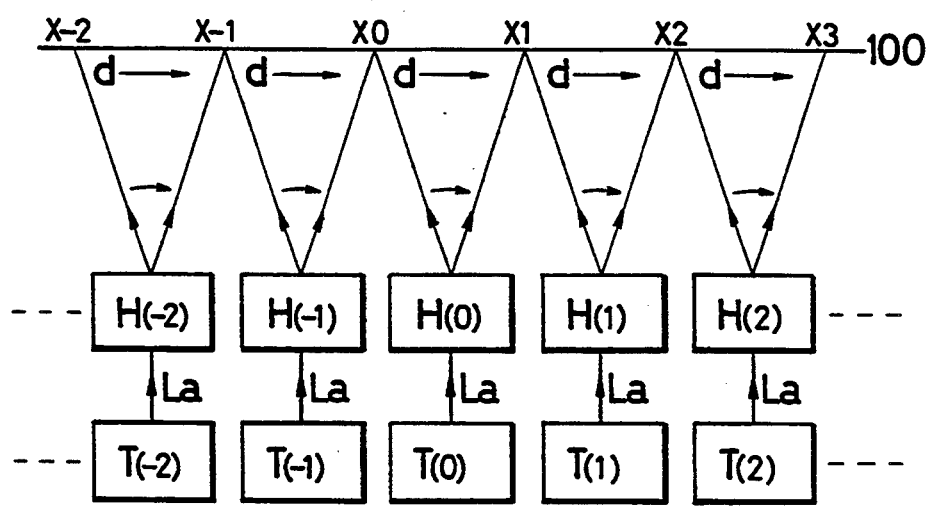

SELF-SCANNING LIGHT-EMITTING ARRAY AND A DRIVING METHOD OF THE ARRAY

This application is a continuation of Ser. No. 07/860,203 filed Mar. 26, 1992, which is a continuation of Ser. No. 07/324,197 filed Mar. 16, 1989, both now abandoned.

BACKGROUND OF THE INVENTION

Field of the Invention

The present invention relates to a self-scanning type light-emitting element array in which light-emitting elements are integrated on a single substrate and a method of driving the same.

Description of the Prior Art

As typical light-emitting elements, an LED (light-emitting diode) and an LD (laser diode) are known.

In the LED, a pn or pin junction of a compound semiconductor (GaAs, GaP, GaAlAs or the like) is formed, and a forward bias voltage is applied to the junction so as to inject carriers in the junction. The LED utilizes a light-emission phenomenon occurred by carrier recombination.

In the LD, a waveguide is arranged in the LED. When a current exceeding a given threshold valve is supplied, injected electron-hole pairs are increased, and a population inversion state is established. Light generated by parallel reflection mirrors utilizing a cleavage surface is fed back to an active layer, thus causing laser oscillation. Then, a laser beam is emitted from an end face of the waveguide.

Negative resistance elements (light-emitting thyristor, laser thyristor and the like) are known as a light-emitting element having the same light-emission mechanism as those of the LED and LD. In the light-emitting thyristor, a pnpn structure is formed by a compound semiconductor described above, and a thyristor using silicon is put into practical applications.

FIGS. 22 and 23 show the basic structure and current-voltage characteristics of the negative resistance element having the light-emission function (called a light-emitting thyristor herein). The structure shown in FIG. 22 is the same as that of a thyristor in which a pnpn structure is formed on an n-type GaAs substrate. FIG. 23 also represents the same S-shaped negative resistance characteristics as those of the thyristor. Not only a two-terminal thyristor shown in FIG. 22 but also a three-terminal thyristor shown in FIG. 24 are also known. The gate of the three-terminal thyristor has a function of controlling an ON voltage. The ON voltage is converted to a voltage as a sum of a gate voltage and a diffusion potential. After the thyristor is turned on, the gate electrode voltage substantially coincides with the cathode voltage. If the cathode electrode is grounded, the gate electrode voltage becomes zero volt. As is well known, a threshold voltage of the light-emitting thyristor is decreased when light is externally incident thereon.

A waveguide can be formed in the light-emitting thyristor to form a laser thyristor by quite the same principle as the LD (Tashiro et al., Lecture to the Japan Society of Applied Physics, Autumn 1987, No. 18p-ZG-10).

The light-emitting element described above, in particular, the LED is commercially available in such a manner that a large number of LEDs are formed on a compound semiconductor substrate and are cut into pieces and are packaged one by one. An LED for a contact image sensor and a light source for a printer is commercially available as an LED array in which a plurality of LEDs are arrayed on a single chip.

A contact image sensor, an LED printer, and the like require a scanning function of light-emitting points by these light-emitting elements in order to designate read or write points.

However, in order to perform optical scanning using the above-mentioned conventional light-emitting elements, each LED formed in the LED array must be connected to a drive IC, through a wire bonding pad and must be driven by the IC. For this reason, if a large number of LEDs are arranged, the wire bonding pads must be performed corresponding in number to the LEDs, and a large number of drive ICs are required, resulting in high cost. A space for arranging drive ICs must be assured, and it is difficult to achieve a compact array. A pitch between adjacent LEDs is determined depending on the wire bonding technique or the pad size, and it is difficult to decrease the pitch.

SUMMARY OF THE INVENTION

It is an object of the present invention to solve the conventional problems, e.g., the number of wire bonding pads, drive ICs, miniaturization, and a decrease in pitch, by providing a self-scanning function to a light-emitting element array itself. When the light-emitting array has an optical scanning function, almost all drive ICs are not required as well as most of wire bonding pads can be omitted, and the above-mentioned problems can be solved.

It is another object of the present invention to provide a light-emitting array which can stably and reliably perform turn-on self-scanning.

It is still another object of the present invention to provide a self-scanning light-emitting array which can facilitate external control, and can widen a control margin so as not to cause an erroneous operation.

It is still another object of the present invention to provide a self-scanning light-emitting element array which has a simple integrated circuit structure to facilitate its manufacture.

It is still another object of the present invention to provide a self-scanning light-emitting element array which has directivity in a self-scanning function in an element array direction so that turn-on transfer can be performed by two-phase clocks.

It is still another object of the present invention to provide a self-scanning light-emitting element array which can allow control for increasing a luminance of at least one element at an arbitrary position in the light-emitting element array, so as to obtain an image display function.

It is still another object of the present invention to provide a self-scanning light-emitting element array which can obtain light-point scanning performance sufficiently finer than an array pitch of light-emitting elements.

It is still another object of the present invention to provide a method of driving a light-emitting element array, suitable for stably and reliably performing self-scanning of the light-emitting element array, and simplifying an integrated circuit structure of the array.

It is still another object of the present invention to a method of driving a light-emitting array, in which turn-on transfer is driven in response to clocks, and transfer control and sync control of an image display are realized.

A self-scanning light-emitting element array of the present invention comprises:

an array of light-emitting elements, individual turn-on threshold levels of which are able to be controlled;

coupling means for coupling the elements in an array direction so that an ON light-emitting element has an influence to change the threshold level of a light-emitting element which is to be turned on next; and drive means, connected to the elements to parallelly supply drive pulses, for transferring a turn-on operation in the array direction at an interval drive pulses while propagating a change in threshold level in the array direction.

A method of driving a self-scanning light-emitting element array of the present invention comprises: coupling a plurality of light-emitting elements so that an ON light-emitting element has an influence of changing the threshold level of a light-emitting element which is to be turned on next; polyphase-driving the light-emitting elements so that the ON light-emitting element and the light-emitting element to be turned on next are driven by drive pulses having different phases; controlling a valid direction and a valid range of the influence so that the influence of changing the threshold level is made valid for only the next phase; and sequentially transferring a turn-on operation in an element array direction in a phase switching period.

BRIEF DESCRIPTION OF THE DRAWINGS

These and other objects, features and advantages of the invention will become more apparent upon a reading of the following detailed specification and drawing, in which:

FIG. 52 is a schematic view showing a basic structure of embodiments H;

DESCRIPTION OF THE PREFERRED EMBODIMENTS

Embodiments A

Embodiments A to be described hereinafter utilize light as an interaction medium between the elements.

(Embodiment A-1)

Figure 1:
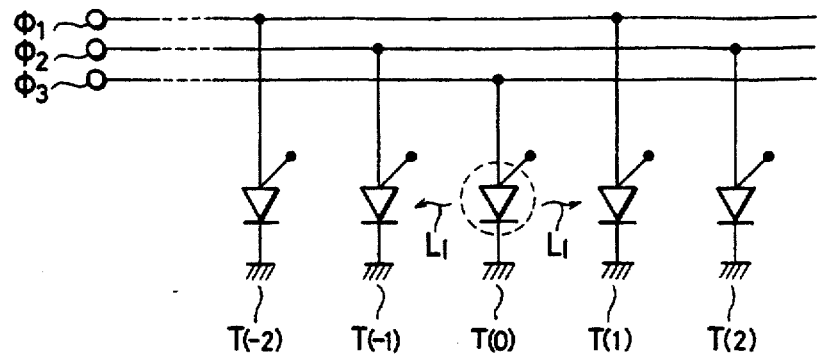
FIG. 1 is a schematic circuit diagram of a light-emitting element array using light in an embodiment A-1.

FIG. 1 is an equivalent circuit diagram of the principle of an embodiment A-1. This diagram illustrates a case wherein a typical three-terminal light-emitting thyristor is used as an example of a light-emitting element whose light-emission threshold voltage and current can be externally controlled.

Light-emitting thyristors $T_{(-2)}$ to $T_{(+2)}$ are arrayed in a line. Each of three transfer clock lines ($\phi_1$, $\phi_2$ and $\phi_3$) is connected to the corresponding anode electrodes of every three light-emitting elements. A light-emitting thyristor has characteristics that its turn-on voltage is decreased when it senses light. When light-emitting thyristors are arranged so that light emitted from an ON light-emitting thyristor is incident on the next light-emitting thyristor, the turn-on voltage of the next thyristor near the ON light-emitting thyristor or n element which is arranged to sufficiently receive light from the ON element is decreased.

The operation of the equivalent circuit diagram of FIG. 1 will be described below. Assume that a high-level voltage of a positive going pulse is applied to the transfer clock line $\phi_3$, and a light-emitting thyristor $T_{(0)}$ is kept on. Light $L_1$ emitted from the light-emitting thyristor $T_{(0)}$ is incident on the next light-emitting thyristors $T_{(-1)}$ and $T_{(+1)}$, thus decreasing their ON voltages to turn on thereof when a high-level voltage of another positive-going pulse is applied. Since the next but one light-emitting thyristors $T_{(-2)}$ and $T_{(+2)}$ are located farther than the next light-emitting thyristors $T_{(-1)}$ and $T_{(+1)}$, incident light is weak, and their ON voltages are not so decreased. In this state, a high-level voltage of another positive-going pulse is assumed to be applied to the next clock line $\phi_1$. Since the ON voltage of the light-emitting thyristor $T_{(+1)}$ is decreased by the influence of light as compared to that of the light-emitting thyristor $T_{(-2)}$, if the high-level voltage of the transfer clock is set to between the ON voltages of the light-emitting thyristors $T_{(+1)}$ and $T_{(-2)}$, only the light-emitting thyristor $T_{(+1)}$ is turned on, and the light-emitting thyristor $T_{(-2)}$ can be kept off. Thus, the light-emitting thyristor $T_{(+1)}$ is turned on. When a low-level voltage is applied to the clock line $\phi_3$, the light-emitting thyristor $T_{(0)}$ is turned off and only the light-emitting thyristor $T_{(+1)}$ is turned on. Thus, an ON state of the light-emitting thyristors is transferred, for example, from $T_{(0)}$ to $T_{(+1)}$ upon applying the three phase positive-going pluses to three clock lines.

Based on the above-mentioned principle, the high-level periods of the clock pulses $\phi_1$, $\phi_2$ and $\phi_3$ are set to slightly overlap each other, the ON states of the light-emitting thyristors are sequentially transferred. More specifically, a light-emission point by the ON state light-emitting thyristor is sequentially transferred by applying three phase clock pulses.

According to this embodiment, a self-scanning type light-emitting element array which cannot be achieved by the prior art can be realized.

(Embodiment A-2)

In an embodiment A-2, an IC structure of the arrangement of the embodiment A-1 will be described below.

Figure 2:
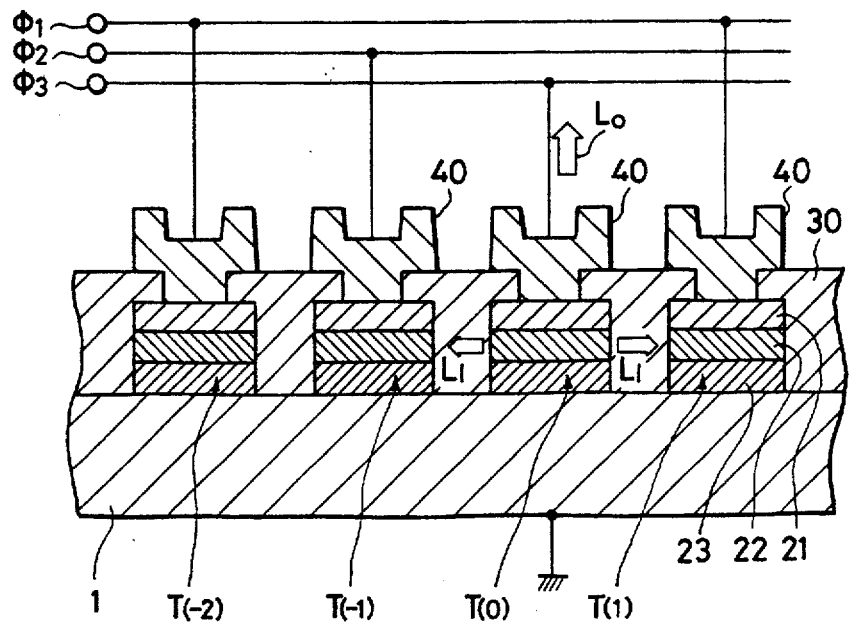
FIG. 2 is a schematic sectional view of a light-emitting element array using light in an embodiment A-2.

FIG. 2 is a schematic view of the IC structure. A p-type semiconductor layer 23, an n-type semiconductor layer 22, and a p-type semiconductor layer 21 are formed on a grounded n-type GaAs substrate 1. The multilayer structure is patterned and etched into light-emitting thyristor $T_{(-2)}$ to $T_{(+2)}$ by photolithography. Each electrode 40 makes an ohmic contact with the corresponding p-type semiconductor layer 21, and an insulating layer 30 serves as a protection film for preventing short-circuiting between an element and a wiring and at the same time preventing deterioration of characteristics. The insulating layer 30 is formed of a material which allows light having a light-emission wavelength of a light-emitting thyristor to pass therethrough.

The p-type semiconductor layer 21 serves as an anode of this thyristor, and the n-type GaAs substrate 1 serves as a cathode. Each of three transfer clock lines ($\phi_1$, $\phi_2$ and $\phi_3$) is sequentially connected to the anode electrodes 40 of every three light-emitting thyristors.

It is generally known that the ON voltage of a light-emitting thyristor is changed depending on an amount of light incident on the thyristor. Therefore, if the light-emitting thyristors are arranged so that light emitted from an ON light-emitting thyristor is incident on adjacent light-emitting thyristors, the ON voltages of the light-emitting thyristors adjacent to the ON thyristor are decreased as compared to a case wherein no light is emitted.

In the structure illustrated in FIG. 2, the insulating layer 30 is formed of a transparent film with respect to a light-emission wavelength. If a light-emitting thyristor $T_{(0)}$ is in an ON state, light $L_0$ is emitted upward, and light $L_I$ is well input to adjacent elements $T_{(-1)}$ and $T_{(+1)}$, thus decreasing their ON voltages.

The operation of the light-emitting element array is the same as that in the embodiment A-1.

According to this embodiment, an integrated self-scanning type light-emitting element array utilizing light coupling, which cannot be achieved by the prior art, can be realized.

(Embodiment A-3)

In this embodiment, a practical structure of the embodiment A-2 will be described.

Figure 3:
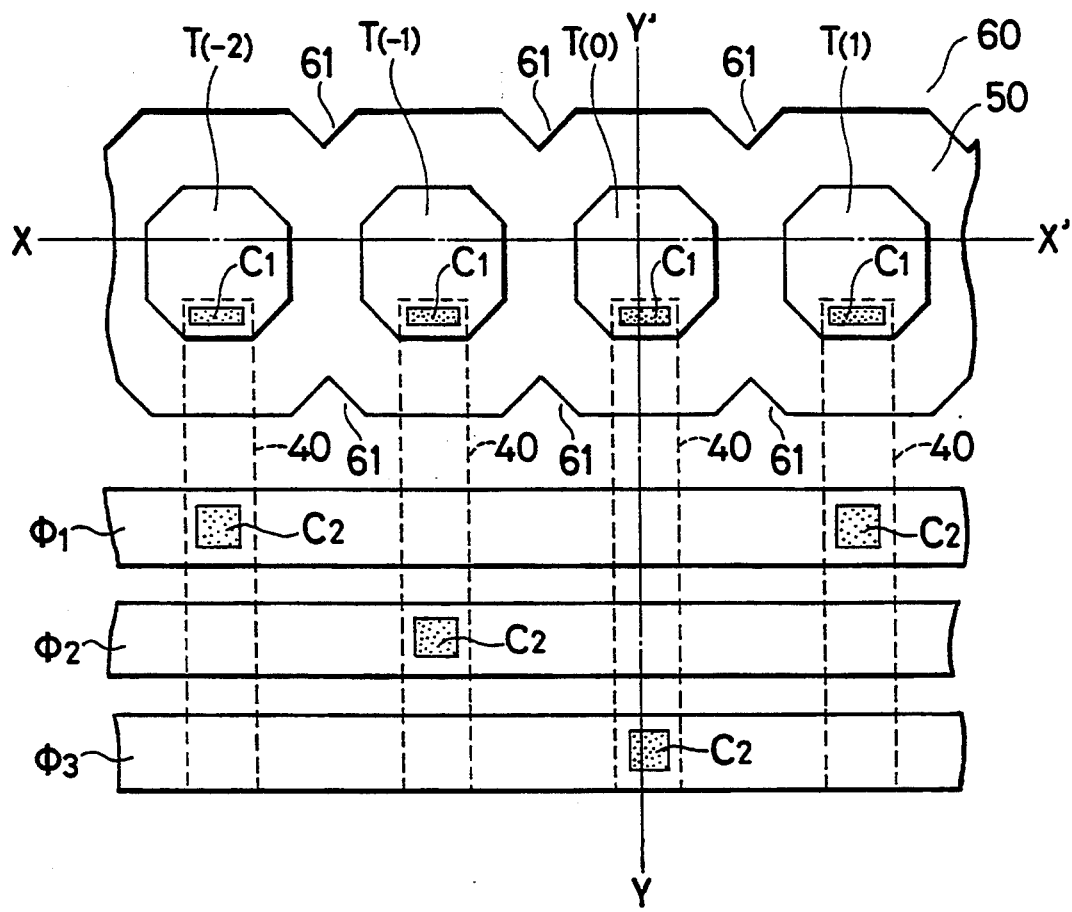
FIG. 3 is a schematic plan view of a light-emitting element array using light in an embodiment A-3.
Figure 4:
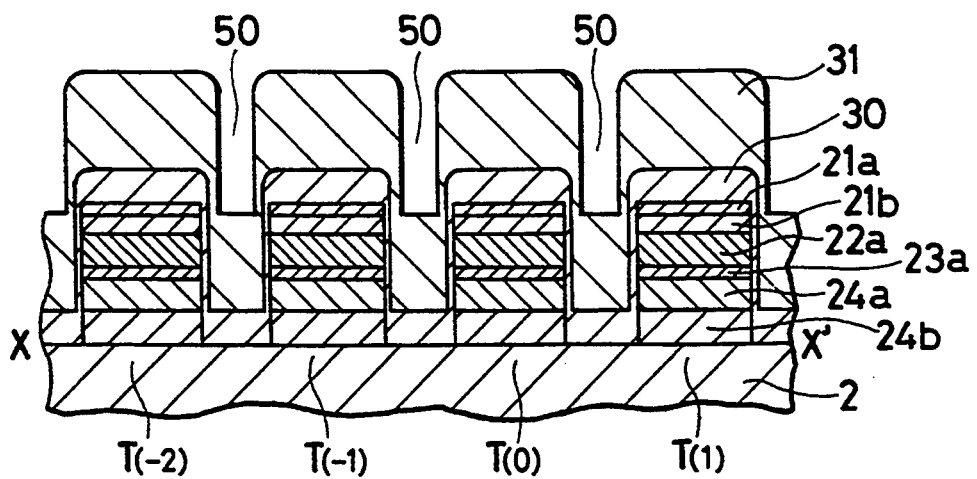
FIGS. 4 and 5 are schematic sectional views of the light-emitting element array using light in the embodiment A-3.
Figure 5:
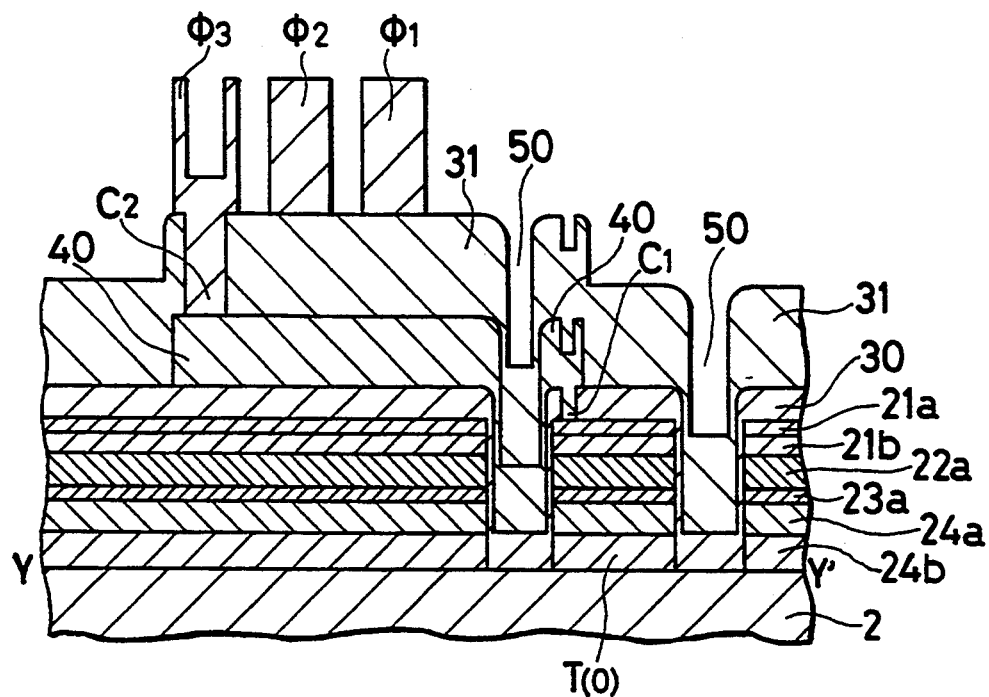

FIG. 3 is a plan view of this embodiment, and FIGS. 4 and 5 are sectional views taken along lines X—X' and Y—Y' in FIG. 3, respectively. A laddery groove 50 extending along a longitudinal direction is formed on a ppnpnn multilayer structure described below to expose the substrate 2 and then isolate light-emitting thyristors $T_{(-2)}$ to $T_{(+1)}$. Light barriers 61 are projected to the grooves 50 so as not to cause light from an ON light-emitting thyristor to be incident on the next but one thyristors other than two adjacent elements.

In this embodiment, projections of a field 60 are used as the light barriers 61. However, other shapes may be employed. A contact hole $C_1$ is formed in an insulating layer 30 deposited on whole upper surface of the structure to expose an upper electrode of each light-emitting thyristor that is electrically connected to a crosswise metal strip 40. A contact hole $C^2$ is also provided on another insulating layer 31 deposited thereafter to connect the crosswise strip 40 to one of longitudinal clock lines $\phi_1$, $\phi_2$ and $\phi_3$.

The transfer clock line $\phi_1$ is connected to the light-emitting thyristors $T_{(-2)}$ and $T_{(+1)}$, the transfer clock line $\phi_2$ is connected to the light-emitting thyristor $T_{(-1)}$, and the transfer clock line $\phi_3$ is connected to the light-emitting thyristor, $T_{(0)}$.

FIG. 4 is a sectional view taken along a line X—X' in FIG. 3. This line is parallel to the longitudinal direction of the light-emitting element array, and FIG. 4 reveals a state of the light-emitting thyristors arrayed in a line with a predetermined pitch. An insulating film 30 for preventing short-circuiting between each light-emitting thyristor and each metal strip 40 and an insulating film 31 as an insulating interlayer for preventing short-circuiting between the metal strips 40 and the transfer clock lines are formed in the groove 50 to surround the light-emitting thyristors. These insulating films 30 and 31 are formed of transparent insulating films so as not to interfere light coupling between adjacent thyristors, or may be formed of insulating films which can properly absorb light so as to be able to adjust light coupling between adjacent thyristors. Furthermore, an insulating film which properly absorbs light and a transparent insulating film may be stacked to have an appropriate film thickness. With this structure, light coupling between adjacent thyristors can be established, and a transfer operation (light scanning operation) can be performed. The film structure of the light-emitting thyristor is the same as that shown in FIG. 21 (to be described later).

FIG. 5 is a sectional view taken along a line Y—Y' in FIG. 3. This line is perpendicular to the array direction of the light-emitting element array, and FIG. 5 reveals a connection state of wirings and electrodes. The contact hole $C_1$ led to the upper electrode of each light-emitting thyristor is formed in the insulating film 30, and is externally led to an external portion through the strip 40. The strip 40 is connected to the transfer clock line $\phi_3$ via the through hole $C_2$.

A manufacturing process for realizing this embodiment is as follows.

An n-type GaAs layer 24b, an n-type AlGaAs layer 24a, a p-type GaAs layer 23a, an n-type GaAs layer 22a, a p-type AlGaAs layer 21b, and a p-type GaAs layer 21a are sequentially formed and stacked on an n+-type GaAs substrate 2 by epitaxial growth to provide the ppnpnn multilayer structure. The laddery groove 50 is photoetched to provide a plurality of light-emitting thyristors. Thereafter, the insulating film 30 is formed to cover the whole upper surface thereof, and the contact holes $C_1$ are formed therein using the photoetching technique to provide anodes of the light-emitting thyristors. A metal layer is then formed by a deposition or sputtering method, and is photoetched to provide the crosswise metal strips 40 each electrically connected to the anode thereof through the contact hold $C_1$. The insulating film 31 is formed on the film 30 and the strips 40, and the through holes $C_2$ are formed using the photoetching technique. A metal wiring layer is formed by the deposition or sputtering method, and is photoetched to provide the transfer clock lines ($\phi_1$, $\phi_2$ and $\phi_3$) each connected to the metal strips 40 in every third fashion through the contact hole $C_2$. With the above-mentioned process, the structure of this embodiment is completed.

Although not described in this embodiment, a transparent protection film may be formed on the transfer clock lines. If it is not preferable that the thickness of the insulating film is too large to degrade a transmittance of light and to decrease an amount of externally output light, part or all of the upper insulating film of the light-emitting element may be removed by, e.g., photoetching.

According to this embodiment, an integrated self-scanning light-emitting element array can be manufactured.

(Embodiment A-4)

Figure 6:
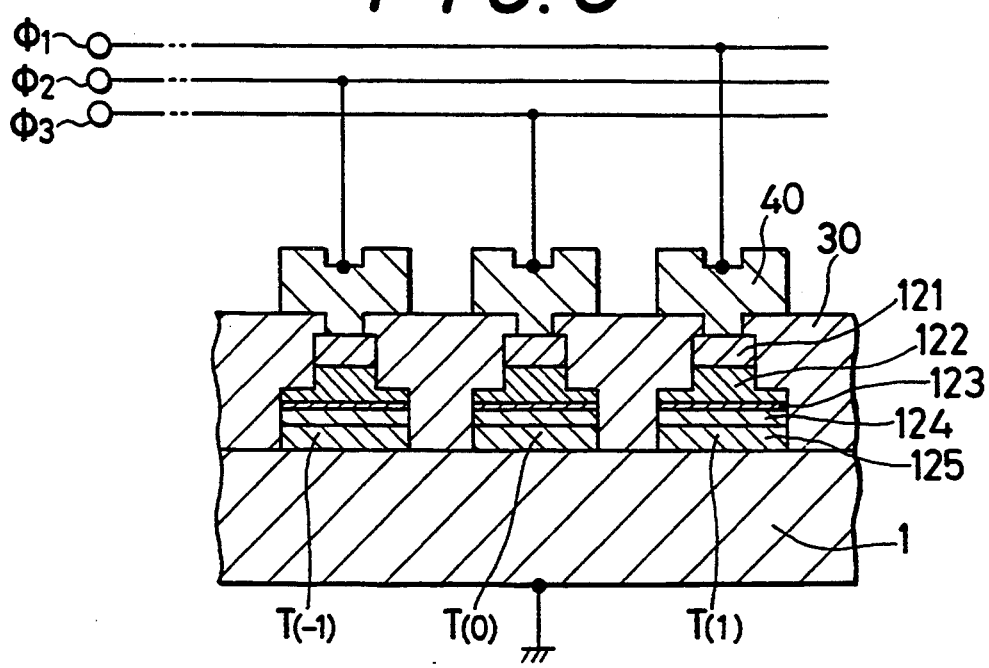
FIG. 6 is a schematic sectional view of a light-emitting element array using light in an embodiment A-4.

FIG. 6 is a sectional view when a laser thyristor is used as a light-emitting element. Light-emitting elements (laser thyristors $T_{(-1)}$ to $T_{(+1)}$ are formed to have the following structure. An n-type AlGaAs layer 125, a p-type AlGaAs layer 124, an i-type (non-doped) GaAs layer 123, an n-type AlGaAs layer 122, and a p-type AlGaAs layer 121 are sequentially stacked on an n-type GaAs substrate 1. The p-type AlGaAs layer 121 and the n-type AlGaAs layer 122 are patterned as shown in FIG. 6. The shape illustrated in FIG. 6 is the same as that of a conventional stripe type laser diode. The entire width of the p-type AlGaAs layer 121 and the partial width of the n-type AlGaAs layer 122 are 10 $\mu$m or less. Other portions are the same as those in FIGS. 2 to 5 described above.

In an operation of the laser thyristor, the same operation as in a conventional light-emitting thyristor is performed until a current component supplied to the thyristor reaches a laser oscillation current, and light emitted by a current component below the laser oscillation current is isotropically output. A laser beam is output in a direction perpendicular to the sheet surface of FIG. 6. Therefore, the laser beam does not contribute to light coupling between adjacent elements, and light emitted by a current component below the laser oscillation current contributes to light coupling. Other mechanisms of the transfer operation are the same as those in the embodiment A-2.

(Embodiment A-5)

Figure 7:
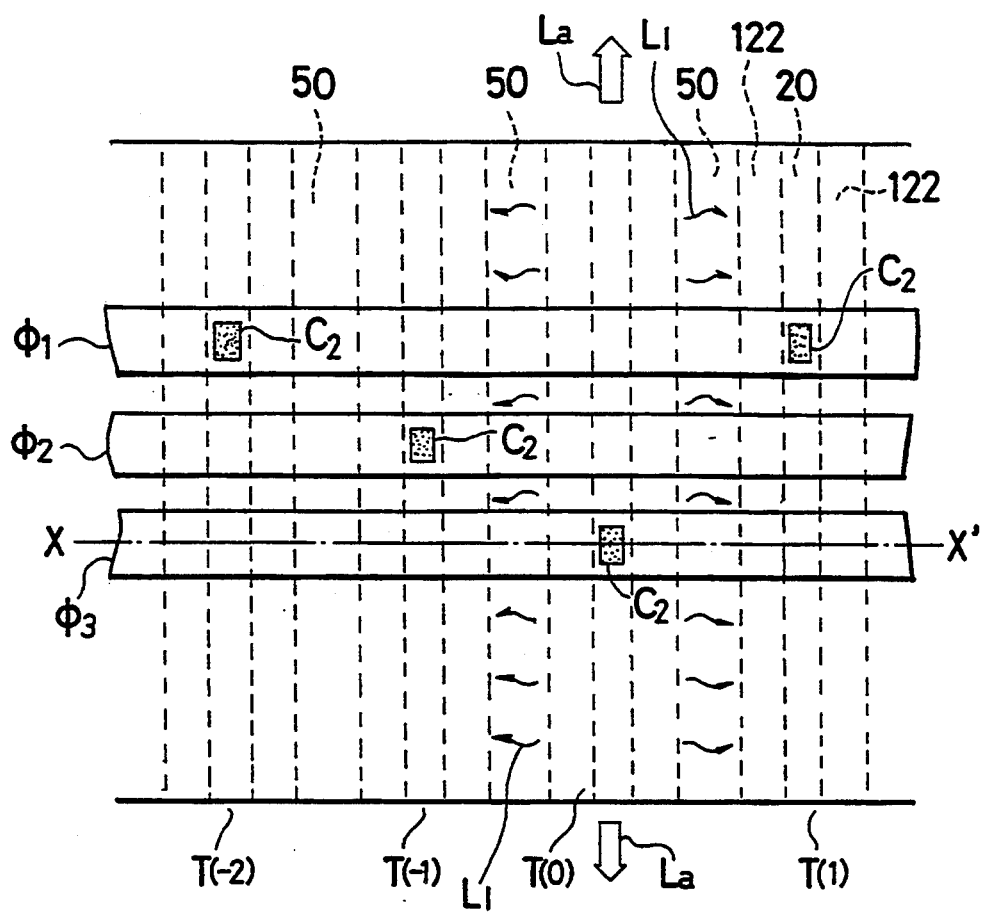
FIG. 7 is a schematic plan view of a light-emitting element array using light in an embodiment A-5.
Figure 8:
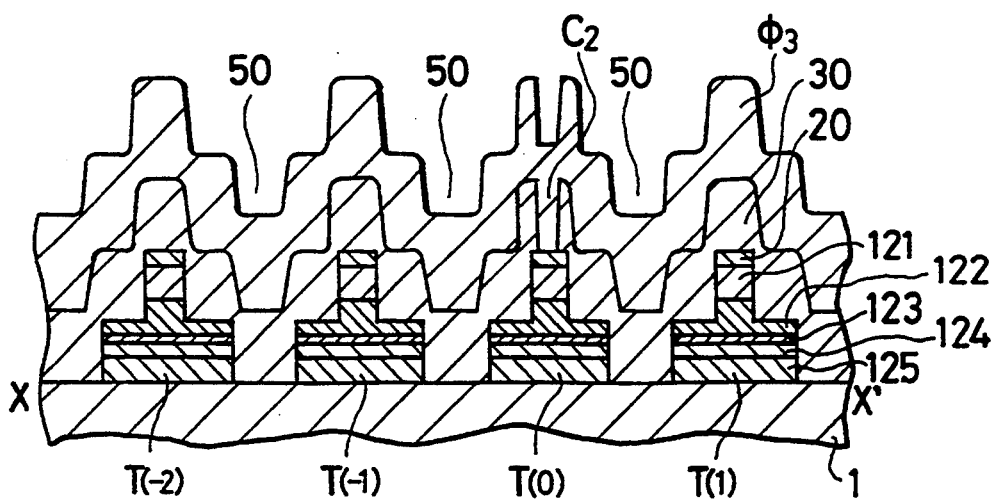
FIG. 8 is a schematic sectional view of the light-emitting element array using light in the embodiment A-5.

FIGS. 7 and 8 show an embodiment A-5 presenting a practical structure of the embodiment A-4. FIG. 7 is a plan view, and FIG. 8 is a sectional view taken along a line X—X' in FIG. 7. A manufacturing method of the structure shown in FIG. 7 will be briefly described below. A n-type AlGaAs layer 125, a p-type AlGaAs layer 124, an i-type (non-doped) GaAs layer 123, an n-type AlGaAs layer 122, a p-type AlGaAs layer 121, and an upper electrode layer 20 are sequentially stacked on an n-type GaAs substrate 1 to provide a pnipn multilayer structure (a p-type GaAs layer for improving an ohmic contact may be formed between the p-type AlGaAs layer 121 and the upper electrode layer 20). The upper electrode layer 20 is patterned into a plurality of rectangles each having the same width as that of the resultant n-type AlGaAs layer 125 in FIG. 8. Using the rectangular patterns as a mask, the p-type AlGaAs layer 121 to the n-type AlGaAs layer 125 are etched. In this case, element isolation grooves 50 are formed. The upper electrode pattern 20 is further etched into a strip having a width of 10 μm or less. Using the strip patterns as another mask, the p-type AlGaAs layer 121 and portion of the n-type AlGaAs layer 122 are etched. An insulating film 30 is formed on the resultant structure, and through holes $C_2$ are formed by photoetching. Thereafter, a metal wiring layer for transfer clock lines are formed by deposition or sputtering, and the transfer clock lines ($\phi_1$, $\phi_2$ and $\phi_3$) are formed by photoetching therefrom. Finally, the end face of a laser beam output side is formed by cleavage or the like to have good parallelness, thus completing the structure of this embodiment.

In a conventional integrated light-emitting element array, pn junction diodes are independently formed on a single substrate, are externally led one by one using a wire bonding technique, and are operated by applying a voltage by drive ICs. Thus, assembly such as a wiring bonding process is cumbersome, resulting in high cost. In contrast to this, in a light-emitting element array of this embodiment, three transfer clock terminals need only be externally lead, and assembly is considered simplified. At the same time, a space for drive ICs can be omitted, and a compact self-scanning light-emitting element array as a whole can be produced. In a conventional array, an alignment pitch of light-emitting elements is predetermined depending on the bonding technique. However, the above-mentioned embodiments A-1 to A5 are free from such a restriction, and a light-emitting element array having a smaller pitch can be manufactured. Thus, an application to a device having a very high resolution can be achieved.

In the embodiments A-1 to A-5, the transfer clock pulses are assumed to have three phases, i.e., $\phi_1$, $\phi_2$ and $\phi_3$. The number of phases may be increased to four or five so as to attain a more stable transfer operation. A larger amount of light emitted by a light-emitting thyristor $T_{(0)}$ is caused to incident on a light-emitting thyristor $T_{(+1)}$ than to a light-emitting thyristor $T_{(-1)}$, so that the elements can be driven by two-phase clocks. For example, light-emitting thyristors are arranged in an asymmetrical planar pattern, so that a larger amount of light is emitted to the right in the arrangement.

Figure 21:
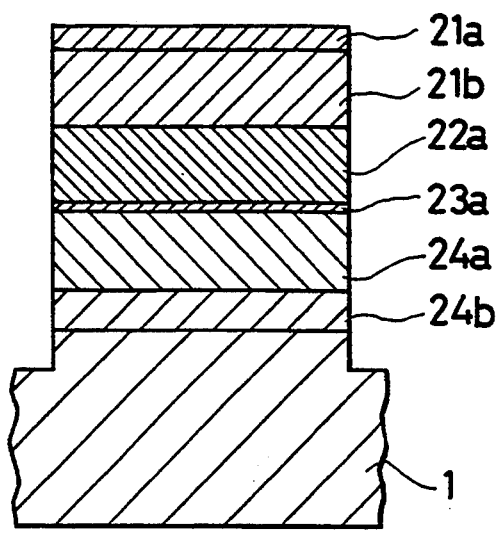
FIG. 21 is a schematic sectional view showing a structure of a light-emitting thyristor of a double-hetero structure.

In the above embodiment, the simplest structure of the light-emitting thyristor has been described. The scope of the present invention includes adaption of a more complex structure and a multilayer structure in order to increase light-emission efficiency. This also applies to many embodiments to be described later. For example, a double-hetero structure may be employed. FIG. 21 shows an example of the double-hetero structure (Tashiro et al., Lecture to the Japan Society of Applied Physics, Spring, 1987, No. 28p-ZE-8). In this structure, an n-type GaAs layer 24b (having a thickness of 0.5 μm) is formed on an n-type GaAs substrate 1. An n-type AlGaAs layer 24a (1 μm) having a wide band gap, a p-type GaAs layer 23a (5 μm), an n-type GaAs layer 22a (1 μm), a p-type AlGaAs layer 21b (1 μm) having a wide band gap, and a p-type GaAs layer 21a (0.15 μm) for making an ohmic contact with a lead electrode are sequentially stacked on the GaAs layer 24b. A light-emission layer is the n-type GaAs layer 22a (1 μm) sandwiched between the layers 23a and 21b. Injected electrons and holes are trapped in the GaAs layer 22a having a narrow band gap, and are recombined in this region to emit light.

The light-emitting element need not always be a light-emitting thyristor, and is not particularly limited if its turn-on voltage is changed by light. For example, the above-mentioned laser thyristor may be employed.

In the above embodiment, a pnpn thyristor structure has been exemplified. A structure whose threshold voltage is decreased by light and which is caused to perform a transfer operation by utilizing this function is not limited to the pnpn structure or any other specific structure if it can achieve the above function. For example, if a multilayered structure of six layers or more is employed in place of a pnpn four-layered structure, the same effect can be expected, and the same self-scanning function can be achieved. Furthermore, the same effect may be obtained if another type of thyristor, e.g., a static induction (SI) thyristor or a field control thyristor (FCT), is used. The SI thyristor or the FCT has a structure wherein a central p-type semiconductor layer serving as a current block is replaced with a depletion layer (S. M. Sze, Physics of Semiconductor Devices, 2nd Edition, pp. 238-240).

In the embodiments A-1 to A-5, the light-emitting elements are arrayed in a line, but need not be arranged along a straight line. For example, the elements may be arranged in a zigzag manner depending on applications. The elements may be arranged in two lines from the halfway.

According to the present invention, the light-emitting elements may be constituted by individual parts, or may be integrated by any means.

Embodiments B

Embodiments B described herein utilize a potential as an interaction medium.

(Embodiment B-1)

The embodiments A-1 to A-5 shown in FIGS. 1 to 8 utilize coupling by means of light. This embodiment utilizes coupling by means of a potential.

Figure 9:
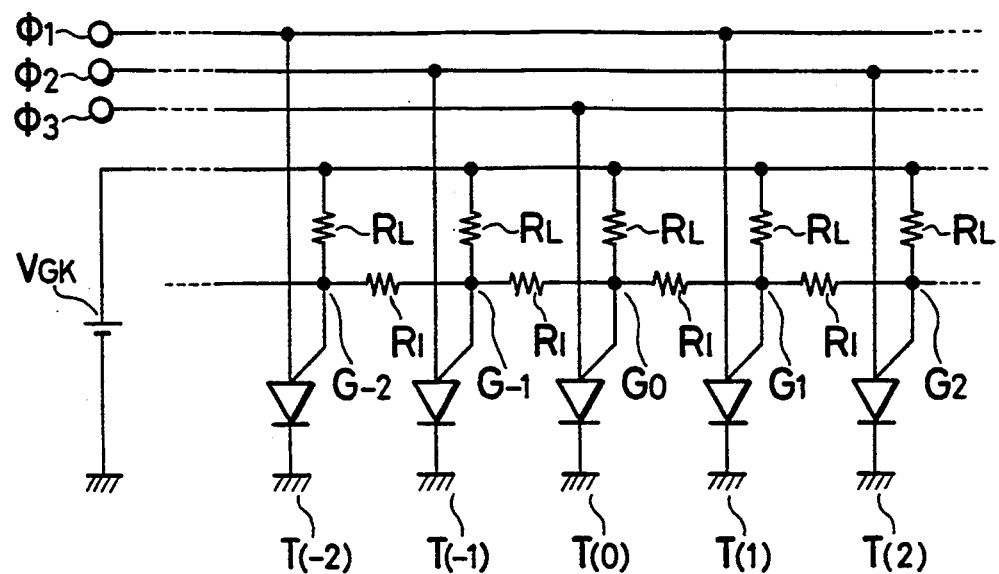
FIG. 9 is a schematic circuit diagram of a light-emitting element array using a potential in an embodiment B-1.

FIG. 9 is an equivalent circuit diagram of an embodiment B-1 of the present invention. The characteristic feature of this embodiment is that a resistor network is added to the arrangement in the embodiment A-1, i.e., FIG. 1.

As light-emitting elements, light-emitting thyristors ($T_{(-2)}$ to $T_{(+2)}$) are used. The light-emitting thyristors ($T_{(-2)}$ to $T_{(+2)}$) have upper gate electrodes $G_{-2}$ to $G_{+2}$, respectively. A bias voltage $V_{GK}$ is applied to each gate electrode through a corresponding load or pull up resistor $R_L$. The gate electrodes $G_{-2}$ to $G_{+2}$ are electrically connected to each other through relay resistors $R_I$ to achieve an interaction. Each of three transfer clock lines $\phi_1$, $\phi_2$ and $\phi_3$ is sequentially connected to the anode electrodes of every three light-emitting thyristors.

An operation will be described below. Assume that the transfer clock $\phi_3$ goes to high level, and the light-emitting thyristor $T_{(0)}$ is turned on. In this case, a potential at the gate electrode $G_0$ is reduced to about 0V due to the characteristics of the three-terminal thyristor (about 1V for a silicon thyristor). Assuming that the bias voltage $V_{GK}$ is 5V, the gate voltage of each light-emitting thyristor is determined by the network of the load resistors $R_L$ and the relay resistors $R_I$. A gate voltage of the next light-emitting thyristor $T_{(1)}$ or $T_{(-1)}$ is decreased by the largest amount, and a gate voltage is higher as a thyristor is more separated from $T_{(0)}$. This can be expressed as follows:

$$V_{G0} < V_{G1} = V_{G-1} < V_{G2} = V_{G-2} \quad (1)$$

A difference between these voltages can be set by appropriately selecting the values of the load resistors $R_L$ and relay resistors $R_I$ to provide a threshold for a turn-on voltage.

As is well known, the turn-on voltage $V_{ON}$ at the anode side of the three-terminal thyristor is higher than a gate voltage $V_G$ by a diffusion voltage $V_{df}$.

$$V_{ON} = V_G + V_{df} \qquad (2)$$

Therefore, if a voltage applied to the anode is set to be higher than the turn-on voltage $V_{ON}$, the corresponding light-emitting thyristor is turned on.

While the thyristor $T_{(0)}$ is kept on, a high-level voltage $V_H$ is assumed to be applied to the next transfer clock pulse $\phi_1$. The clock pulse $\phi_1$ is simultaneously applied to the light-emitting thyristors $T_{(+1)}$ and $T_{(-2)}$. If the value of the high-level voltage $V_H$ is set to fall within the following range, only the light-emitting thyristor $T_{(+1)}$ can be turned on.

$$V_{G-2} + V_{df} > V_H > V_{G+1} + V_{df} \qquad (3)$$

Thus, both the light-emitting thyristors $T_{(0)}$ and $T_{(+1)}$ are kept on. When the high-level voltage $V_H$ of the clock pulse $\phi_3$ is disabled, the light-emitting thyristor $T_{(0)}$ is turned off, and an ON state can be transferred.

In this manner, the gate electrodes of the light-emitting thyristors are connected through the resistor network, thus providing a transfer function to the light-emitting thyristors.

With the above-mentioned principle, the high-level voltages $V_H$ of the transfer clock lines $\phi_1$, $\phi_2$ and $\phi_3$ are set to sequentially slightly overlap each other, so that the ON states of the light-emitting thyristors are sequentially transferred. More specifically, a light-emission point is sequentially transferred. According to this embodiment, a self-scanning type light-emitting element array which cannot be achieved by a prior art technique can be realized.

(Embodiment B-2)

In the embodiment B-2, an IC structure of the arrangement of the embodiment B-1 will be described.

Figure 10:
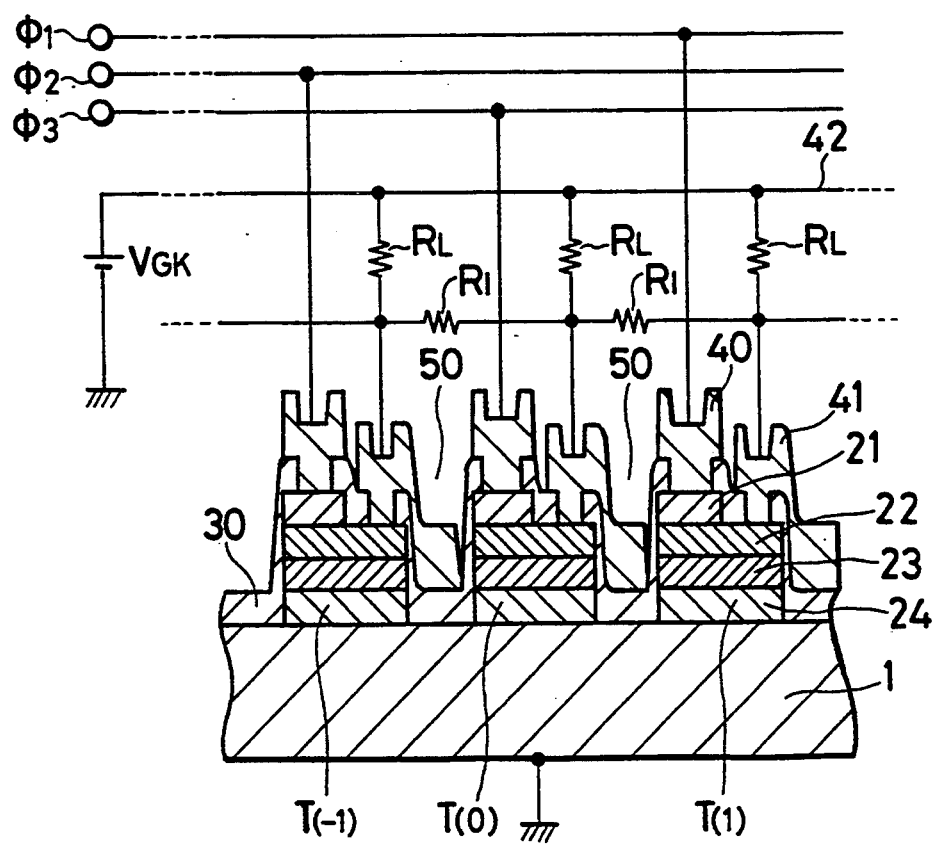
FIG. 10 is a schematic sectional view of a light-emitting element array using a potential in an embodiment B-2.

FIG. 10 shows a structure of this embodiment. An n-type semiconductor layer 24, a p-type semiconductor layer 23, an n-type semiconductor layer 22, and a p-type semiconductor layer 21 are sequentially formed on a grounded n-type GaAs substrate 1 to provide a pnpn structure. A laddery groove 50 for isolating the pnpn multilayer structure into light-emitting thyristors $T_{(-1)}$ to $T_{(+1)}$ are formed by, e.g., photolithography or the like and etching. Each anode electrode or metal strip 40 has an ohmic contact with the p-type semiconductor layer 21, and each gate electrode or metal strip 41 has an ohmic contact with the n-type semiconductor layer 22. An insulating layer 30 prevents short-circuiting between the thyristors and wiring layers with metal strips, and also serves as a protection film for preventing deterioration of characteristics. The insulating layer 30 is preferably formed of a material which allows light having a light-emission wavelength of a light-emitting thyristor to pass therethrough well. The n-type GaAs substrate 1 serves as a cathode of each thyristor. Three transfer clock lines $\phi_1$, $\phi_2$ and $\phi_3$ are connected to the anode electrodes of the light-emitting thyristors. The gate electrodes are connected to nodes of a resistor network which connect load resistors $R_L$ and interaction resistors $R_I$.

When light coupling described in the embodiment A occurs, it affects the transfer operation of this embodiment. Therefore, the gate electrodes or metal strips 41 are partially formed in the grooves 50 between the light-emitting thyristors to prevent the light coupling.

Figure 16A:
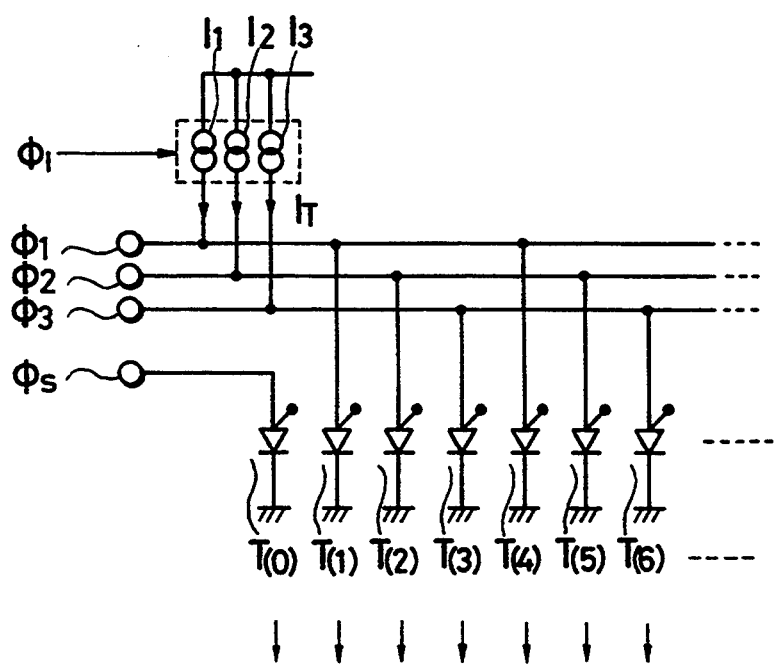
FIG. 16A is a schematic circuit diagram showing a method of driving a light-emitting element array in an embodiment C and FIG. 16B is a timing chart showing pulse waveforms.
Figure 16B:
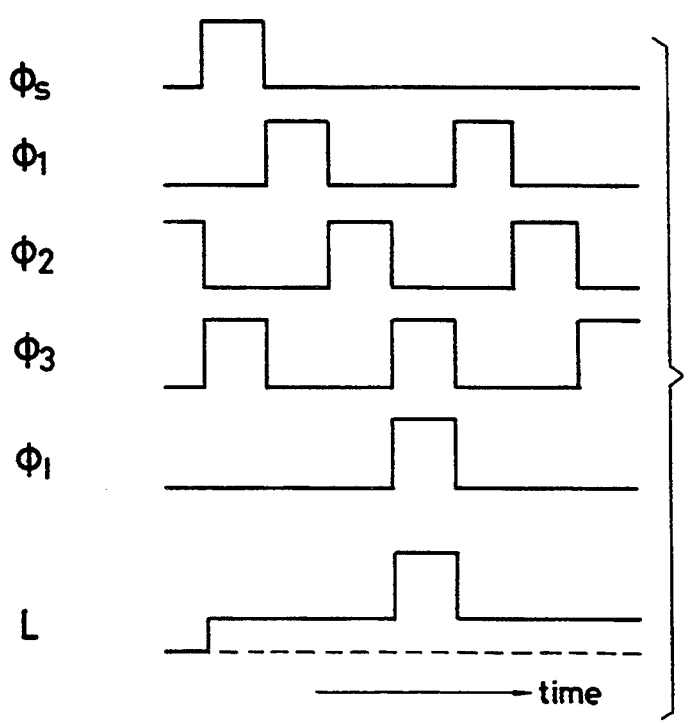

The structure of this embodiment is the same as the equivalent circuit shown in the embodiment B-1 (FIG. 9), and performs the same operation. Therefore, the high-level periods of the transfer clock lines $\phi_1$, $\phi_2$ and $\phi_3$ are set to sequentially slightly overlap each other as shown in FIG. 16, and then, an ON state of light-emitting thyristors is sequentially transferred. More specifically, a light-emission point is sequentially transferred.

(Embodiment B-3)

Figure 11:
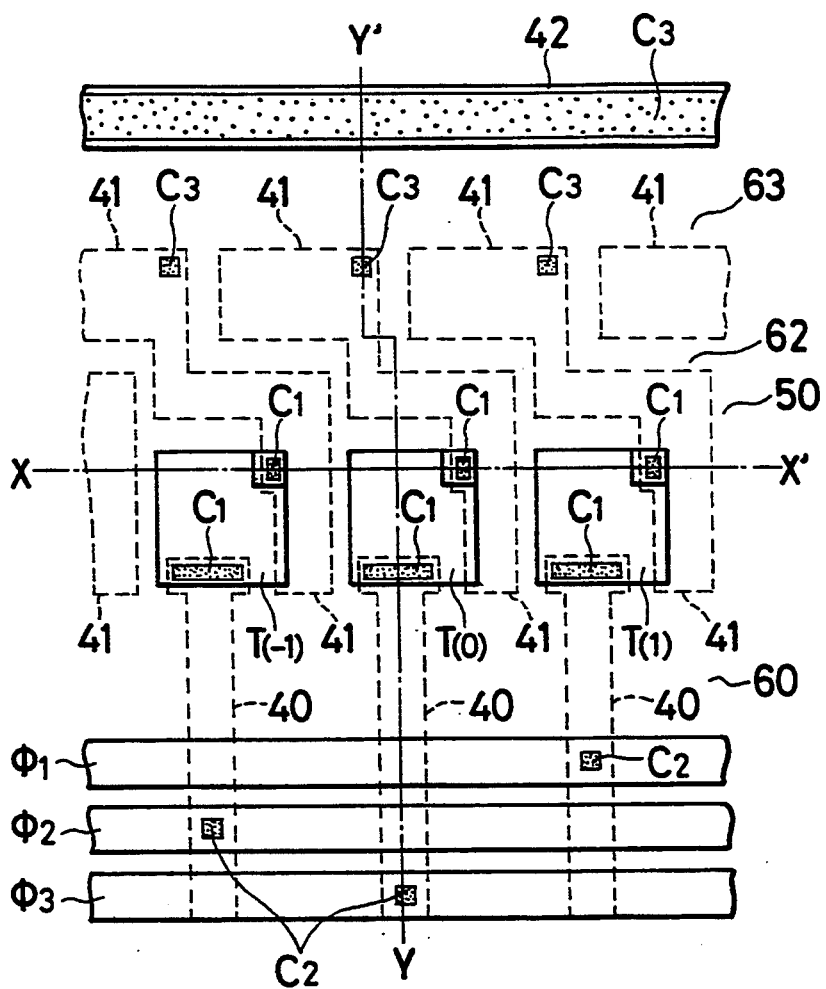
FIG. 11 is a schematic plan view of a light-emitting element array using a potential in an embodiment B-3.
Figure 12:
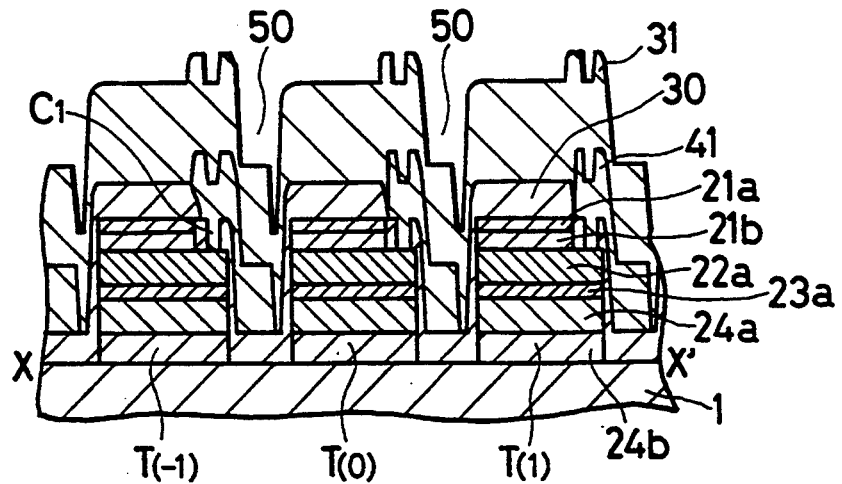
FIGS. 12 and 13 are schematic sectional views of the light-emitting element array using a potential in the embodiment B-3.
Figure 13:
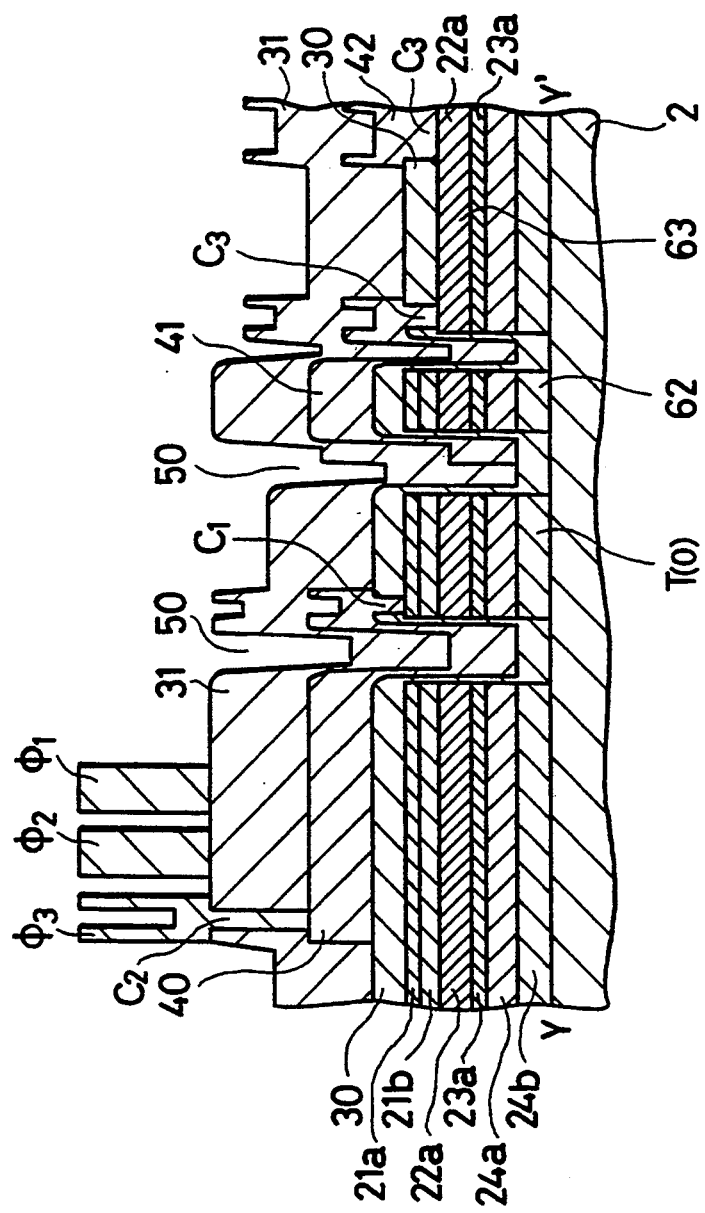

FIGS. 11, 12, and 13 show an embodiment B-3. This embodiment presents an actual structure of the embodiment B-2. FIG. 11 is a plan view of this embodiment, and FIGS. 12 and 13 are sectional views taken along lines X—X' and Y—Y' in FIG. 11, respectively.

Light-emitting elements $T_{(-1)}$ to $T_{(+1)}$, isolation grooves of the light-emitting elements, and a field layer 60, and the like are the same as those in the embodiment A-3. A two-dimensional resistor 63 forms a resistor network connecting the gate electrodes. Light emitted from the light-emitting thyristors is prevented from being input to the resistor 63 by the light absorbing block 62. An anode of each light-emitting thyristor T is connected to one of three clock lines $\phi_1$ to $\phi_3$ in every third fashion via a lead or crosswise strip 40 through contact holes $C_1$ and $C_2$. The resistor network 63 has the nodes each connected to the gate of each thyristor, and other end portion connected to a bias line 42 for supply a bias voltage $V_{GK}$ through the contact hole $C_3$.

FIG. 12 reveals an arrayed state of the light-emitting thyristors. An insulating film 30 is provided in the grooves and to cover the light-emitting thyristors and prevent them from short-circuiting the strips 40 and 41 which are provided on the film 30. A further insulating or interlayer film 31 is provided to cover the strips 40 and 41 as well as the thyristors and to prevent them from short-circuiting the transfer clock lines and the bias line 42. These insulating films 30 and 31 must be transparent insulating films so that light can be efficiently output to an external portion. In this case, as has been described above, in order to prevent a transfer operation from being influenced by light coupling, the gate strips 41 can be advantageously formed in the grooves 50 to shield light.

FIG. 13 reveals a connection state of the wirings and electrodes. Lead contact holes $C_1$ of the light-emitting thyristors for the anode electrodes are formed in the insulating film 30, and are externally led using the electrode layers 40. Each electrode layer 40 is connected to the transfer clock line $\phi_3$ via a through hole $C_2$ on the field layer 60. As the resistor 63 for the resistor network, an n-type GaAs layer 22a of an n-type semiconductor layer is used in this embodiment. This layer may be another layer, and another type of film may be formed by, e.g., sputtering without using a semiconductor layer.

Each gate strip 41 is formed to extend into the groove 50 so that light emitted by the light-emitting thyristor does not influence the resistance of the resistor 63.

The following manufacturing process for realizing this embodiment can be employed.

The ppnpnnn structure as shown in FIG. 4 is prepared by an epitaxial growth method. The upper longitudinal and the laddery grooves 50 are then formed by photoetching. The p-type GaAs layer 21a and the p-type AlGaAs layer 21b in the resistor portion and top right portions of the thyristors are removed by photoetching using another mask to provide the resistor network 63 and their gates, respectively. Thereafter, an insulating film 30 is formed, and contact holes $C_1$ are formed by photoetching. A metal layer is formed by deposition or sputtering, and then photoetched to provide the strips 40 and 41. Furthermore, an insulating film 31 is formed, and through holes $C_2$ are formed by photoetching. A metal wiring layer is then formed by deposition or sputtering, and then photoetched to provide transfer clock lines $\phi_1$, $\phi_2$ and $\phi_3$.

Although not particularly described in this embodiment, a transparent protection film may be formed on the transfer clock lines. If it is not preferable that the thickness of the insulating film is too large to degrade the transmittance of light and to decrease an amount of externally output light, part or all of the upper insulating film of the light-emitting element may be removed by, e.g., photoetching.

According to this embodiment, an integrated self-scanning light-emitting element array can be manufactured.

(Embodiment B-4)

Figure 14:
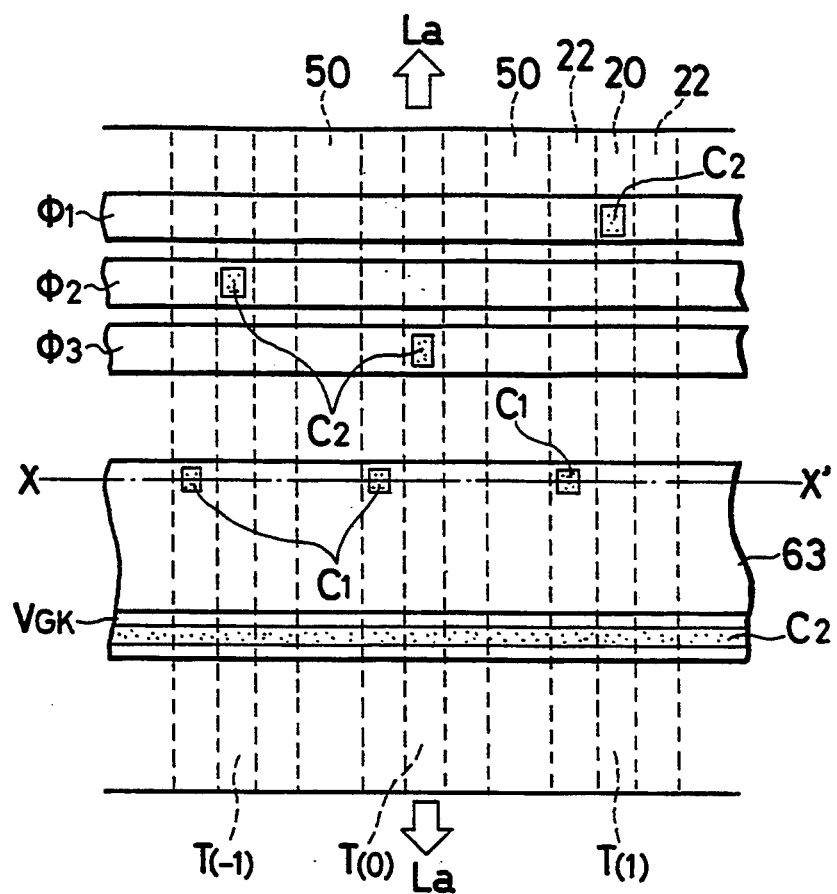
FIG. 14 is a schematic plan view of a light-emitting element array using a potential in an embodiment B-4.
Figure 15:
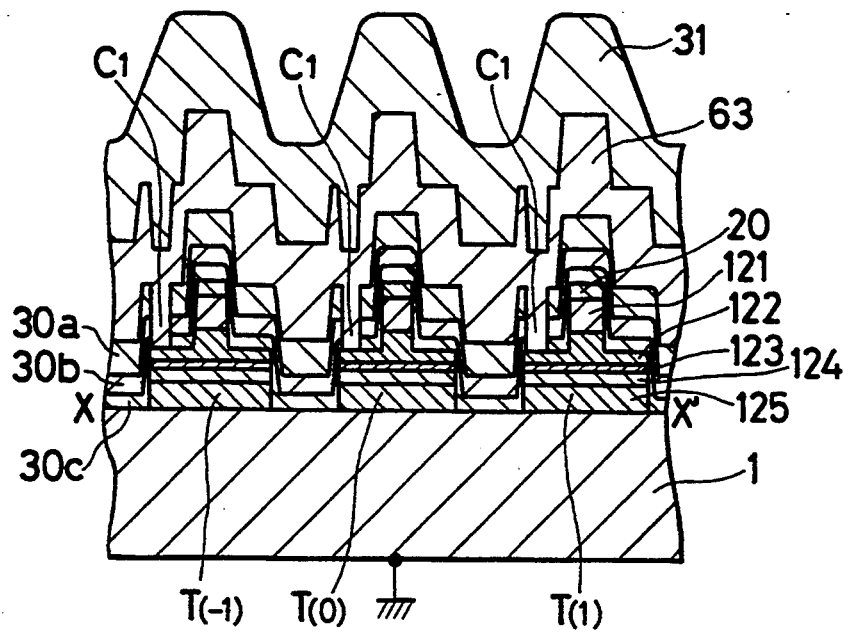
FIG. 15 is a schematic sectional view of the light-emitting element array using a potential in the embodiment B-4.

Referring now to FIGS. 14 and 15, a plurality of laser thyristors are used. The constructions of laser thyristors $T_{(-1)}$ to $T_{(1)}$ are the same as those of the light-emitting thyristors in the above embodiments except that each has a waveguide extending along a crosswise direction.

A manufacturing method of FIG. 14 will be described below. The pnipn multilayer structure as shown in FIG. 8 is prepared (a p-type GaAs layer for improving an ohmic contact may be formed between the p-type AlGaAs layer 121 and the upper electrode layer 20). The upper electrode layer 20 is patterned into a plurality of rectangles each having the same width as that of the resultant n-type AlGaAs layer 125 in FIG. 15. Using the rectangular patterns as a mask, the p-type AlGaAs layer 121 to the n-type AlGaAs layer 125 are etched to form a plurality of grooves 50 and then expose an upper surface of the substrate 1. Each rectangular patterns is further etched into a strip having a width of 10 μm or less. Using the strip patterns as another mask, the p-type AlGaAs layer 121 and portion of the n-type AlGaAs layer 122 are etched. Insulating films 30c, 30b and 30a are then formed on the resultant structure. Note that the three insulating films include the insulating films 30c and 30a and the light shielding film 30b, so that two functions, i.e., insulating and light shielding functions are provided. When an $SiO_2$ film is used as an insulating film, it allows a light component having a light-emission wavelength of 870 μm of GaAs to pass therethrough, it may induce light coupling. Thus, the light shielding film 30b formed of a light absorption material, e.g., amorphous silicon, must be formed between the insulating films. Of course, if a material having both the two insulating and light shielding functions is used, one layer need only be formed. Contact holes $C_1$ are formed on the films 30a to 30c by photoetching to provide a plurality of nodes of the resistor network, and the resistor network 63 is formed thereon and is photoetched. An insulating film 31 as an insulating interlayer is formed on the resultant structure, and through holes $C_2$ are formed by photoetching to connect one of the clock lines. In this case, the contact elongated hole $C_2$ the resistor 63 can be formed on only the insulating film 31. However, the contact holes $C_2$ for the anode electrode 20 must be carefully formed since the insulating films 31, 30c, 30b and 30a must be simultaneously removed. A metal wiring layer for transfer clock lines are then formed by deposition or sputtering, and transfer clock lines $\phi_1$, $\phi_2$ and $\phi_3$ and a bias $V_{GK}$ line are formed by photoetching. Finally, the end face of a laser beam output side is formed by cleavage or the like to have good parallelness, thus completing the structure of this embodiment.

The light-emitting element arrays in the embodiments B-1 to B-4 have a self-scanning function as in the embodiment A, which cannot be achieved by a conventional light-emitting element array and can provide effects of efficient assembly, compactness, a decrease in pitch, and the like.

In the embodiments B-1 to B-4, the transfer clock pulses are assumed to have three phases, i.e., $\phi_1$, $\phi_2$ and $\phi_3$. The number of phases may be increased to four or five so as to attain a more stable transfer operation.

In the above embodiments, the light-emitting elements are arrayed in a line. However, the elements need not be arranged in a line but may be arranged in a zigzag manner depending on applications. The elements may be arranged in two lines from the halfway.

The light-emitting element need not be a light-emitting thyristor. The present invention is not particularly limited to any element as long as a turn-on voltage of a light-emitting element is changed by an external potential. The light-emitting element may be a laser thyristor as described above.

According to the present invention, the light-emitting elements may be constituted by individual parts, or may be integrated by any means.

The structure of the light-emitting thyristor is not particularly limited. For example, a more complex structure and a multilayer structure may be adopted, and an arbitrary structure constituted by six or more layers may be adopted, as described in the embodiments A.

In the series of embodiments A and B of the present invention, a semiconductor substrate is used as a substrate, and its potential is set at 0 V (ground potential). However, the present invention is not limited to this, and other materials may be used for the substrate. For example, an n-type GaAs layer corresponding to the n-type GaAs substrate 1 of this embodiment is formed on a Cr-doped semi-insulating GaAs substrate, and the structure described in the above embodiments may be formed thereon. Alternatively, a semiconductor film is formed on an insulating substrate of, e.g., glass, alumina, or the like, and the structure of this embodiment may be formed using this semiconductor.

The structure of the laser is not limited to that described in the above embodiments. For example, a TJS type, a BH type, a CSP type, a VSIS type, and the like may be employed (S. M. Sze, Physics of Semiconductor Devices, 2nd Edition, pp. 724–730). As for a material, AlGaAs has been mainly described. However, other materials (e.g., AlGaInP, InGaAsP, ZnSe, GaP, and the like) may be used.

In the embodiments A and B, an ON light-emitting element gives a primary influence to adjacent light-emitting elements, and the adjacent light-emitting elements become light-emitting elements to be driven next. However, the present invention is not limited to this. For example, an ON elements may influence every other element, so that an ON state can be transferred to every other elements.

The above-mentioned many modifications will be applied to the following numerous embodiments.

Embodiment C

An embodiment C to be described below is related to a drive method of the light-emitting element arrays produced by the embodiments A and B described above.

(Embodiment C-1) Drive Method of Light-Emitting Element Array

FIG. 16 shows an equivalent circuit diagram representing a drive principle and pulse waveforms applied to three clock lines.

In this embodiment, current sources $I_1$, $I_2$ and $I_3$ each having a current $I_T$ are wired OR connected to transfer clock lines, respectively $\phi_1$, $\phi_2$ and $\phi_3$, and the current $I_T$ is controlled by a light-emission signal $\phi_I$. Therefore, the three phase clock pulses are applied to the light-emitting or laser thyristors to provide a minimum ON state thereof to maintain the self-scanning function. The additional current source is applied to the minimum ON state thyristor to provide its maximum ON state to render gray-scale light intensity.

An operation will be described below. A light-emitting thyristor $T_{(0)}$ is turned on in response to a start pulse $\phi_S$. When the transfer pulses $\phi_1$, $\phi_2$ and $\phi_3$ are sequentially applied to light-emitting thyristors $T_{(n)}$ in every third fashion; where n is a positive integer, its minimum ON state is transferred. This mechanism has already been described in the embodiments A and B.

When a light-emitting thyristor $T_{(3)}$ is caused to emit light at a higher intensity, the light-emission signal $\phi_I$ is synchronously set at high level when a light-emission point has reached the position of the thyristor $T_{(3)}$. In synchronism with the signal $\phi_I$, current $I_T$ can flow from the current sources $I_1$, $I_2$ and $I_3$. The anode of the minimum ON thyristor $T_{(3)}$ can sink the current from one of the current sources. Since other light-emitting thyristors are in an OFF state, they cannot sink the currents. Therefore, the anode current of the ON light-emitting thyristor is increased, and its intensity is also increased.

FIG. 16 also illustrates a waveform of the light-emission intensity L. As can be apparent from this waveform, the light-emission intensity of the light-emitting element $T_{(3)}$ is increased as compared to other light-emission intensities obtained when no currents from the current sources flow. When this drive method is used, the light-emission intensity at an arbitrary position can be increased, and a locational optical write operation can be performed.

When laser thyristors are used and if the current by the transfer clock is set to be under the threshold current of laser oscillation, no laser beam is emitted while its minimum ON state is transferred. Only when the light-emission signal is applied in synchronism with clock pulses, a laser beam at that corresponding laser can be emitted.

Applications

Applications described hereinafter related to an application of the light-emitting element arrays in the embodiments A and B and the drive method described in the embodiment C.

(Application 1) Application to Contact type Image Sensor

Figure 17:
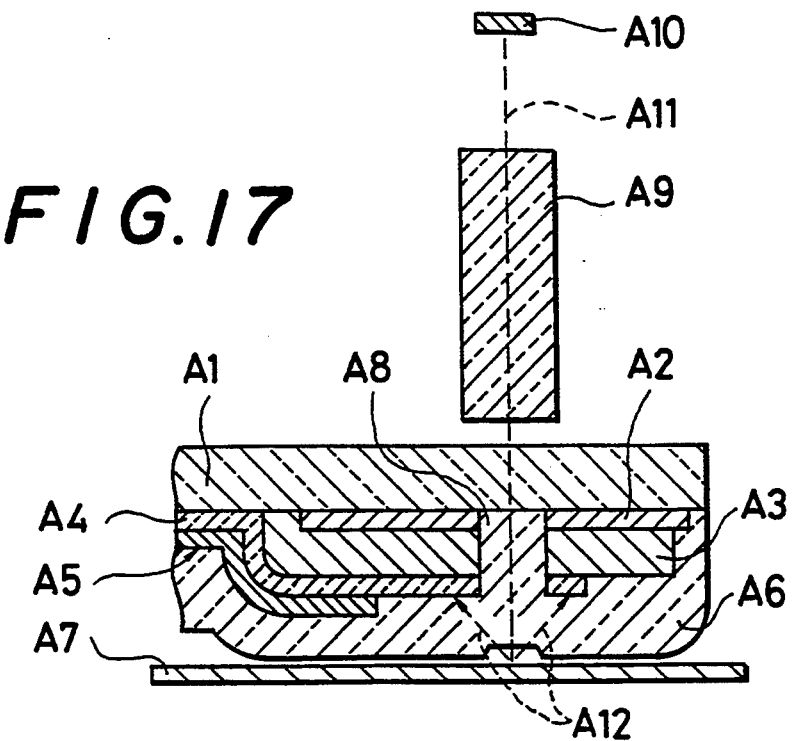
FIG. 17 is a schematic sectional view of a proximity image sensor in an application 1.

FIG. 17 shows the principle of a contact type image sensor as a first application of the present invention. In this application, a function of shifting a light-emission point can be realized by the present invention, and is applied to position scanning.

In FIG. 17, a photosensor of amorphous Si is formed on a glass substrate. In a conventional sensor, the photosensor is divided into 100-$\mu$m pixels, and these pixels are scanned by read ICs to extract outputs. Illumination is uniformly made by LEDs. In a method described herein, the amorphous Si photosensor is not divided into pixels but illumination is scanned.

In FIG. 17, an electrode A2 serving as a light shielding layer, an amorphous Si layer A3, a transparent electrode A4, and an electrode A5 are formed on a glass substrate A1. This structure utilizes a phenomenon that the resistances of the electrodes A2 and A5 are decreased upon incidence of light since the electrical conductivity of the amorphous Si layer A3 is increased by light. A transparent protection layer A6 is formed on this structure, and a document A7 is brought into contact with the layer A6. A light-emitting element array A10 of this embodiment is arranged at a side opposite to the document A7 with respect to the glass substrate A1. A scanning beam A11 from the array A10 passes through a rod lens array A9, then passes through a window A8, formed at the central portion of the photosensor, for introducing a beam, and is then focused on the document A7.

The light-emitting element array A10 has a function of sequentially shifting a light-emission point according to the present invention. Thus, a focal point on the document is sequentially shifted accordingly. If a tone changes due to a presence of a character on the document A7, reflection beams A12 from the document are changed accordingly. Changes in beam intensity are read by the photosensor of the amorphous Si layer A3.

When the light-emitting element array comprises laser thyristors, a light-emitting element array having a large amount of light can be obtained due to its high quantization efficiency, thus saving power consumption and allowing high-speed reading.

In this manner, the light-emitting element array according to the present invention can be applied to reading of characters or an image of a document, or the like, and a wide application range for a facsimile system, a bar code reader, a copying machine, and the like, can be expected.

(Application 2) Application to Optical Printer and Display

Figure 18:
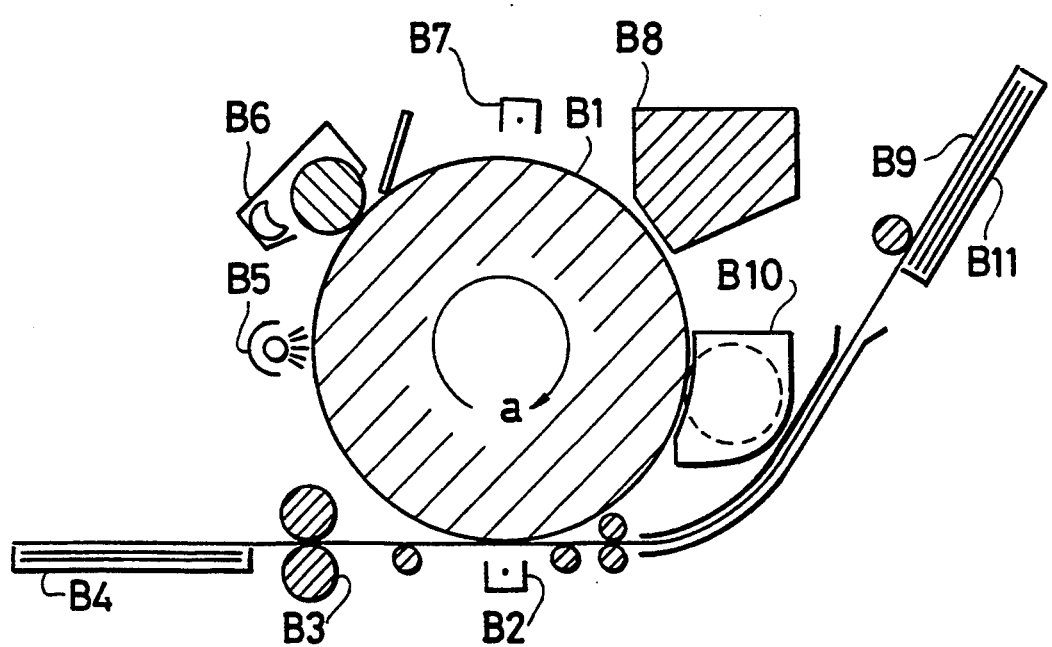
FIG. 18 is a schematic sectional view of an optical printer in an application 2.

As a second application of the present invention, an application to an optical printer will be described below. Conventionally, an application to an optical printer using a module in which a drive IC is connected to each pixel of an LED array is known. FIG. 18 shows the principle of an optical printer. A layer of a material, e.g., amorphous Si having optical conductivity (photosensitive body) is formed on the surface of a cylindrical photosensitive drum B1. The drum B1 is rotated in a direction of an arrow a at a print speed. The surface of the photosensitive body is uniformly charged by a charger B7. A light-emitting element array optical print head B8 radiates an optical dot image to be printed onto the photosensitive body so as to neutralize a charge of a portion irradiated with a light beam. A toner is attracted to the photosensitive body in accordance with a charged state on the photosensitive body by a developing unit B10. The toner image is transferred onto a paper sheet B9 fed from a cassette B11 by a transfer unit B2. The toner image on the paper sheet B9 is heated by a fixing unit B3 and is fixed thereon. The sheet B9 is then transferred to a stacker B4. The charge on the drum which completes the transfer is neutralized over the entire surface by a discharging lamp B5, and the residual toner is removed by a cleaner B6.

Figure 19:
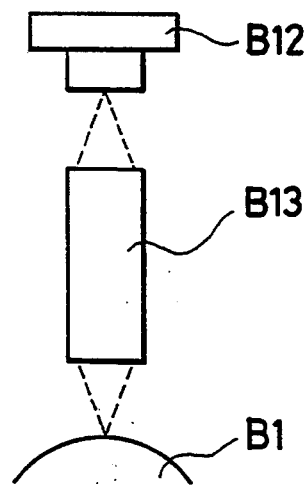
FIG. 19 is a schematic sectional view of an optical printer head in the application 2.

The light-emitting element array according to the present invention is driven by the drive method described in the embodiment C-1, and is applied to the light-emitting element array optical print head B8. FIG. 19 shows the structure of the optical print head B8. The head B8 is constituted by a light-emitting element array B12 and a rod lens array B13, so that a focal point of the lens is formed on the photosensitive drum B1. When the drive method described in the embodiment C-1 is used, a light-emission intensity can be increased at a position where an optical write operation is to be performed, while transferring an ON state in the light-emitting element array of the present invention. Therefore, image data can be written on the photosensitive drum.

When the light-emitting element array comprises laser thyristors, a light-emitting element array having a large amount of light can be obtained due to its high quantization efficiency, thus saving power consumption or allowing high-speed write access, i.e., printing.

Thus, the present invention can be applied to the optical printer.

Figure 20:
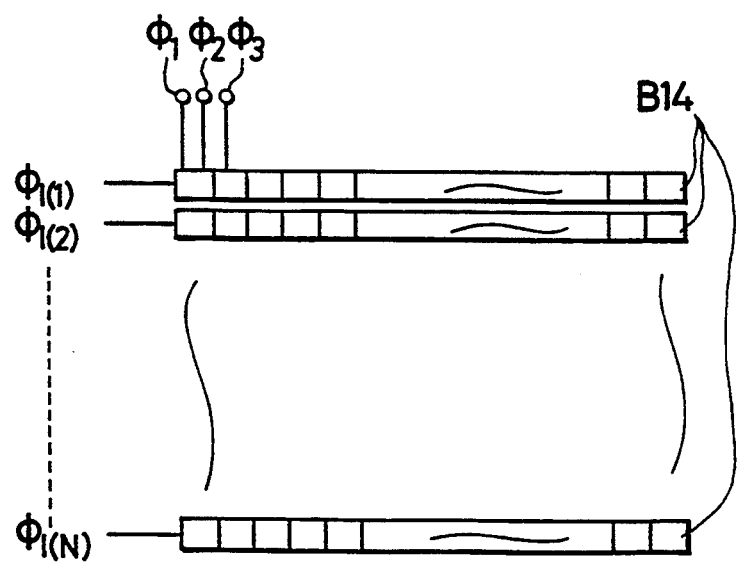
FIG. 20 is a schematic plan view of an optical display in the application 2.
Figure 21:
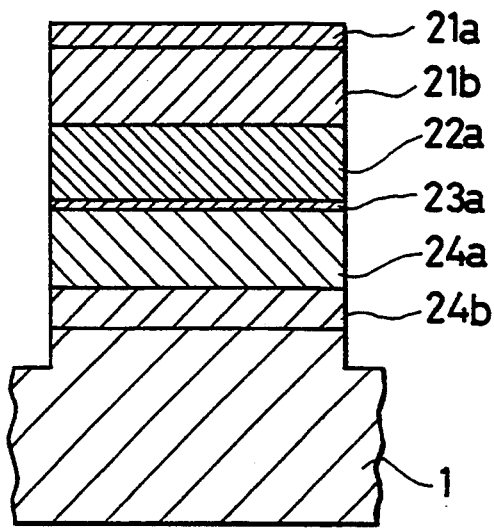
Figure 22:
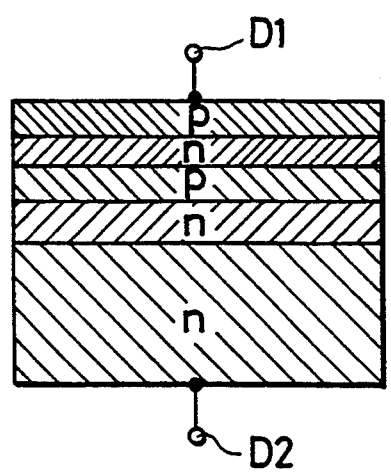
Figure 23:
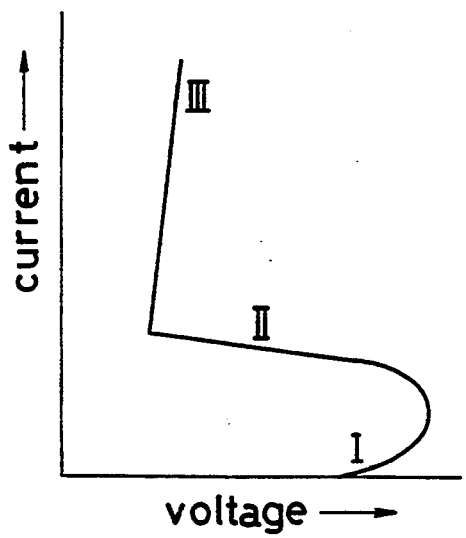
FIG. 23 is a graph showing current-voltage characteristics of the light-emitting thyristor.
Figure 24:
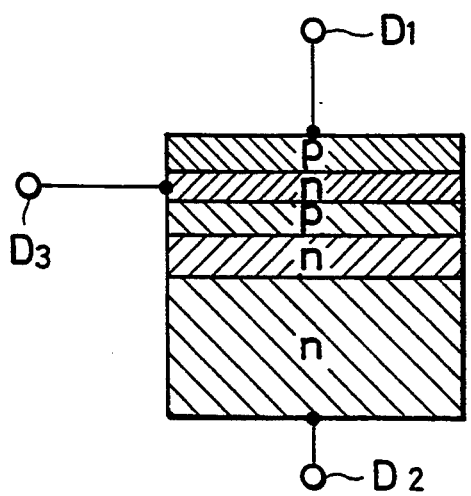
FIG. 24 is a schematic sectional view showing a structure of a three-terminal thyristor.

The light-emitting element array for the optical printer has a linear arrangement. If the arrays are two-dimensionally arranged, a display can be prepared. This structure is shown in FIG. 20. If N light-emitting element array B14 are arranged, an image signal can be written from $\phi_I(1)$ to $\phi_I(N)$. If an integrated light-emitting element array is used, a high-density display element can be produced. If independent light-emitting elements are combined, a large-area display can be produced.

Embodiments D

Embodiments D described herein can simplify a structure of the light-emitting element array in the embodiments B described above.

(Embodiment D-1)

Figure 25:
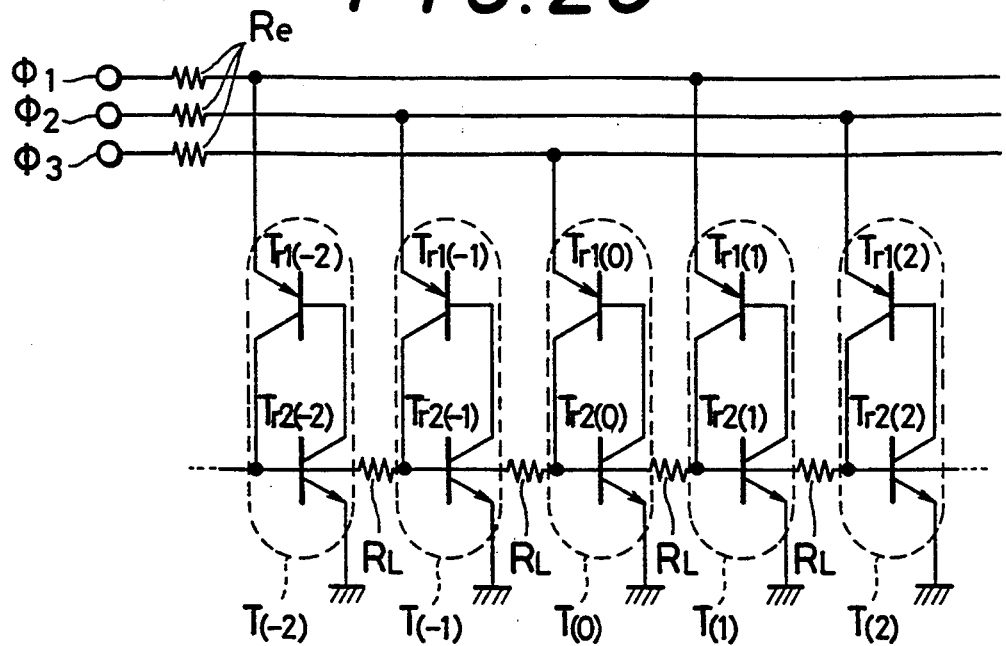
FIG. 25 is an equivalent circuit diagram of a light-emitting element array in an embodiment D-1.

Referring now to FIG. 25, three-terminal light-emitting thyristors each having a lower gate are used. Light-emitting thyristors $T_{(-2)}$ to $T_{(+2)}$ are aligned in a line. Each relay resistor $R_L$ is connected between the lower gates of the adjacent light-emitting thyristors. Each of three transfer clock lines $\phi_1$, $\phi_2$ and $\phi_3$ is sequentially repetitively connected to the anode electrodes of every third light-emitting thyristors. A resistor Re for regulating a current of the clock line is provided to each clock line.

An operation will be described below. Assume that a transfer clock $\phi_3$ goes to high level, and a light-emitting thyristor $T_{(0)}$ is turned on. The lower gate voltage of the light-emitting thyristor $T_{(0)}$ is increased to a potential capable of flowing its ON current. This potential is supplied to the lower gates of the adjacent thyristors $T_{(-1)}$ and $T_{(1)}$ through the relay resistors $R_L$ to flow their gate currents. As long as the transfer clock lines $\phi_1$ and $\phi_2$ are set at low level, the light-emitting thyristors $T_{(-1)}$ and $T_{(1)}$ are kept off. The resistance of the relay resistor $R_L$ is so adjusted or predetermined that, when one light-emitting thyristor $T_{(0)}$ is in an ON state, the next light-emitting thyristor $T_{(1)}$ will be turned on, but the next but one light-emitting thyristor $T_{(-2)}$ will not be turned on upon applying the next clock pulse $\phi_1$. Therefore, the gate current of the next thyristor $T_{(1)}$ is decreased by the relay resistor $R_L$, and can be turned on by applying clock pulse $\phi_1$. While the gate current of the next but one thyristors $T_{(-2)}$ is further decreased by mainly two series relay resistors $R_L$ and cannot be turned on by the clock pulse $\phi_1$.

Figure 26:
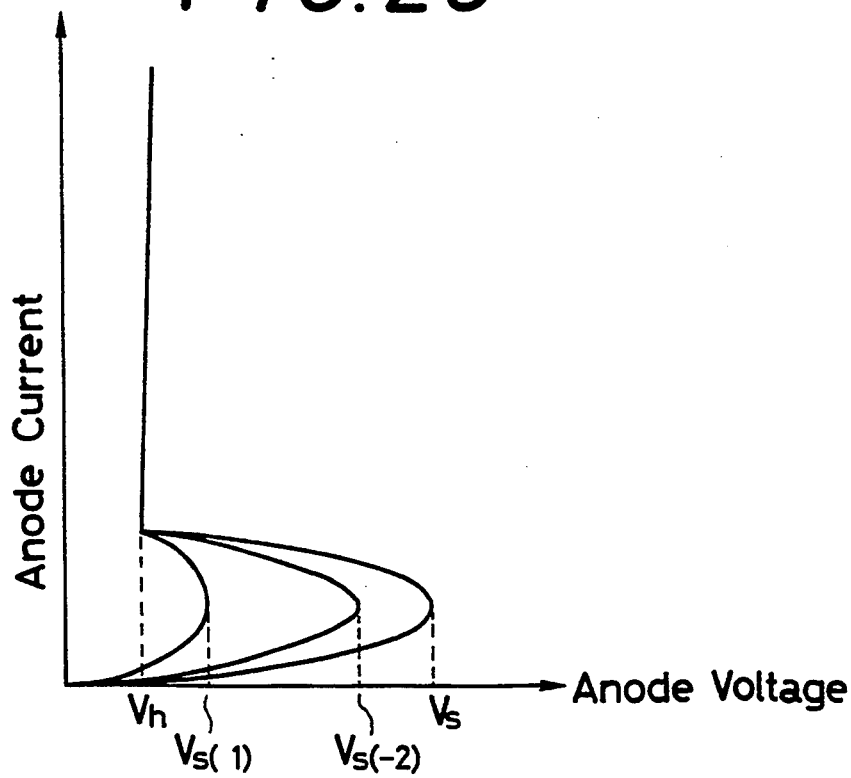
FIG. 26 is a graph showing characteristics of the light-emitting thyristor.

As is well known, when the gate current of the light-emitting thyristor is increased, the ON voltage of the light-emitting thyristor is decreased. FIG. 26 illustrates this state. The anode voltage is plotted along the abscissa, and the anode current is plotted along the ordinate. In FIG. 26, an ON voltage $V_s$ is free from an external influence. An ON voltage $V_{s(1)}$ represents an ON voltage of the light-emitting thyristor $T_{(1)}$, and an ON voltage $V_{s(-2)}$ represents an ON voltage of the light-emitting thyristor $T_{(-2)}$. A minimum voltage necessary for maintaining an ON state is called a hold voltage Vh. The ON voltages of the light-emitting thyristors $T_{(-1)}$ and $T_{(1)}$ closest to the ON light-emitting thyristor $T_{(0)}$ are decreased for the above-mentioned reason, and reach the ON voltage $V_{s(1)}$. The ON voltages of the next closest light-emitting thyristors $T_{(-2)}$ and $T_{(2)}$ become the ON voltage $V_{s(2)}$ since the influence of the gate current is small.

In FIG. 25, a clock pulse $\phi_1$ next to the clock pulse $\phi_3$ is applied to the light-emitting thyristors $T_{(1)}$ and $T_{(-2)}$. Since their ON voltages respectively become ON voltages $V_{s(1)}$ and $V_{s(-2)}$ for the above-mentioned reason, if the high-level voltage of the clock pulse is set to be a value between the ON voltages $V_{s(1)}$ and $V_{s(-2)}$, only the light-emitting thyristor $T_{(1)}$ can be turned on. If the clock pulses $\phi_1$, $\phi_2$ and $\phi_3$ are set so that their high-level intervals appear to overlap each other, the ON state among the light-emitting thyristors is sequentially transferred. Thus, a light-emitting element array capable of self-scanning can be realized.

As described above, according to the present invention, only one relay resistor connected between the lower gates of adjacent light-emitting thyristors is required, and the light-emitting element array can be formed by a simple manufacturing process.

In this embodiment, three-phase transfer clock pulses are used. The light-emitting element array of this embodiment can be operated by clock pulses of four or more phases.

(Embodiment D-2)

In the embodiment D-1, the equivalent circuit has been described. In an embodiment D-2, an IC structure of the arrangement in the embodiment D-1 will be described. The gist of this embodiment lies in a structure wherein a relay resistor for performing electrical connection is formed by utilizing a portion of a light-emitting thyristor, so that a resistor element can also be formed by the same process as in the light-emitting thyristor.

Figure 27:
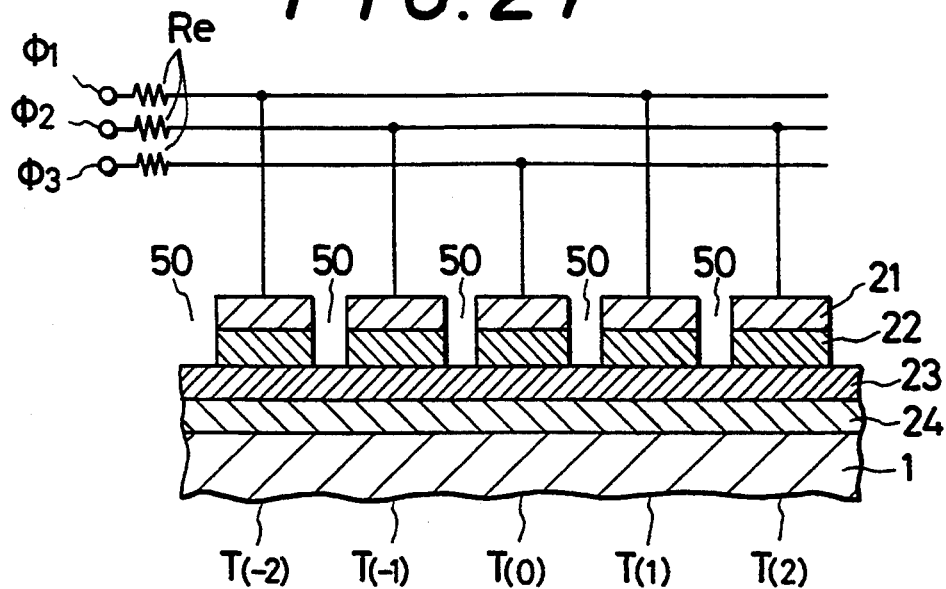
FIG. 27 is a sectional view of an embodiment D-2.

FIG. 27 is a sectional view of the structure of this embodiment. The pnpn structure as shown in FIG. 10 is prepared. A laddery groove 50 for isolating the above structure into individual light-emitting thyristors $T_{(-2)}$ to $T_{(2)}$ are formed by photolithography or the like and etching.

The n-type GaAs substrate 1 serves as the common cathode of each thyristor. Each of transfer clock lines $\phi_1$, $\phi_2$ and $\phi_3$ is connected to every second p-type semiconductor layer 21 serving as the anodes of the light-emitting thyristors. The characteristic feature of this structure is that the p-type semiconductor layer 23 constituting the thyristors is connected through the narrow portions. The internal resistance of the p-type semiconductor layer 23 serves as the relay resistor $R_L$ in the embodiment D-1 shown in FIG. 25.

Figure 28:
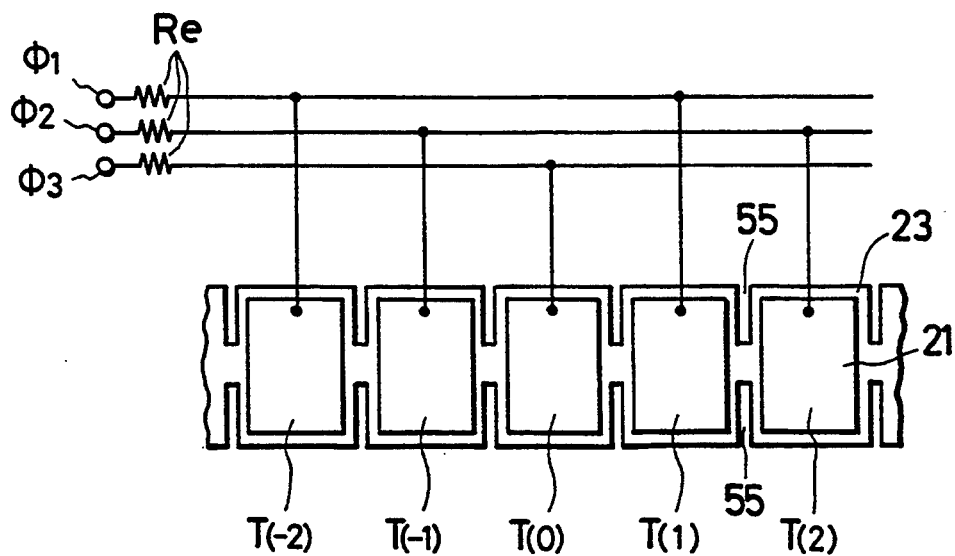
FIG. 28 is a plan view of the embodiment D-2.

FIG. 28 is a plan view showing the structure of this embodiment. In the light-emitting thyristors $T_{(-2)}$ to $T_{(2)}$ when viewed from the above in FIG. 27, inner rectangles correspond to the p-type semiconductor layers 21, and a portion therearound corresponds to the p-type semiconductor layer 23. In this structure, notches 55 are formed in the p-type semiconductor layer 23 to provide the narrow portions. The notches 55 are used for changing the value of the relay resistor $R_L$ described in the embodiment D-1. If a large notch 55 is formed, the resistance of the relay resistor $R_L$ is increased. Therefore, in this embodiment, the relay resistor $R_L$ can be desirably changed and optimized, thus achieving a more stable transfer operation.

The structure of this embodiment is the same as that of the equivalent circuit in the embodiment D-1 (FIG. 25), and performs the same operation. Therefore, when the high-level periods of the transfer clocks $\phi_1$, $\phi_2$ and $\phi_3$ are set to sequentially slightly overlap each other, the ON states of the light-emitting thyristors are sequentially transferred. That is, a light-emission point can be sequentially shifted.

As described above, according to this embodiment, no gate strip is required, and one resistor for connecting adjacent light-emitting thyristors need only be formed. In addition, the relay resistor $R_L$ can be formed by a semiconductor layer constituting the light-emitting thyristors. As can be understood from the above description, the structure of this embodiment can be formed by a simple manufacturing process.

In this embodiment, the transfer clock pulses are assumed to have three phases, i.e., $\phi_1$, $\phi_2$ and $\phi_3$. The number of phases may be increased to four or five so as to attain a more stable transfer operation.

(Embodiment D-3)

Figure 29:
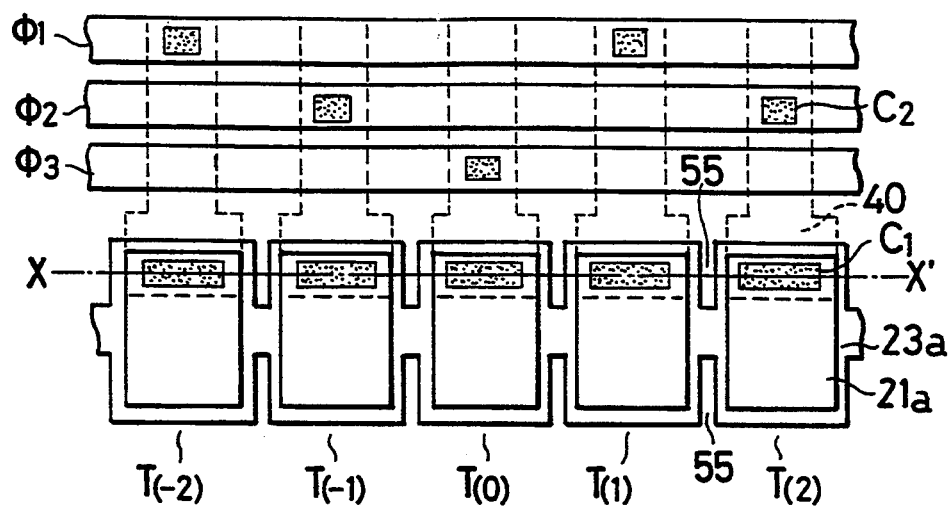
FIG. 29 is a plan view of an embodiment D-3.
Figure 30:
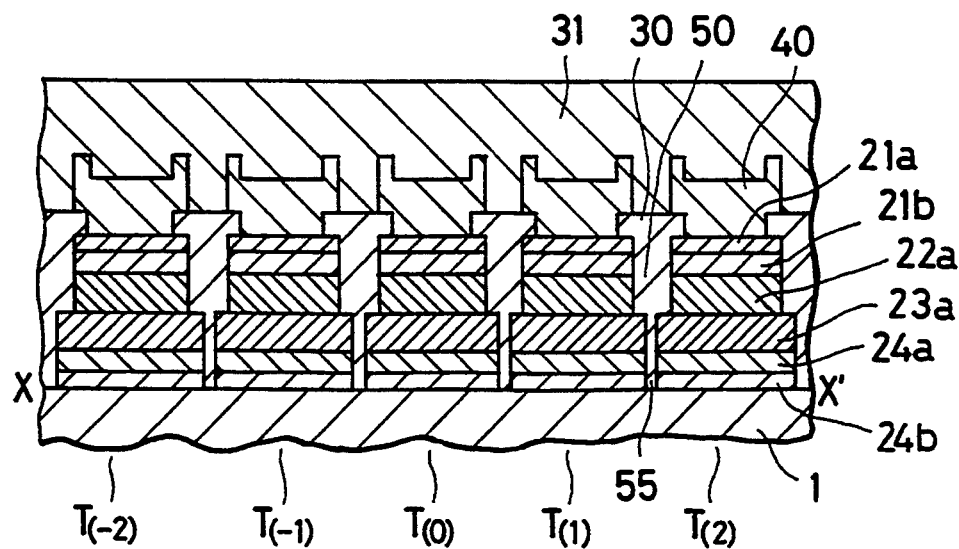
FIG. 30 is a sectional view of an embodiment D-3.

FIGS. 29 and 30 show an embodiment D-3. This embodiment presents a practical structure of the embodiment D-2. FIG. 29 is a plan view, and FIG. 30 is a sectional view taken along a line X—X' in FIG. 29.

The plan view of FIG. 29 will now be explained. Transfer clock lines $\phi_1$, $\phi_2$ and $\phi_3$ are connected to underlying anode electrodes 40 via through holes $C_2$ in every three fashion. Each anode electrode 40 is connected to a p-type GaAs layer 21a as a p-type semiconductor layer of each light-emitting thyristor. In light-emitting narrow portions $T_{(-2)}$ to $T_{(2)}$, a p-type GaAs layer 23a as a p-type semiconductor layer is illustrated around the rectangular p-type GaAs layers 21a. Notches 55 described in the embodiment D-2 are formed in the layer 23a so as to optimize the resistance of a relay resistor $R_L$.

The sectional view of FIG. 30 will now be described. The light-emitting thyristors are formed as follows. The ppnpnn structure as shown in FIG. 4 is prepared. A laddery groove 50 for isolating the resultant structure into individual light-emitting thyristors are formed by photolithography or the like and etching. Grooves 55 are notches for changing the value of the relay resistor $R_L$. Although not shown in this sectional view, the relay resistor $R_L$ is a p-type semiconductor layer, and employs the p-type GaAs layer 23a in this embodiment. An insulating layer 30 performs electrical isolation between the anode electrodes 40 and the semiconductor layers. As a material of the insulating layer 30, a material which does not allow light from the light-emitting thyristors of this embodiment to pass therethrough is preferably used in view of optical isolation among the light-emitting thyristors. The insulating layer may comprise a multilayered structure so as to have an insulating function and an optical isolation function. When the optical isolation function is provided, a window must be additionally formed that light can be externally output. An insulating film 31 as an insulating interlayer performs insulating isolation between the anode electrodes 40 and the clock lines.

The manufacturing process of the embodiment D-3 will be described below. The ppnpnn structure as shown in FIG. 4 is prepared. A laddery groove 50 is formed to isolate the light-emitting elements. The notches 55 are then formed to form the relay resistor $R_L$. The insulating film 30 is formed, and contact holes $C_1$ are formed therein. The electrodes 40 are formed on the resultant structure. The insulating film 31 is formed, and contact holes $C_2$ are formed therein. Thereafter, the clock line electrodes $\phi_1$, $\phi_2$ and $\phi_3$ are formed. With the above-mentioned process, the structure of this embodiment D-3 is completed.

As described above, according to this embodiment, no gate strip is required, one resistor for connecting the light-emitting thyristors need only be formed, and the relay resistor $R_L$ can be formed by a semiconductor layer constituting the light-emitting thyristors. As can be apparent from the above description, the structure of this embodiment can be formed by a simple manufacturing process.

The order of this process need not always be that described above. For example, the formation order of the grooves 50 and the notches 55 may be reversed. A transparent insulating film may be formed on the structure shown in FIG. 30 to improve reliability. If it is not preferable that the thickness of the insulating film is too large to degrade the transmittance of light and to decrease an amount of externally output light, part or all of the upper insulating film of the light-emitting element may be removed by, e.g., photoetching. In this embodiment, GaAs and AlGaAs layers are used as semiconductor layers. However, the present invention is not limited to these, and other semiconductors may be used.

(Embodiment D-4) Application to Laser

In the following embodiment, a case of using laser thyristors will be described.

Figure 31:
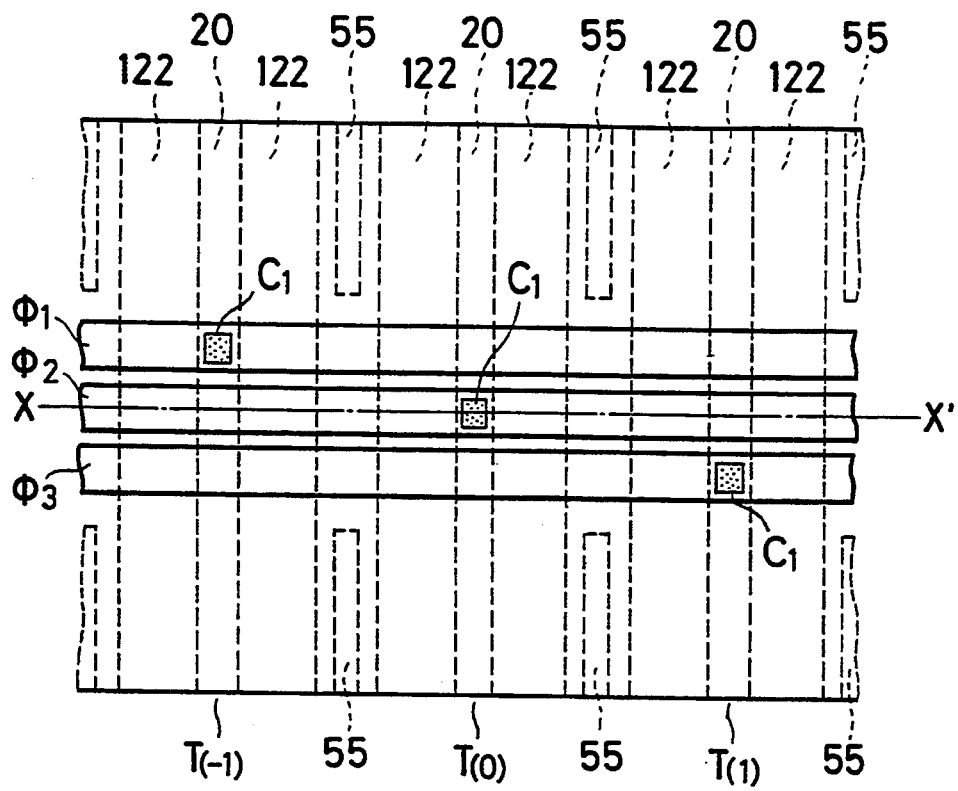
FIG. 31 is a plan view of an embodiment D-4.
Figure 32:
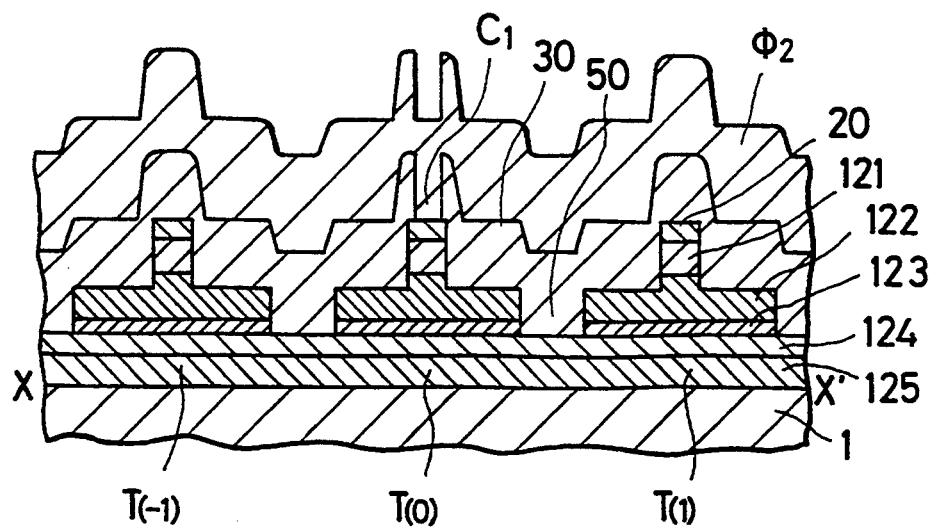
FIG. 32 is a sectional view of an embodiment D-4.

FIGS. 31 and 32 show an embodiment D-4 applied to a laser. FIG. 31 is a plan view of the embodiment D-4, and FIG. 32 is a sectional view thereof.

A manufacturing method will be briefly described below. The pnipn structure as shown in FIG. 8 is prepared. The upper electrode layer 20 is patterned into a plurality of rectangles each having the same width as that of the resultant i-type GaAs layer 123 in FIG. 32. Using the rectangular patterns as a mask, the p-type AlGaAs layer 121 to the i-type GaAs layer 123 are etched to provide a plurality of crosswise grooves 50 and then expose an upper surface of the p-type layer 124. Each rectangular pattern is further etched into a strip extending along a crosswise direction (current injection portion of a laser thyristor) having a width of 10 μm or less. Using the strip patterns as another mask, the p-type AlGaAs layer 121 and portion of the n-type AlGaAs layer 122 are etched. Notches 55 are formed by photoetching. Thereafter, an insulating film 30 is formed.

The insulating film preferably has two functions, i.e., insulating and light shielding functions, and may be formed by a plurality of types of films. When an $SiO_2$ film is used as the insulating film, it allows light having a light-emission wavelength of 870 μm of GaAs to pass therethrough, it may induce light coupling. Thus, a light-shielding film of a light absorption material such as amorphous silicon must be formed between the $SiO_2$ films.

Contact holes $C_1$ are formed by photoetching. A metal wiring layer for transfer clock lines is formed by deposition or sputtering, and the transfer clock lines $\phi_1$, $\phi_2$ and $\phi_3$ are then formed by photoetching. Finally, the end face of a laser beam output side is formed by cleavage or the like to have good parallelness, thus completing the structure of this embodiment.

In the structure of this embodiment, if p and n conductivity types are reversed, the structure of this embodiment can operate as described above if a bias condition and the like are inverted. Such a modification is also included in the scope of the present invention.

Embodiments E

Embodiments E described below present another example of simplifying the structure of light-emitting element arrays in the embodiments B described previously.

(Embodiment E-1)

Figure 33:
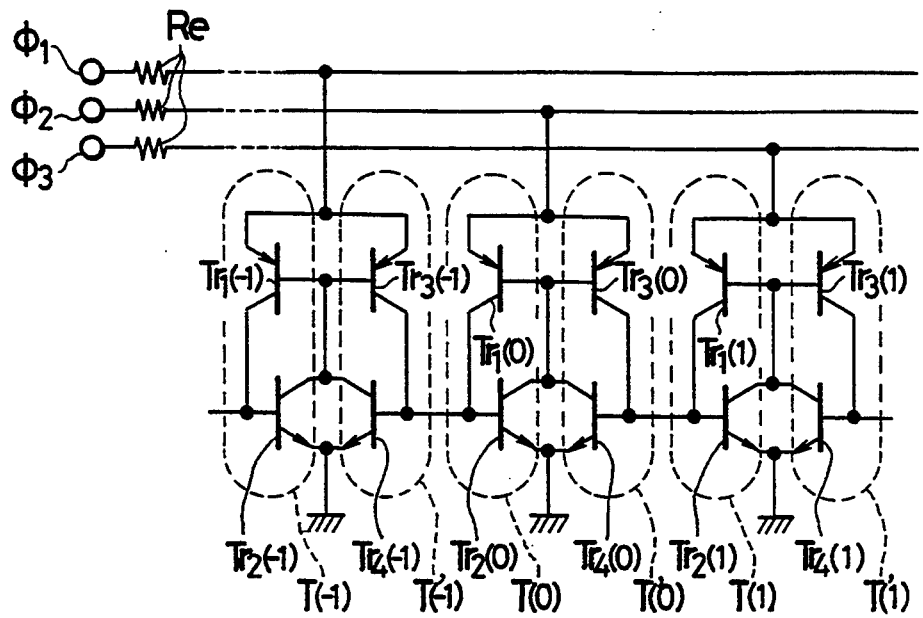
FIG. 33 is an equivalent circuit diagram of a light-emitting element array in an embodiment E-1.

FIG. 33 is an equivalent circuit diagram of an embodiment E-1 in which a light-emitting thyristor having upper and lower gates is used. Its light-emitting threshold voltage and current can be externally controlled.

The light-emitting thyristors $T_{(-1)}$, $T'_{(-1)}$, $T_{(0)}$, $T'_{(0)}$, $T_{(1)}$, and $T'_{(1)}$ are arranged in a line with a predetermined pitch and having a common cathode. The light-emitting thyristors $T_{(-1)}$ and $T'_{(-1)}$, $T_{(0)}$ and $T'_{(0)}$, and $T_{(1)}$ and $T'_{(1)}$ respectively constitute blocks. Each block is a group of light-emitting elements to which an identical clock line pulse is applied. In this embodiment, each block is constituted by two elements. Each of the light-emitting thyristors $T_{(-1)}$, $T_{(0)}$ and $T_{(1)}$ is represented by a combination of transistors Tr1 and Tr2, and each of the light-emitting thyristors $T'_{(-1)}$, $T'_{(0)}$ and $T'_{(1)}$ is represented by a combination of transistors Tr3 and Tr4. The transistors Tr1 and Tr3 are pnp transistors, and the transistors Tr2 and Tr4 are npn transistors. The transistors Tr1 and Tr3 are connected to the clock lines and the transistors Tr2 and Tr4 are connected to a bias voltage or a ground potential.

As to connection between the light-emitting thyristors, the base electrodes (to be referred to as first gates hereinafter) of the transistors Tr1 and Tr3 are connected to each other within each block, and the base electrodes (to be referred to as second gates hereinafter) of the transistors Tr2 and Tr4 are connected to each other between different blocks. Each of three transfer clock lines $\phi_1$, $\phi_2$ and $\phi_3$ is sequentially connected to the anodes of every three blocks. Each clock line has a current-limiting resistor Re.

An operation will be described below. Assume that the transfer clock $\phi_1$ goes to high level, and the light-emitting thyristors $T_{(-1)}$ and $T'_{(-1)}$ are turned on. In this case, the lower gate potential or voltage of the light-emitting thyristor $T'_{(-1)}$ is set at a high potential (about 1V) capable of flowing a current. Since the base of the transistor $Tr4_{(-1)}$ is connected to the base of the transistor $Tr2_{(0)}$, the light-emitting thyristor $T_{(0)}$ tends to be turned on. The influence of an ON state is given to only the light-emitting thyristor $T_{(0)}$, and is not given to the light-emitting thyristor $T'_{(0)}$. Similarly in a block $(-2)$, only the light-emitting thyristor $T'_{(-2)}$ tends to be turned on, and does not influence the light-emitting thyristor $T_{(-2)}$. The ON block does not influence secondary closest blocks, e.g., blocks $(-3)$ and $(1)$.

In this state, when the next transfer clock $\phi_2$ is set at an appropriate high-level voltage, the light-emitting thyristor $T_{(0)}$ is immediately turned on. The bases of the transistors $Tr3_{(0)}$ and $Tr3_{(0)}$ are set at a substantially zero potential since the light-emitting thyristor $T_{(0)}$ is turned on. Thus, a current flows through the transistor $Tr3_{(0)}$. For this reason, the light-emitting thyristor $T'_{(0)}$ is also successively turned on. On the other hand another block (e.g., $(-3)$ to which the transfer clock $\phi_2$ is applied is not influenced by the block $(-1)$, and hence is not turned on. A range of a high-level voltage capable of the transfer operation is considerably wide. The transfer operation can be performed within the range of 1.5 to 2V for a low voltage side, and within the range up to a voltage defined by a breakdown voltage of the light-emitting thyristor for a high voltage side. When the transfer block $\phi_1$ goes to low level, the block $(-1)$ is turned off, and the ON state is shifted from the block $(-1)$ to the block $(0)$.

If the clock pulses $\phi_1$, $\phi_2$ and $\phi_3$ are set so that their high-level voltage periods overlap each other, the ON states of the light-emitting thyristors are sequentially transferred. Thus, a light-emitting element array capable of self-scanning can be realized.

As described above, according to this embodiment, a self-scanning function can be realized without using a resistor for connecting light-emitting thyristors, and a high-level voltage of the transfer clock pulse capable of the transfer can have a considerable margin, i.e., can be in a range of 1.5 to 2V for a low voltage side and a range up to a breakdown voltage of the light-emitting thyristor for a high voltage side.

In this embodiment, the operation using the three-phase clock pulses has been described. However, the structure of this embodiment can operate using clocks of four or more phases, as a matter of course. In FIG. 33, the light-emitting thyristors are arranged in a line. However, a linear arrangement need not be employed. For example, the light-emitting thyristors may be arranged in a zigzag pattern or may be arranged in two lines from the halfway depending on applications. In this embodiment, description has been made using only the light-emitting thyristors. However, the present invention is not limited to this as long as a device having a similar function is used. A laser thyristor may be used as the light-emitting thyristor. The light-emitting elements may be constituted as individual parts or are integrated by any means as will be described in the next embodiment.

(Embodiment E-2)

In an embodiment E-2, an IC structure of the arrangement in the embodiment E-1 will be described.

Figure 34:
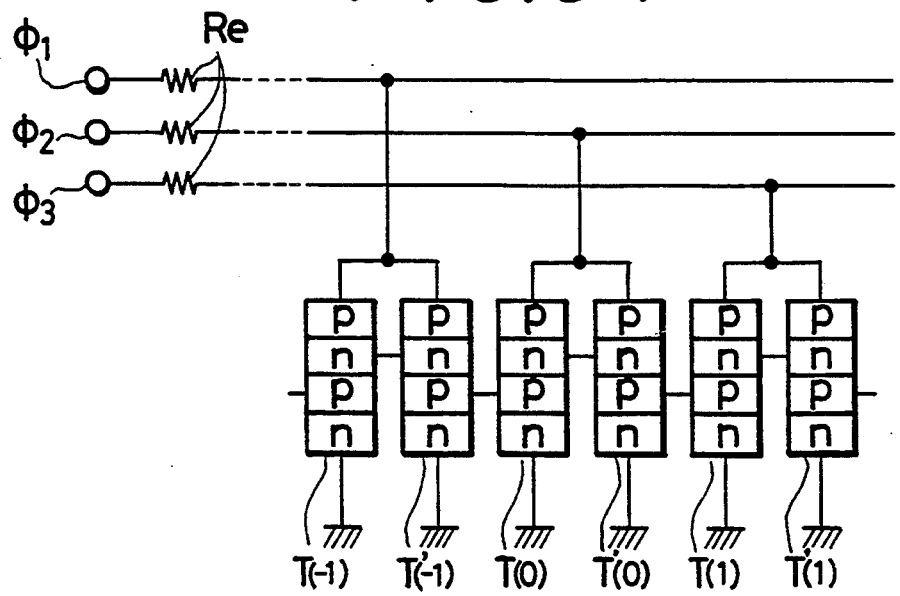
FIG. 34 is a circuit diagram showing a pn image of the equivalent circuit diagram of the embodiment E-1.

FIG. 34 shows a more illustrative view of the equivalent circuit diagram of FIG. 33. Each light-emitting thyristor is basically expressed as a structure wherein a total of four p- and n-type semiconductor layers are stacked in a predetermined order. In FIG. 34, the connection relationship in FIG. 33 is replaced with the pnpn structure.

Figure 35:
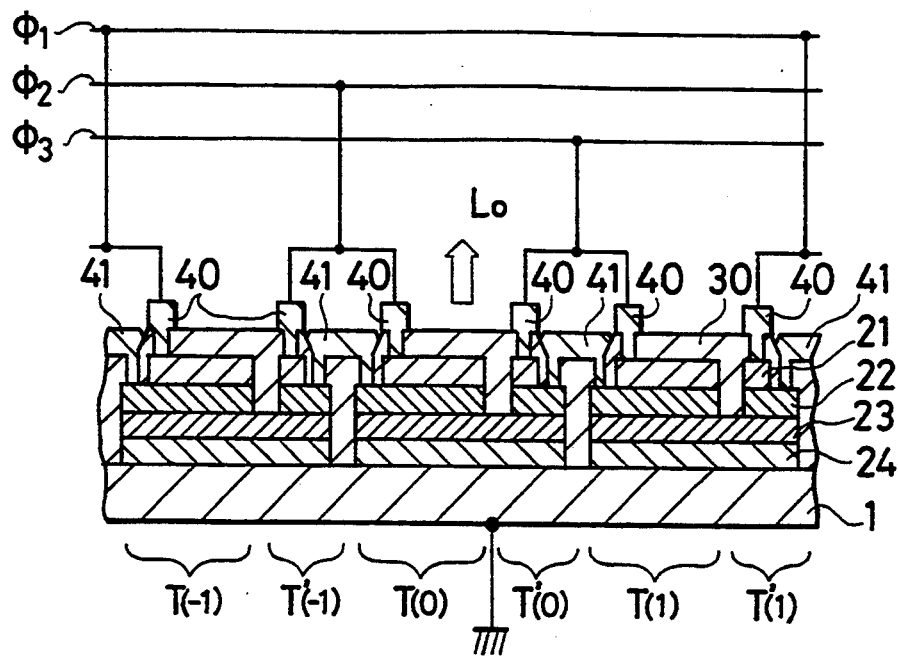
FIG. 35 is a sectional view of an embodiment E-2.

FIG. 35 shows a practical structure of FIG. 34. An n-type semiconductor layer 24, a p-type semiconductor layer 23, an n-type semiconductor layer 22, and a p-type semiconductor layer 21 are sequentially formed on a grounded n-type GaAs substrate 1. The resultant structure is patterned into individual light-emitting thyristors $T_{(-1)}$ to $T_{(1)}$ by photolithography or the like and etching, thus forming the structure shown in FIG. 35.

The characteristic feature of this structure is that the light-emitting thyristors $T'_{(0)}$ and $T_{(0)}$ and the light-emitting elements $T'_{(0)}$ and $T_{(1)}$ have common lower pn portions, and upper pn portions of the light-emitting thyristors $T_{(-1)}$ and $T'_{(-1)}$, the light-emitting thyristors $T_{(0)}$ and $T'_{(0)}$, and the light-emitting thyristors $T_{(1)}$ and $T'_{(1)}$ are connected through a wiring material. The light-emitting thyristors have anodes or strips 40 and upper gates or strips 41 (first gates), and are isolated by an insulating layer 30.

Of the light-emitting thyristors T and T', the thyristors T are used as light-emitting elements in practice, and the thyristors T' are used for connecting adjacent thyristors. Light $L_0$ is output upward.

The structure of this embodiment is the same as the equivalent circuit shown in the embodiment E-1 (FIG. 33), and performs the same operation. Therefore, if the high-level voltages of the transfer clocks $\phi_1$, $\phi_2$ and $\phi_3$ are set to sequentially slightly overlap each other, the ON state of the light-emitting thyristors is sequentially transferred. That is, a light-emission point can be sequentially shifted.

As described above, according to this embodiment, no resistor for connecting light-emitting elements is required, and a high-level voltage transfer range of the transfer clock pulse can have a considerable margin, i.e., can be a range of 1.5 to 2V at a low voltage side and a range up to a breakdown voltage of the light-emitting thyristor at a high voltage side.

In the structure of this embodiment, if p and n conductivity types are reversed, the structure of this embodiment can operate as described above if a bias condition and the like are inverted. Such a modification is also included in the scope of the present invention.

Embodiments F

Embodiments F described below can simplify drive circuits of the light-emitting element arrays in the embodiment B described previously by using two-phase clocks and cells each comprising a light-emitting thyristor having an upper gate and a diode means.

(Embodiment F-1)

In an embodiment F-1 described herein, a diode is used as an electrical connection means.

Figure 36:
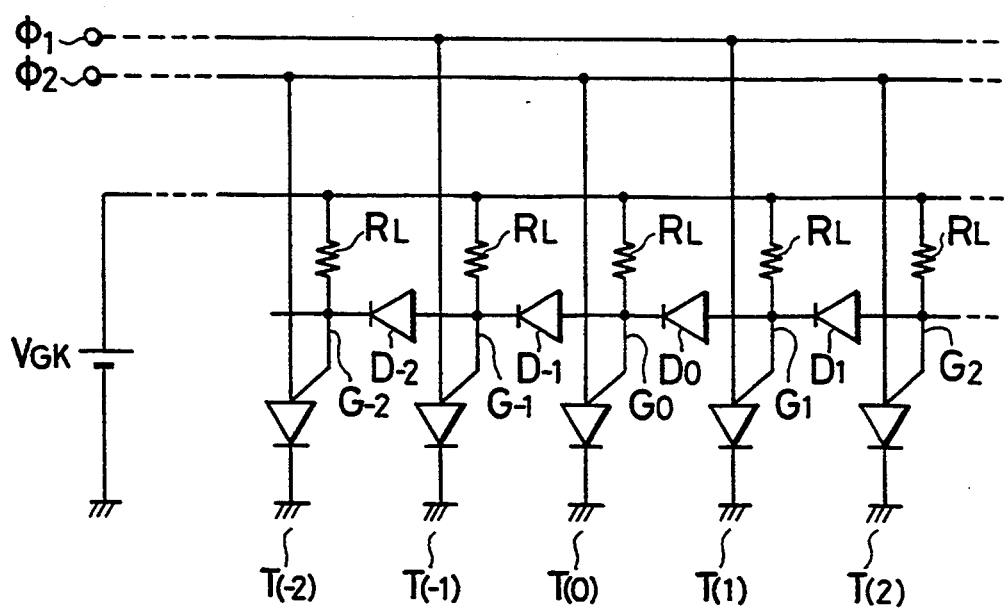
FIG. 36 is an equivalent circuit diagram of a light-emitting element array in an embodiment F-1.

FIG. 36 is an equivalent circuit diagram showing the principle of the embodiment F-1. In this embodiment, a most typical three-terminal light-emitting thyristor is used as a light-emitting element whose light-emission threshold voltage and current can be externally controlled. Reference symbols $T_{(-2)}$ to $T_{(+2)}$ denote light-emitting thyristors, which are arranged in a line. Reference symbols $G_{-2}$ to $G_{+2}$ denote gate electrodes of the light-emitting thyristors $T_{(-2)}$ to $T_{(+2)}$. Reference symbol $R_L$ denotes a load resistor of each gate electrode; $D_{-2}$ to $D_2$, diodes for providing a bias; and $V_{GK}$, a bias voltage. Each of two transfer clock lines $\phi_1$ and $\phi_2$ is sequentially connected to the anode electrodes of every other individual light-emitting thyristors.

An operation will be described below. Assume that the transfer clock $\phi_2$ goes to high level, and the light-emitting thyristor $T_{(0)}$ is turned on. In this condition, the potential of the upper gate $G_0$ is reduced to about 0V due to the characteristics of the light-emitting thyristor (to about 1V in the case of a silicon thyristor). If the bias voltage $V^{GK}$ is 5V, the upper gate voltages of the light-emitting thyristors are determined by the network of the diodes $D_{-2}$ to $D_2$. The upper gate voltage of a forward or next light-emitting thyristor nearest to the thyristor T(0) is decreased due to the unidirectional and asymmetrical characteristics of the diode. The gate voltages of the forward thyristors are stepped up by a voltage drop or diffusion potential of the diode as they are apart from the thyristor $T_{(0)}$. Therefore, the gate $G_1$ voltage is higher than the gate $G_0$ voltage by the diffusion potential $V_{df}$ of the diode, and the gate $G_2$ voltage is higher than the gate $G_1$ voltage by the diffusion potential. The gate $G_1$ voltage of the backward light-emitting thyristor maintains 5V since the diode $D_{-1}$ is reversed-biased. The next transfer clock pulse $\phi_1$ is applied to the thyristors $T_{(1)}$, $T_{(-1)}$, $T_{(3)}$, $T_{(-3)}$ and the like. The thyristor $T_{(1)}$ has the lowest ON voltage, i.e., about $2V_{df}$. An element having the second lowest ON voltage is $T_{(3)}$, and the voltage is about $4V_{df}$. The ON voltages of the elements $T_{(-1)}$ and $T_{(-3)}$ are about $V_{GK}+V_{DF}$. In this manner, if the high-level voltage of the transfer clock pulse is set to fall within the range of $2V_{df}$ to $4V_{df}$, only the thyristor $T_{(1)}$ can be turned on, and the transfer operation can be performed.

In the equivalent circuit of this embodiment, a resistor may be connected in series with the diode. In this case, a potential difference between the gates $G_0$ and $G_1$ is greater than the diffusion potential $V_{df}$ of the diode, and the high-level clock voltage range capable of the transfer operation can be widened.

(Embodiment F-2)

In the embodiment F-1, the equivalent circuit has been described. In an embodiment F-2 described below, an IC structure of the arrangement the embodiment F-1 will be described. The gist of this embodiment lies in a structure wherein a diode for performing electrical coupling is formed by utilizing a portion of a light-emitting thyristor as a cell, so that a diode can be formed in the same process as that of the light-emitting thyristor.

Figure 37:
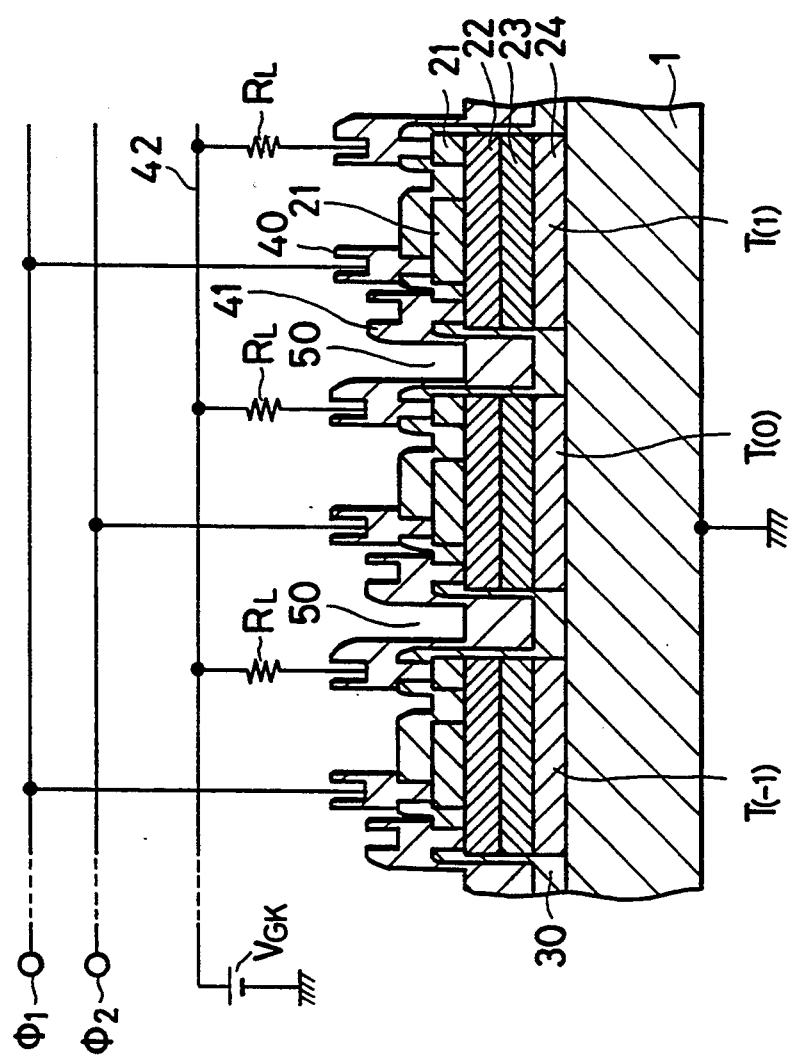
FIG. 37 is a schematic view showing a structure of a light-emitting element array in an embodiment F-2.

FIG. 37 shows a general structure of the embodiment F-2. An n-type semiconductor layer 24, a p-type semiconductor layer 23, an n-type semiconductor layer 22, and a p-type semiconductor layer 21 are sequentially formed on a grounded n-type GaAs substrate 1. A laddery groove 50 for isolating the above-mentioned structure into individual light-emitting elements is formed by photolithography or the like and etching. Reference symbols $T_{(-2)}$ to $T_{(+2)}$ denote these individual light-emitting thyristors. Anode strips 40 have an ohmic contact with the corresponding p-type semiconductor layers 21, and gate strips 41 have an ohmic contact with the corresponding n-type semiconductor layers 22. An insulating layer 30 is formed to prevent short-circuiting between the thyristors and wirings, and at the same time, serve as protection films for preventing deterioration of characteristics.

The insulating layers 30 are preferably formed of a material allowing light having a light-emission wavelength of a light-emitting thyristor to pass therethrough well. The n-type GaAs substrate 1 serves as a common cathode of each thyristor. Each of two transfer clock lines $\phi_1$ and $\phi_2$ is sequentially connected to the anodes or strips 40 of every other individual light-emitting thyristors. A load resistor $R_L$ is connected to each gate electrode. On the other hand, if light coupling occurs between the elements, the transfer operation of this embodiment may be influenced by the light coupling. In order to prevent this, each gate electrode partially extends into the isolation groove between the adjacent light-emitting elements so as to employ a structure capable of preventing light coupling.

The structure of this embodiment is the same as the equivalent circuit shown in the embodiment F-1 (FIG. 36), and performs the same operation. Therefore, if the high-level periods of the transfer clocks $\phi_1$ and $\phi_2$ are set to alternately slightly overlap each other, the ON state of the light-emitting thyristors is sequentially transferred. That is, a light-emission point is sequentially transferred. According to this embodiment, a two-phase drive self-scanning type light-emitting element array can be realized by an integrated circuit.

Three or more phase clocks may be used to achieve a more stable transfer operation.

(Embodiment F-3)

Figure 38:
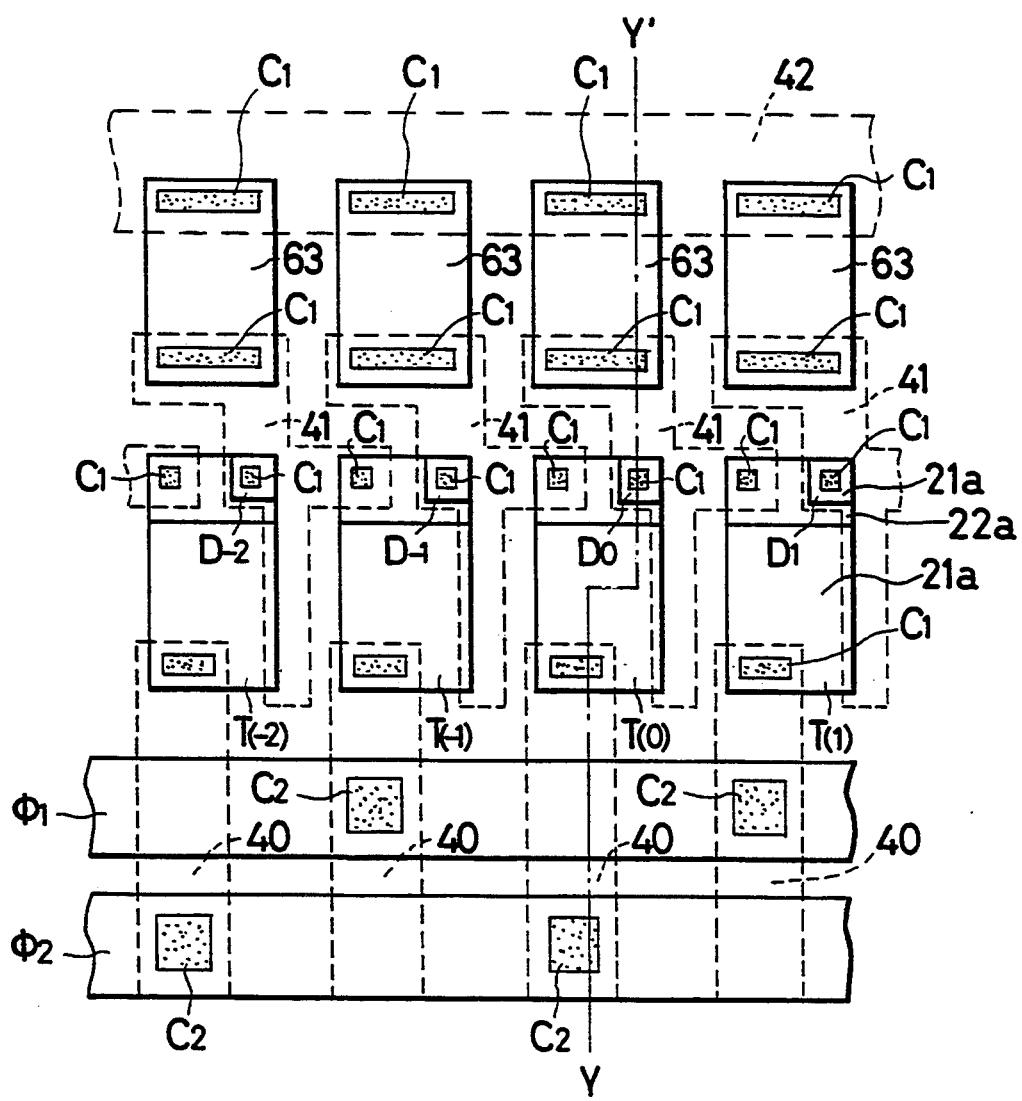
FIGS. 38 and 39 are respectively a plan view and a sectional view of a light-emitting element array in an embodiment F-3.
Figure 39:
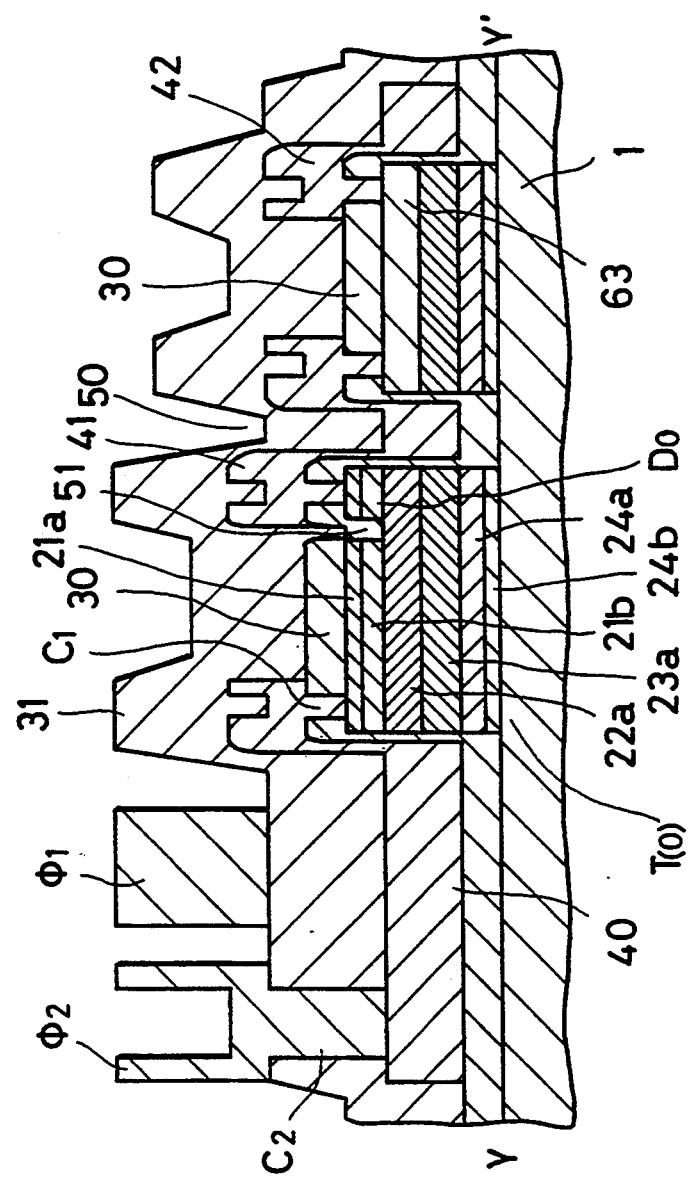

FIGS. 38 and 39 show a practical structure of the embodiment F-1. Reference symbols $T_{(-2)}$ to $T_{(+1)}$ denote light-emitting thyristors.

A load resistor 63 connected to the gate of each light-emitting thyristor is represented by $R_L$, and is formed by a semiconductor layer constituting the light-emitting thyristor. Diodes $D_{-2}$ to $D_1$ are connected to the thyristors $T_{(-2)}$ to $T_{(+1)}$, respectively. The anode of each diode is connected to the gate of the next light-emitting thyristor, and the load resistor 63.

Semiconductor layers and electrodes are connected through connecting holes $C_1$ as contact holes. Through holes $C_2$ are connecting holes for connecting the anode electrodes 40 of the light-emitting thyristors and the transfer clock lines $\phi_1$ and $\phi_2$. A power source line 42 is connected to a power source voltage $V_{GK}$ and the load resistors $R_L$. The power source line 42 is formed simultaneously with gate electrodes 41. Note that the gate electrodes 41 also serve as light shielding layers for preventing the light-emitting elements $T_{(-2)}$ to $T_{(+1)}$ from mutual influences upon their light emission.

FIG. 39 is a sectional view of this embodiment. The light-emitting elements are formed as follows. An n-type GaAs layer 24b, an n-type AlGaAs layer 24a, a p-type GaAs layer 23a, an n-type GaAs layer 22a, a p-type AlGaAs layer 21b, and a p-type GaAs layer 21a are sequentially formed on an n-type GaAs substrate 1. Isolation grooves 50 for isolating the resultant structure into individual light-emitting elements are formed by photolithography or the like and etching. An isolation groove 51 is formed to isolate the light-emitting element $T_{(0)}$ and the coupling diode $D_0$. Each load resistor 63 ($R_L$) is formed of the n-type GaAs layer 22a of the light-emitting element. The resistor may be formed of another layer. For example, the resistor may be formed of the p-type GaAs layer 23a or may be formed as another resistor region.

A manufacturing process of the embodiment F-3 will be described below. The n-type GaAs layer 24b, the n-type AlGaAs layer 24a, the p-type GaAs layer 23a, the n-type GaAs layer 22a, the p-type AlGaAs layer 21b, and the p-type GaAs layer 21a are sequentially formed on the n-type GaAs substrate 1. The isolation grooves 50 are then formed to isolate the light-emitting elements and the resistors. The isolation grooves 51 are formed to isolate the light-emitting diodes and the coupling diodes. The resistors 63 are formed in the same process as that of forming the isolation grooves 51. More specifically, the p-type GaAs layer 21a and the p-type AlGaAs layer 21b are removed. The insulating films 30 are formed, and the contact holes $C_1$ are formed therein. Thereafter, the electrodes 40, 41 and 42 are formed. The insulating films 31 as insulating interlayers are formed, and the through holes $C_2$ are formed. Thereafter, the electrodes $\phi_1$ and $\phi_2$ are formed. With the above-mentioned process, the structure of the embodiment F-3 is completed.

(Embodiment F-4)

In an embodiment F-4, a transistor is used as a unidirectional means between adjacent light-emitting thyristors.

Figure 40:
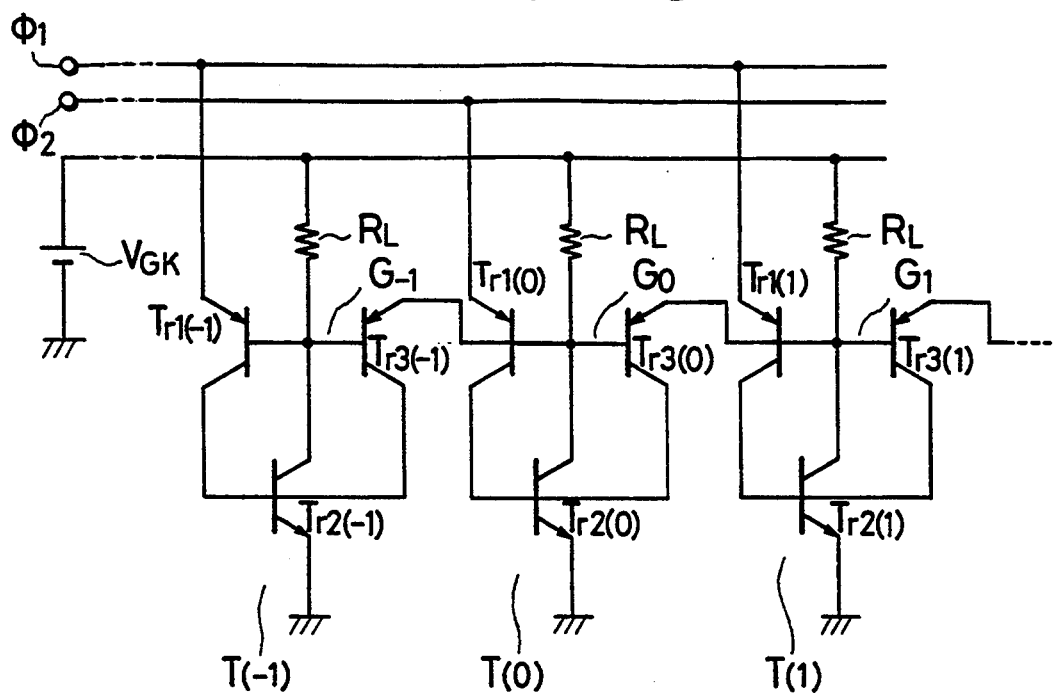
FIG. 40 is an equivalent circuit diagram of a light-emitting element array in an embodiment F-4.

FIG. 40 shows an equivalent circuit of the embodiment F-4. Each light-emitting thyristor described in the embodiment F-1 is expressed by a combination of a pnp transistor Tr1 and an npn transistor Tr2. The collector of the transistor Tr1 is connected to the base of the transistor Tr2, and the base of the transistor Tr1 is connected to the collector of the transistor Tr2 so as to cause these transistors to perform the same operation as the thyristor. The base of the transistor Tr1, e.g., the collector of the transistor Tr2 corresponds to the gate of a three-terminal thyristor. Combinations of the transistors Tr1 and Tr2 are expressed by $T_{(-1)}$ to $T_{(1)}$. In the embodiment F-4, adjacent elements are coupled through a pnp transistor Tr3 without using the diodes unlike in the embodiment F-1. The base of the transistor Tr3 is connected to the base of the transistor Tr1, and the collector of the transistor Tr3 is connected to the base of the transistor Tr2. The transfer operation in this case is the same as that described in the embodiment F-1. That is, the thyristor in the embodiment F-1 can be considered as the combination of the transistors Tr1 and Tr2, and the diode in the embodiment F-1 can be considered as the transistor Tr3.

A detailed device structure in the embodiment F-4 is the same as those shown in the embodiments F-2 and F-3.

(Embodiment F-5)

Figure 41:
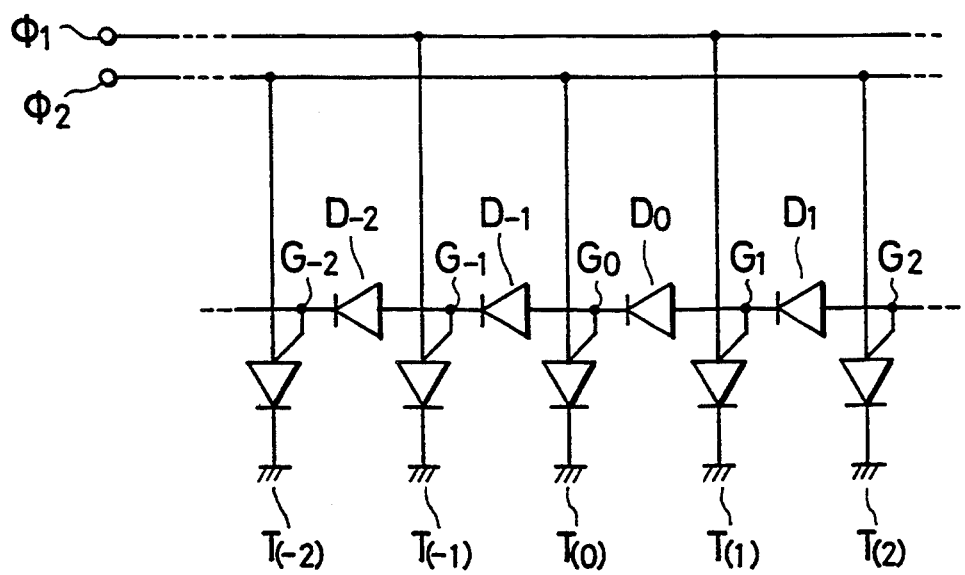
FIG. 41 is an equivalent circuit diagram of a light-emitting element array in an embodiment F-5.

FIG. 41 is an equivalent circuit diagram of an embodiment F-5. In the embodiment F-5, the power source $V_{GK}$ and the load resistors $R_L$ are omitted from the equivalent circuit shown in the embodiment F-1. The equivalent circuit of the embodiment F-1 utilizes the fact that the ON voltage of the thyristor is determined with respect to the power source voltage $V_{GK}$, the gate voltage of the ON element becomes almost 0V, and this influences the adjacent elements through the diodes. In the embodiment F-5, the power source $V_{GK}$ is omitted. An operation of this embodiment will be described below.

Assume that a clock high-level voltage is applied to a transfer clock line $\phi_2$, and a light-emitting thyristor $T_{(0)}$ is turned on. The potential of a gate $G_0$ becomes almost 0V. In this case, the voltage at a gate $G_{-1}$ of an adjacent light-emitting thyristor $T_{(-1)}$ is indefinite since a diode $D_{-1}$ is reverse-biased when the voltage at the gate $G_{-1}$ exceeds 0V, and since no current flows. The voltage at a gate $G_1$ of a light-emitting thyristor $T_{(1)}$ cannot become higher than a diffusion potential $V_{df}$ of a diode $D_0$. For this reason, the ON voltage of a light-emitting thyristor $T_{(-1)}$ becomes one determined by the device structure of the light-emitting thyristor $T_{(-1)}$. Meanwhile, the ON voltage of the light-emitting thyristor $T_{(1)}$ becomes a voltage higher than the potential at the gate $G_0$ by the potential $V_{df}$, i.e., about $2V_{df}$. If the ON voltage defined by the device structure is set to be higher than $2V_{df}$, two-phase drive can be achieved as has been described in the embodiment F-1.

According to the embodiment F-5, neither power source nor load resistors are required, and the wiring layers for the two transfer clocks need only be formed, resulting in a simple structure.

(Embodiment F-6)

Figure 42:
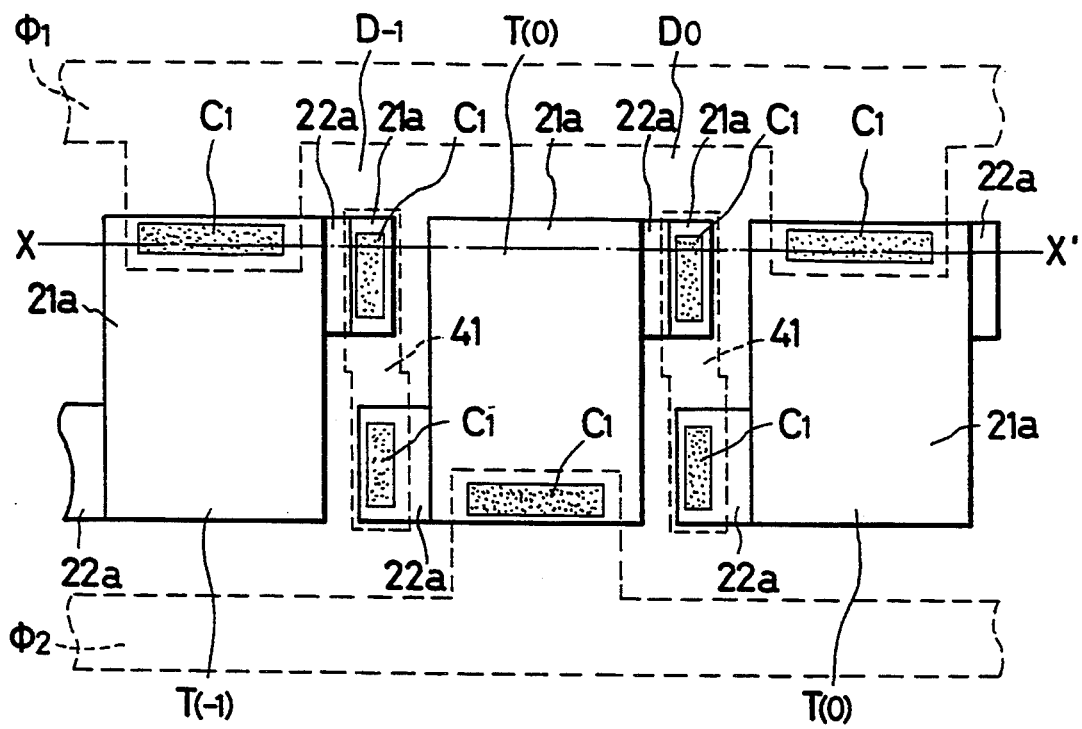
FIGS. 42 and 43 are respectively a plan view and a sectional view of a light-emitting element array in an embodiment F-6.
Figure 43:
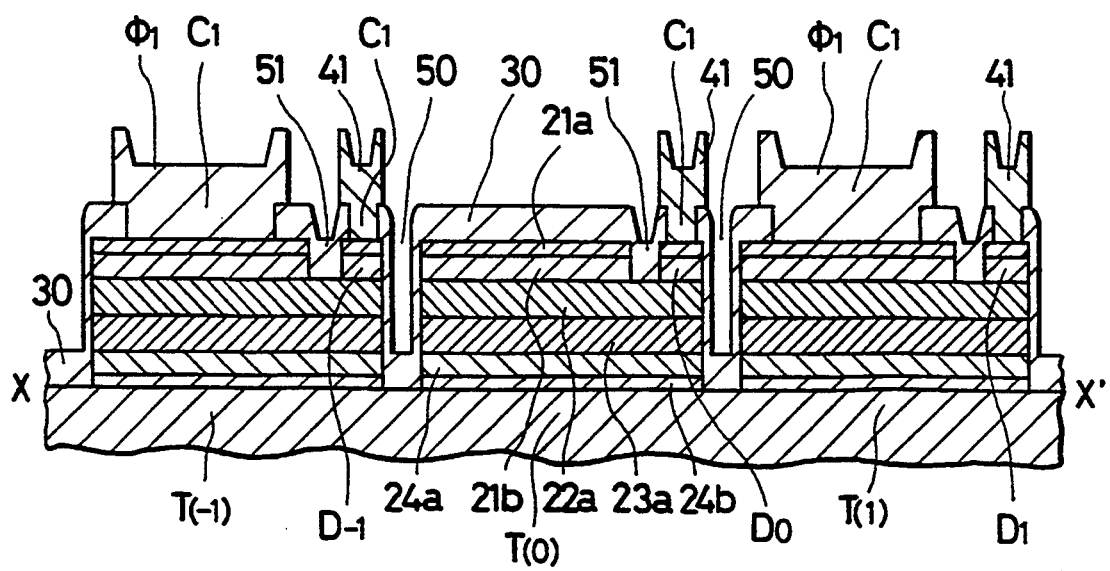

FIGS. 42 and 43 show a structure of an embodiment F-6. The structure shown in FIGS. 42 and 43 corresponds to an actual structure of the equivalent circuit shown in the embodiment F-5. FIG. 42 is a plan view, and FIG. 43 is a sectional view taken along a line X—X' in FIG. 42.

This structure will be described below. Transfer clock lines $\phi_1$ and $\phi_2$, light-emitting thyristors $T_{(-1)}$ to $T_{(1)}$ are the same as those described above. Strips 41 connect coupling diodes $D_{-1}$ to $D_1$ and the gates of the light-emitting thyristors. The light-emitting thyristor portion shown in FIG. 43 is basically the same as that shown in FIG. 39.

A manufacturing process of the embodiment F-6 will be described below. An n-type GaAs layer 24$b$, an n-type AlGaAs layer 24$a$, a p-type GaAs layer 23$a$, an n-type GaAs layer 22$a$, a p-type AlGaAs layer 21$b$, and a p-type GaAs layer 21$a$ are sequentially formed on an n-type GaAs substrate 1. Isolation grooves 50 are then formed to isolate the light-emitting thyristors. Isolation grooves 51 are formed to isolate the light-emitting thyristors and the coupling diodes. That is, the p-type GaAs layer 21$a$ and the p-type AlGaAs layer 21$b$ are removed. Insulating films 30 are formed, and contact holes $C_1$ are formed therein. Thereafter, the strips 41 and transfer clock lines $\phi_1$ and $\phi_2$ are formed. With the above-mentioned process, the structure of the embodiment F-6 is completed.

The characteristic feature of the structure of the embodiment F-6 is that two-phase wiring layers are not used unlike in the embodiment F-3. As can be seen from FIG. 42, wiring patterns can be formed without overlapping, and one wiring layer need only be formed. Since a resistor can be omitted, a manufacturing process can be simplified, and thus, manufacturing cost can be further decreased.

(Embodiment F-7)

Figure 44:
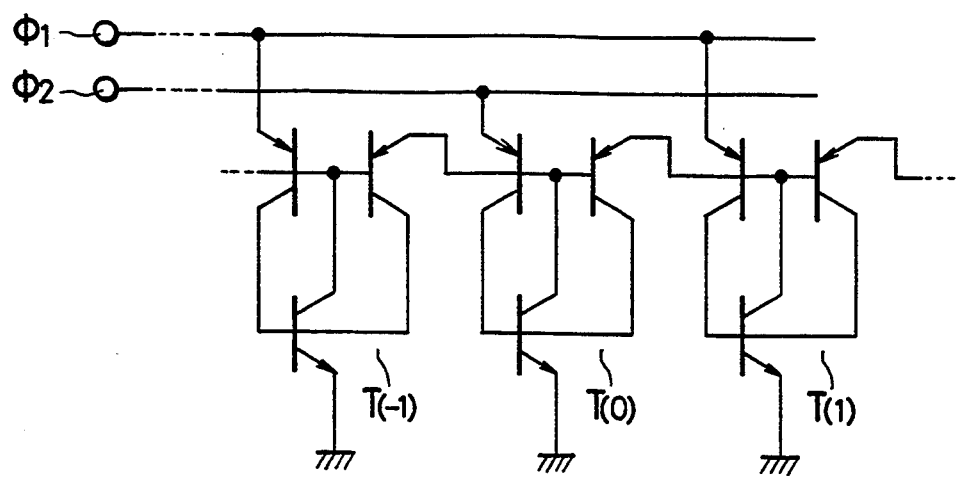
FIG. 44 is an equivalent circuit diagram of a light-emitting element array in an embodiment F-7.

FIG. 44 is an equivalent circuit diagram of an embodiment F-7. The embodiment F-7 corresponds to one rewriting the embodiment F-5 as an equivalent circuit using transistors. The structure of the embodiment F-7 is substantially the same as that of the embodiment F-4, except that the load resistor in the embodiment F-4 is omitted, and its operation is the same as that in the embodiment F-5. The actual structure of the embodiment F-7 is the same as that in the embodiment F-6.

In this manner, the structure of this embodiment can be constituted by equivalently using transistors.

(Embodiment F-8) Application to Laser

In the above embodiments, the light-emitting thyristors have been described as the light-emitting elements. In the following embodiment, a case will be described wherein laser thyristors are used.

Figure 45:
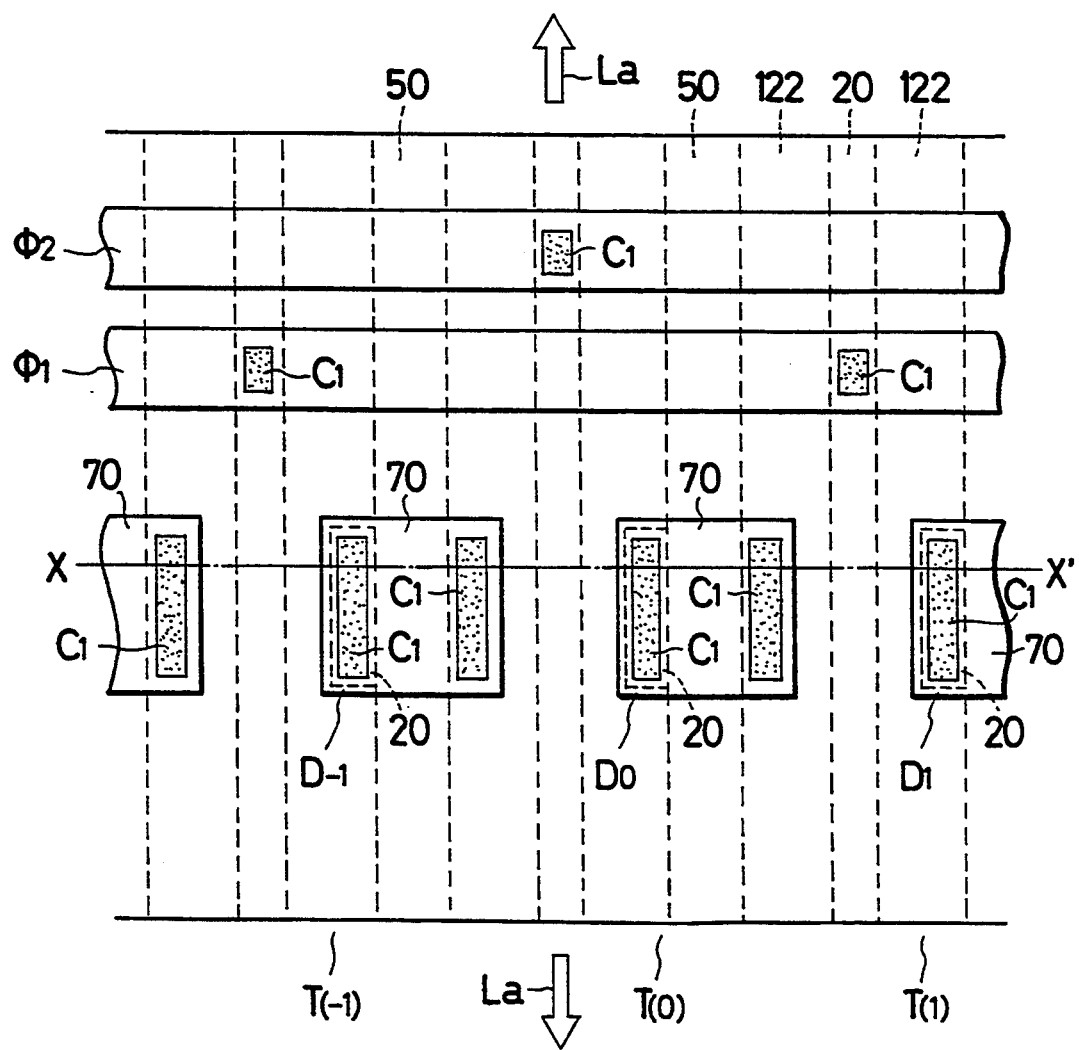
FIGS. 45 and 46 are respectively a plan view and a sectional view of a light-emitting element array in an embodiment F-8.
Figure 46:
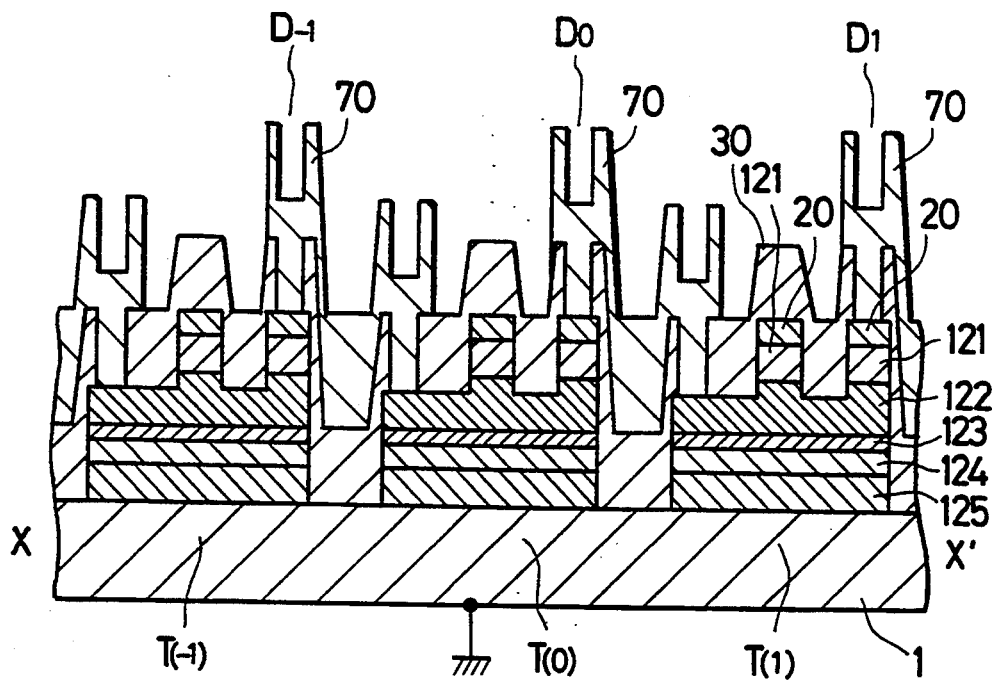

FIGS. 45 and 46 show a structure of an embodiment F-8. FIG. 45 is a plan view of the embodiment F-8, and FIG. 46 is a sectional view thereof. Basically, a thyristor portion is constituted as a laser thyristor, and a coupling diode is provided in its cavity portion. This structure adopts the equivalent circuits of the embodiments F-5 and F-7.

A manufacturing method will be briefly described. An n-type AlGaAs layer 125, a p-type AlGaAs layer 124, an i-type (non-doped) GaAs layer 123, an n-type AlGaAs layer 122, a p-type AlGaAs layer 121, and an upper electrode layer 20 are sequentially stacked on an n-type GaAs substrate 1.

The upper electrode layer 20 is then photo etched into a rectangular shape having the same width as that of the n-type AlGaAs layer 125 in FIG. 46. Using the electrode pattern 20 as a mask, the p-type AlGaAs layer 121 to the n-type AlGaAs layer 125 are etched to form element isolation grooves 50. The upper electrode pattern 20 is further etched into a stripe pattern (current injection portion of a laser thyristor) having a width of 10 $\mu$m or less and a coupling laser diode pattern ($D_{-1}$ to $D_1$ portions). Using these patterns as masks, the p-type AlGaAs layer 121 and the n-type AlGaAs layer 122 are etched. The n-type AlGaAs layer 122 is not entirely removed but is partially left. Thereafter, an insulating film 30 is formed. The insulating film preferably has two functions, i.e., insulating and light shielding functions, and may be formed by a plurality of types of films. When an SiO$_2$ film is used as the insulating film, it allows light having a light-emission wavelength of 870 $\mu$m of GaAs to pass therethrough, it may induce light coupling. Thus, a light-shielding film of a light absorption material such as amorphous silicon must be formed between the SiO$_2$ films. Contact holes $C_1$ are formed by photoetching. A metal wiring layer for transfer clock lines is formed by deposition or sputtering, and the transfer clock lines $\phi_1$ and $\phi_2$ are then formed by photoetching. Finally, the end face of a laser beam output side is formed by cleavage or the like to have good parallelness, thus completing the structure of this embodiment.

Alternatively, the equivalent circuits in the embodiments F-1 and F-4, i.e., including resistors, can form a laser, as a matter of course.

In the structure of this embodiment, if p and n conductivity types are reversed, the structure of this embodiment can operate as described above if a bias condition and the like are inverted. Such a modification is also included in the scope of the present invention.

In the above embodiments, control electrodes of adjacent light-emitting elements are connected through an electrical means to form a network. Every other light-emitting elements are connected to each other, so that two systems of scanning functions can be provided to a single light-emitting element array. In a two-dimensional or three-dimensional light-emitting element array, light-emitting elements are connected to four or six or more light-emitting elements through electrical means.

Embodiments G

Embodiments G described herein can widen a transfer clock pulse voltage range in the embodiments F described above.

(Embodiment G-1)

Figure 47:
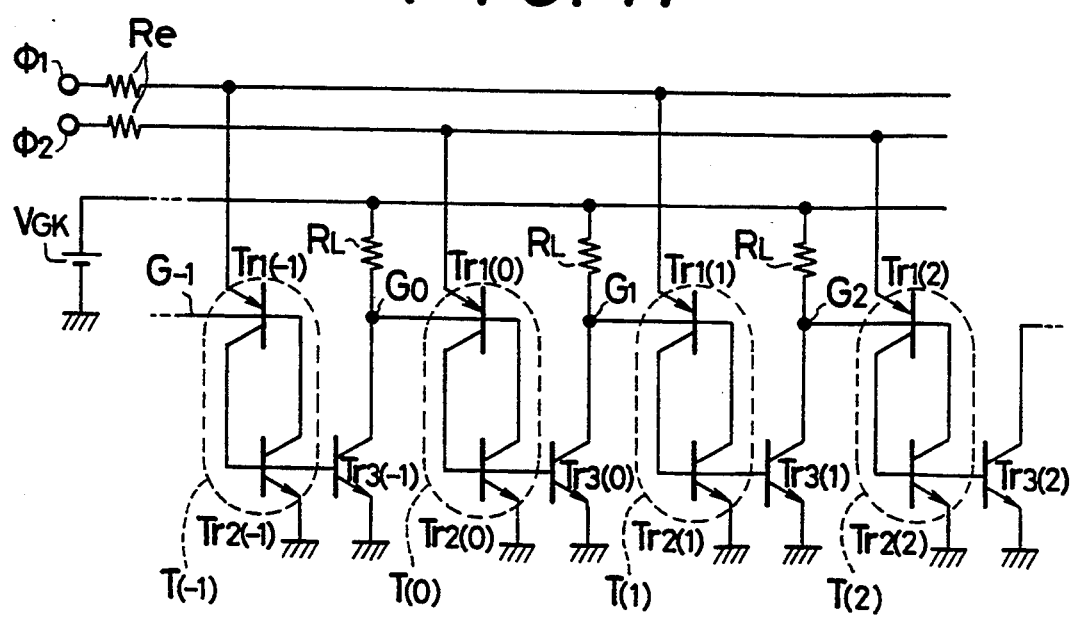
FIG. 47 is an equivalent circuit diagram showing an embodiment G-1.

FIG. 47 is an equivalent circuit diagram showing the principle of an embodiment G-1. In this embodiment, a most typical three-terminal light-emitting thyristor is used as a light-emitting element whose light-emitting threshold voltage and current can be externally controlled. Each thyristor is constituted by a combination of a pnp transistor Tr1 and an npn transistor Tr2. The base of a transistor Tr3 is connected to the base of the npn transistor Tr2, and constitutes a current-mirror circuit in combination with the npn transistor Tr2. Light-emitting thyristors $T_{(-1)}$ to $T_{(1)}$ are aligned in a line, and are connected through the current-mirror circuits.

Light-emitting thyristors $T_{(-2)}$ to $T_{(2)}$ respectively have upper gates $G_{-1}$ to $G_{+2}$. A bias voltage $V_{GK}$ is applied to each upper gate through a pull-up resistor $R_L$. Each of two transfer clock lines $\phi_1$ and $\phi_2$ is connected to the anode electrodes (emitters of the transistors Tr1) of every other individual light-emitting thyristors. Each clock line has a resistor Re for restricting a current of the clock line.

An operation will be described below. Assume that the transfer clock $\phi_2$ goes to high level, and the light-emitting element $T_{(0)}$ is turned on. In this case, the potential at the gate electrode $G_0$ is reduced to almost 0V due to the characteristics of the light-emitting thyristor (to about 1V in the case of a silicon thyristor). If the bias voltage $V_{GK}$ is 5V, a bias current limited by the resistor $R_L$ flows to the gate $G_0$. A clock current limited by the resistor Re flows to the emitter (anode). Since the transistors Tr2 and Tr3 constitute the current-mirror circuit, the transistor Tr3 has a current drive power proportional to the transistor Tr2. With this current drive power, a current is withdrawn through the resistor $R_L$ connected to the collector of the transistor Tr3 so as to decrease the potential of the gate electrode $G_1$ of the adjacent light-emitting element $T_{(1)}$. By appropriately adjusting the drive power of the transistor Tr3, the potential of the gate electrode $G_1$ can be reduced to almost zero. Since the ON voltage of the light-emitting thyristor $T_{(1)}$ becomes a voltage higher than the potential of the gate electrode $G_1$ by a diffusion potential $V_{df}$, an ON state can be transferred to the light-emitting thyristor $T_{(1)}$ if the voltage of the transfer clock $\phi_1$ is higher than the diffusion potential $V_{df}$.

In this manner, the ON voltage of the forward light-emitting thyristor $T_{(1)}$ is decreased, while the ON voltage of the backward light-emitting thyristor $T_{(-1)}$ located at the left side thereof is not changed. Even if the potential at the gate $G_0$ is reduced to almost zero, the voltage of the gate $G_{-1}$ for determining the ON voltage of the light-emitting thyristor $T_{(-1)}$ is not influenced thereby.

As described above, the light-emitting element array using the current-mirror circuits is operated by transfer clock pulses ranging from $V_{df}$ to $V_{GK}+V_{df}$, and can be operated with a wide voltage margin of $V_{GK}$.

In this embodiment, the load resistor $R_L$ need not always be used, and the light-emitting element array can operate without this resistor.

In this embodiment, two-phase transfer clock pulses with overlapped short time periods are used. However, the structure of this embodiment can operate using clock pulses of three or more phases.

(Embodiment G-2)

In the embodiment G-1, the equivalent circuit has been described. In an embodiment G-2, an IC structure of the arrangement in the embodiment G-1 will be described. The gist of this embodiment lies in a structure wherein a current-mirror circuit (Tr2 and Tr3) can be formed in the same process as that of the light-emitting thyristor.

Figure 48:
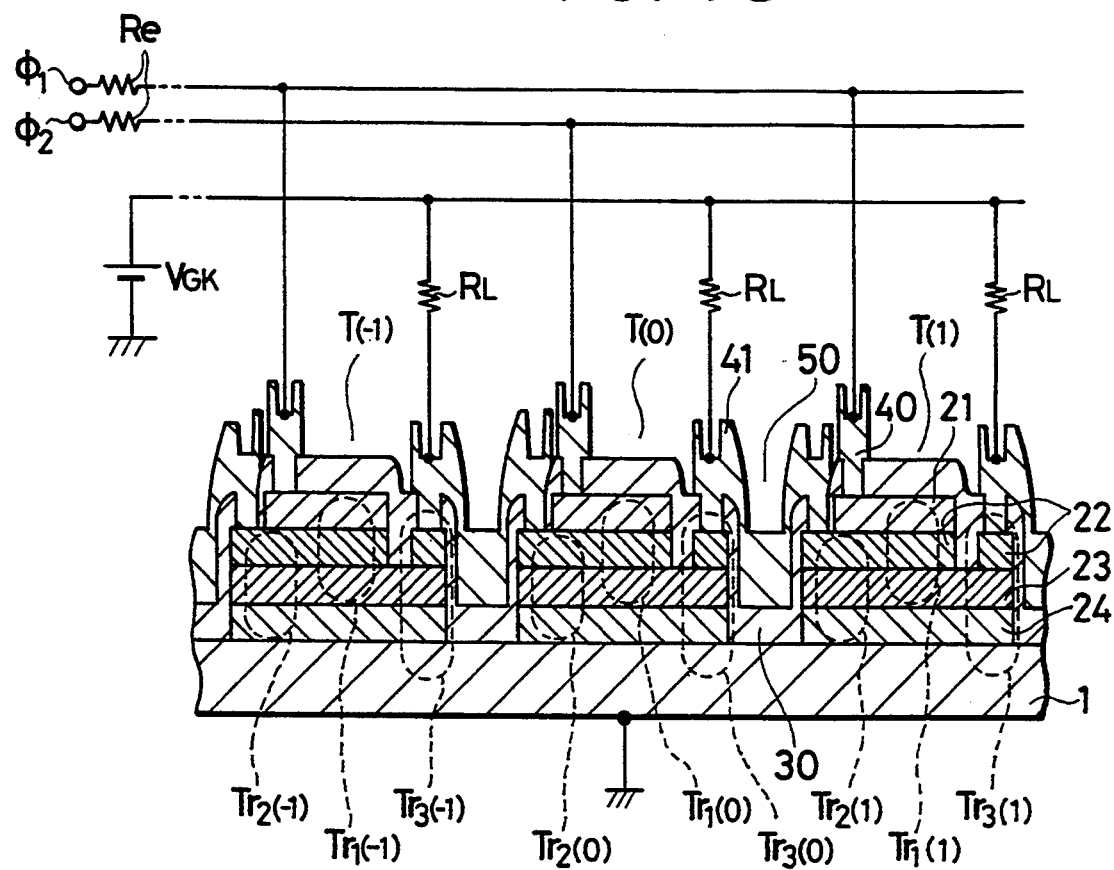
FIG. 48 is a sectional view showing an embodiment G-2.

FIG. 48 shows a general structure of the embodiment G-2. An n-type semiconductor layer 24, a p-type semiconductor layer 23, an n-type semiconductor layer 22, and a p-type semiconductor layer 21 are sequentially formed on a grounded n-type GaAs substrate 1. Isolation grooves 50 are formed by photolithography or the like and etching so as to pattern the above-mentioned structure into individual light-emitting elements $T_{(-1)}$ to $T_{(+1)}$. Anode electrodes 40 have an ohmic contact with the p-type semiconductor layers 21, and gate electrodes 41 have an ohmic contact with the n-type semiconductor layers 22. Insulating layers 30 are formed to prevent short-circuiting between the elements and wirings, and at the same time, serve as protection films for preventing deterioration of characteristics. Portions surrounded by a broken line correspond to transistors Tr3, and are connected to the gate electrodes 41. Each transistor Tr3 has a collector (22), a base (23), and an emitter (24). Each transistor Tr1 has an emitter (21), a base (22), and a collector (23). Each transistor Tr2 has a collector (22), a base (23), and an emitter (24).

The base of the transistor Tr2 is electrically connected to the base of the transistor Tr3. The collectors of these transistors are isolated from each other. Each gate electrode 41 is connected to a power source $V_{GK}$ through a load resistor $R_L$, and the substrate 1 is grounded. The substrate 1 serves as the emitters of the transistors Tr2 and Tr3.

The insulating layers 30 are preferably formed of a material allowing light having a light-emission wavelength of a light-emitting thyristor to pass therethrough well. On the other hand, if light coupling occurs between the elements, the transfer operation of this embodiment may be influenced by the light coupling. In order to prevent this, each gate electrode partially extends into the isolation groove between the adjacent light-emitting elements so as to employ a structure capable of preventing light coupling.

The structure of this embodiment is the same as the equivalent circuit shown in the embodiment G-1 (FIG. 47), and performs the same operation. Therefore, if the high-level voltages of the transfer clocks $\phi_1$ and $\phi_2$ are set to alternately slightly overlap each other, the ON state of the light-emitting thyristors is sequentially transferred. That is, a light-emission point is sequentially transferred.

(Embodiment G-3)

Figure 49:
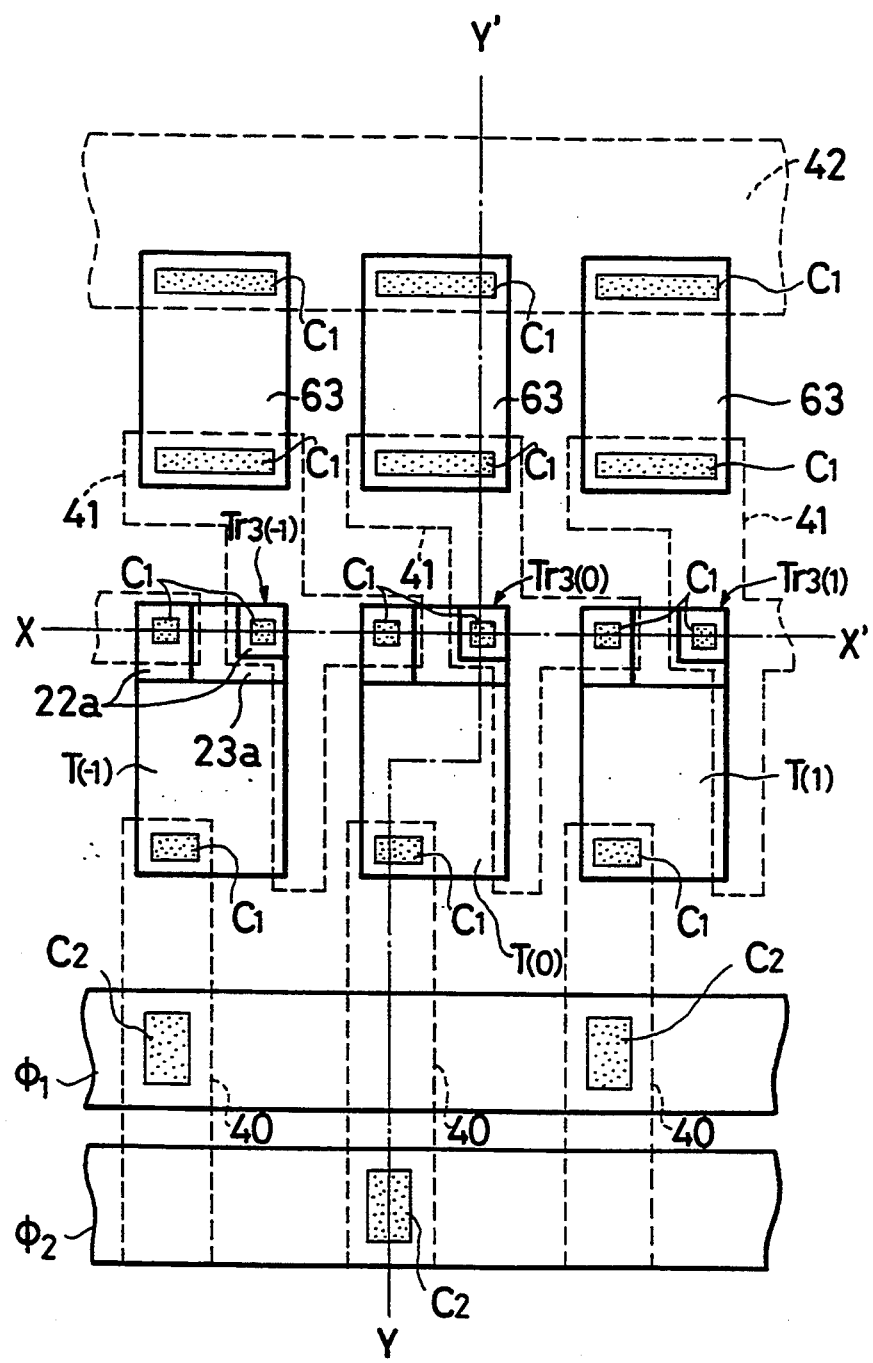
FIG. 49 is a plan view showing an embodiment G-3.
Figure 50:
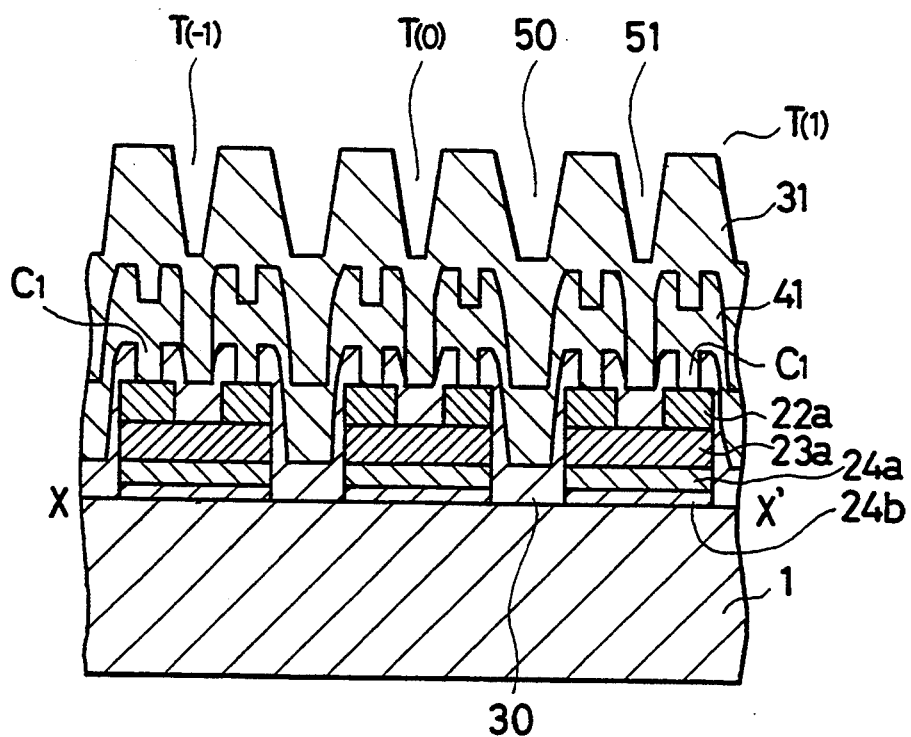
FIGS. 50 and 51 are sectional views showing the embodiment G-3.
Figure 51:
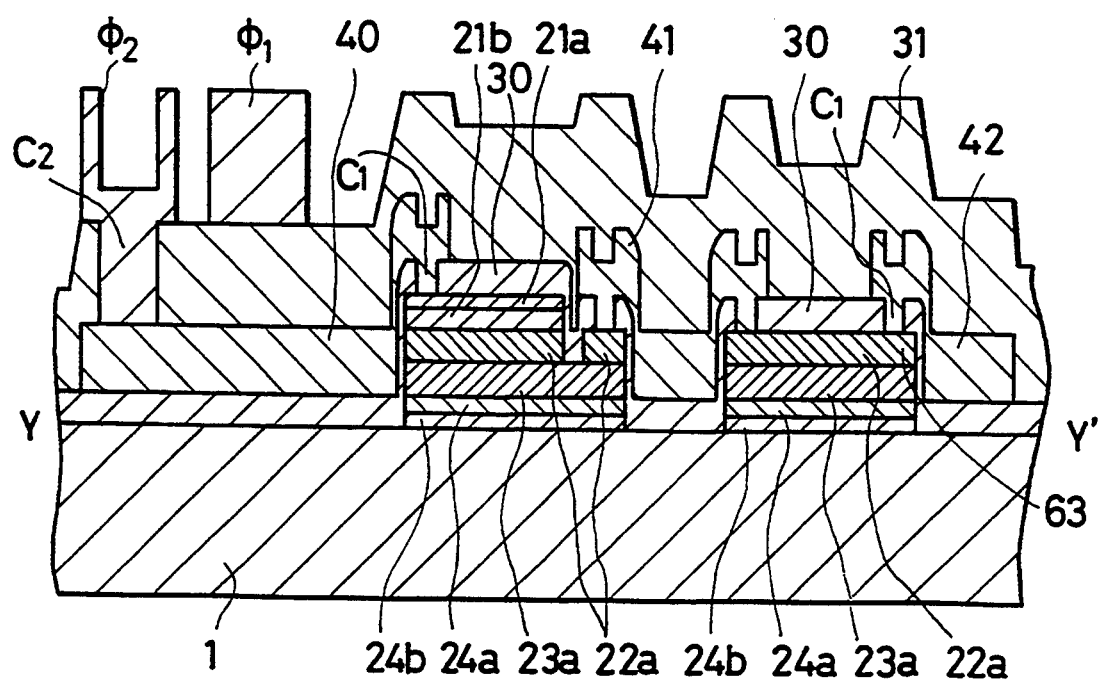

FIGS. 49, 50 and 51 show an embodiment G-3. This embodiment presents a practical structure of the embodiment G-2. FIG. 49 is a plan view of this embodiment, FIG. 50 is a sectional view taken along a line X—X' in FIG. 49, and FIG. 51 is a sectional view taken along a line Y—Y' in FIG. 49.

FIG. 49 will be described below.

A load resistor $R_L$ connected to the gate of each light-emitting thyristor is represented by a load resistor 63, and is formed by a semiconductor layer constituting light-emitting thyristors $T_{(-1)}$ to $T_{(1)}$. The collectors of current-mirror transistors $Tr3_{(-1)}$ to $Tr3_{(1)}$ are connected to gate electrodes 41 through contact holes $C_1$. The contact holes $C_1$ are connecting holes for connecting the semiconductor layers and the electrodes. Anode electrodes 40 of the light-emitting thyristors are connected to transfer clock lines $\phi_1$ and $\phi_2$ through connecting holes $C_2$ as through holes. A power source line 42 is connected to a power source voltage $V_{GK}$, and is connected to the load resistors 63 (i.e., $R_L$). The power source line 42 is formed simultaneously with the gate electrodes 41. The gate electrodes 41 also serve as light shielding layers for preventing the light-emitting elements $T_{(-2)}$ to $T_{(+1)}$ from mutual influences upon their light emission.

FIG. 50 is a sectional view taken along a line X—X', and FIG. 51 is a sectional view taken along a line Y—Y'. The light-emitting elements are formed as follows. An n-type GaAs layer 24b, an n-type AlGaAs layer 24a, a p-type GaAs layer 23a, an n-type GaAs layer 22a, a p-type AlGaAs layer 21b, and a p-type GaAs layer 21a are sequentially formed on an n-type GaAs substrate 1. Isolation grooves 50 for isolating the resultant structure into individual light-emitting elements are formed by photolithography or the like and etching. An isolation groove 51 is formed to isolate the light-emitting element $T_{(0)}$ and the current-mirror transistor Tr3. Each load resistor 63 ($R_L$) is formed of the n-type GaAs layer 22a of the light-emitting element. The resistor may be formed of another layer. For example, the resistor may be formed of the p-type GaAs layer 23a or may be formed as another resistor region.

A manufacturing process of the embodiment G-3 will be described below. The n-type GaAs layer 24b, the n-type AlGaAs layer 24a, the p-type GaAs layer 23a, the n-type GaAs layer 22a, the p-type AlGaAs layer 21b, and the p-type GaAs layer 21a are sequentially formed on the n-type GaAs substrate 1. The isolation grooves 50 are then formed to isolate the light-emitting elements and the resistors. The p-type GaAs layer 21a and the p-type AlGaAs layer 21b corresponding to gate lead portions and prospective transistor Tr3 portions are removed, and the isolation grooves 51 are formed. In the step of removing these p-type layers 21b and 21a, a portion of the p-type GaAs layer 22a serving as the resistors 63 is simultaneously removed. The insulating films 30 are formed, and the contact holes $C_1$ are formed therein. Thereafter, the electrodes 40, 41 and 42 are formed. The insulating films 31 as insulating interlayers are formed, and the through holes $C_2$ are formed. Thereafter, the electrodes $\phi_1$ and $\phi_2$ are formed. With the above-mentioned process, the structure of the embodiment F-3 is completed.

Embodiments H

Embodiments H described herein are related to composite elements each constituted by combining the light-emitting thyristor described above and a light deflector.

(Embodiment H-1)

When a composite element of this embodiment is applied to an optical scanning apparatus used in, e.g., an optical printer, optical scanning with high resolution can be realized.

Figure 61:
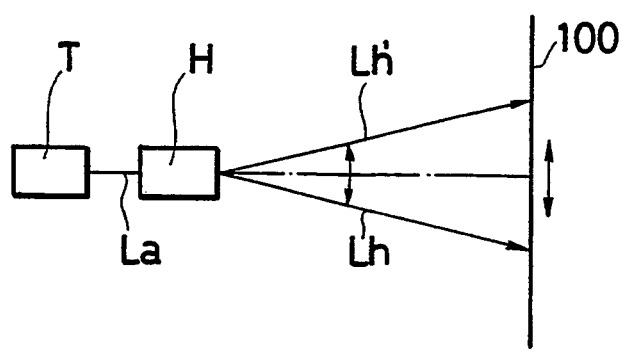
FIG. 61 is a view showing the principle of an optical scanning system by deflection.
Figure 62:
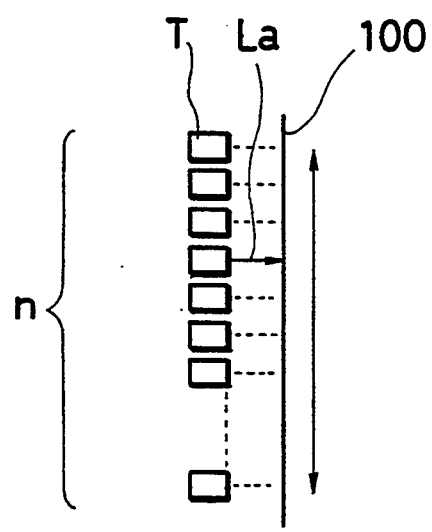
FIG. 62 is a view showing the principle of an optical scanning system using an array.

There are two typical optical scanning systems applied to a conventional optical printer. One system has a means H for deflecting a laser beam La or the like emitted from a light-emitting element T, as shown in FIG. 61. The other system causes an array T of n light sources arranged in series to sequentially flash and scan or causes a shutter array to open/close and scan (FIG. 62).

A typical apparatus of a light deflection system is a rotary polygonal mirror, which has advantages of a large deflection angle and a high resolution. However, such an apparatus is not easily made compact, an optical system requires a complex adjustment, and tends to be influenced by a mechanical vibration. Thus, the apparatus is not suitable for an application requiring high precision. As a light deflector capable of eliminating such drawbacks, one utilizing modulation of a refractive index using an acoustic-optical effect, electro-optical effect, or the like is known. Since such a deflector is a solid element, it can be easily rendered compact. Since the deflector includes no movable portion, it can be easily adjusted, and is not easily influenced by a mechanical vibration. Therefore, a scanning light spot has high positive accuracy. However, the deflection angle is small and resolution is low as compared to deflection by a mechanical means such as a rotary polygonal mirror, thus restricting its application range. Generally, optical scanning by deflection has an advantage that the number of light sources can be reduced. However, such an advantage leads to difficulty residing in maintaining light intensity constant on a light-receiving surface 100 for a wide optical scanning width.

An optical scanning system using light source array or a shutter array originally includes no movable portion, and is also advantageous that total scanning width can be desirably increased in proportional to the number of array elements in principle. However, a wide scanning width needs a lot of array elements such as optical shutters, so that the number of circuits (ICs) for driving these elements is increased accordingly. As a result, a manufacturing process such as wire bonding becomes complicated. This problem can be solved by using a light-emitting element array according to the present invention, and the number of circuits for driving the light-emitting element array can be greatly reduced, thus allowing an easy increase in optical scanning width.

When the above-mentioned self-scanning array is employed, the scanning width can be easily increased in the optical scanning system by a large number of light-emitting elements. However, light-emitting elements and light spots to be scanned have a one-to-one correspondence regardless of the scanning width. Therefore, in order to improve resolution of the light spot, a light-emission area of the light-emitting element must be reduced and an inter-element pitch must be shortened. However, the light-emission area has a lower limit as long as a light-emitting element is required to provide a light output of certain intensity. Therefore, the optical scanning using the array makes it difficult to reduce the pitch of light spots below a certain limit to improve resolution.

According to a composite element array of this embodiment, the conventional problem can be solved. For example, a large number of light-emitting or laser thyristors described in the embodiments B are linearly, two-dimensionally or three-dimensionally arranged, and control electrodes of the light-emitting elements are connected, as shown in FIG. 9. A light deflector capable of controlling an output direction of light emitted from each light-emitting element is provided to each light-emitting element so as to constitute the composite element array.

As to the light deflector, arbitrary elements such as one causing a gradient of a refractive index upon injection of a current, one for applying an electric field to control a refractive index and the like, may be used as long as they can deflect incident light.

In this embodiment, as shown in FIG. 52, a large number of light deflectors H paired with light-emitting elements T are linearly arranged. A light deflector which receives a light beam La emitted by each light-emitting element $T_{(i)}$ is represented by $H_{(i)}$.

The basic operation of the composite element array with the above structure will be described below. A light beam is emitted from a light deflector $H_{(0)}$ and reaches a point $x_0$ on a light-receiving surface 100. Control is made such that the light deflector $H_{(0)}$ starts a deflection operation at the same time when the light-emitting element $T_{(0)}$ is turned on. A deflection beam from the light deflector $H_{(0)}$ is moved in a direction of an arrow d, and reaches an end point $x_1$ on the light-receiving surface 100. At the same time, the next clock pulse causes the next light-emitting element $T_{(1)}$ to emit light, and the light deflector $H_{(1)}$ to start the sub-scanning operation. In this case, adjustment is made to cause the position of a light spot formed by the deflected light beam radiated at the end point $x_1$ to coincide with the spot position of the deflection start point $(x_1)$ of the light deflector $H_{(1)}$.

Thus, if similar setting and control are made, continuous, wide-range optical scanning can be realized by this system. If the resolution of the light deflectors H is represented by N, accuracy can be increased by N times without increasing the number of light-emitting elements.

If the number of light-emitting elements is M, the number of the light deflectors is M with the total number of 2M. Therefore, if N>2, accuracy can be improved as compared to an array including only the 2M light-emitting elements, where M is an integer. Thus, even though the resolution of the light deflector used in this embodiment is not so high, a remarkable effect can be obtained.

Figure 57:
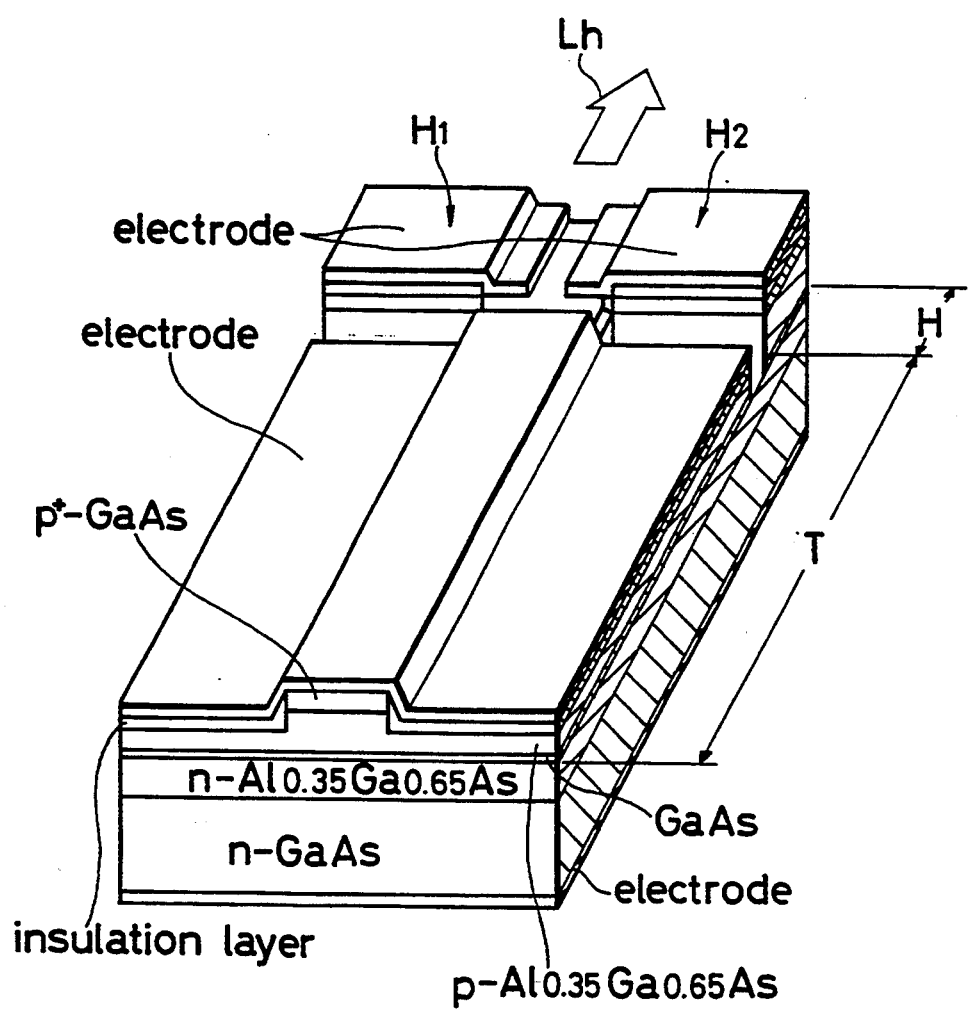
FIG. 57 is a perspective view of the laser thyristor portion and the light deflector portion.

An AlGaAs/GaAs-type composite element of the embodiment H-1 will be described in the detail below, as shown in FIG. 57.

A semiconductor laser with a light deflection function is disclosed in Electronic Letters, Vol 23, p. 361 (1987). Two anode electrodes are arranged at two sides of a semiconductor waveguide along which light output from a semiconductor laser propagates, and currents having asymmetrical magnitudes are injected into these electrodes, so that a refractive index of a waveguide portion is caused to have a gradient, thus performing light deflection.

In this embodiment, a semiconductor laser which has good beam convergence is employed as a light-emitting element T. Since threshold current control is performed, a laser thyristor is used. The light deflector H employs a device utilizing current injection as in the above-mentioned article, two electrodes are constituted by thyristors to achieve control by an external signal. The light-emitting elements T and light deflectors H are arranged in an array, as shown in FIG. 52, and are connected in the same manner as the network shown in FIG. 9, thus constituting a component element array.

Figure 53:
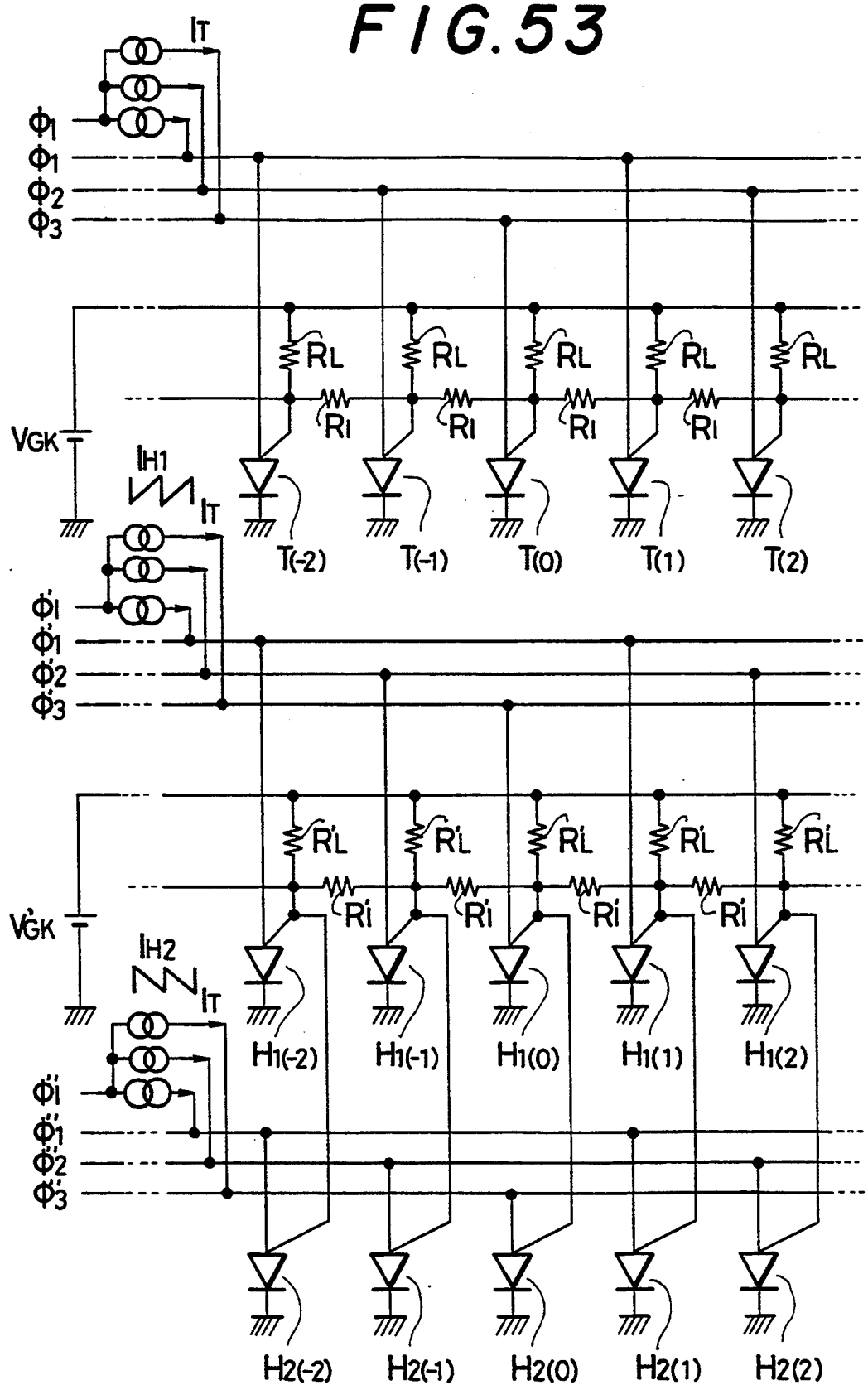
FIG. 53 is an equivalent circuit diagram of an embodiment H-1.

FIG. 53 shows interelement electrical connection. A plurality of laser thyristors T are connected through resistors $R_J$ and $R_L$ in the same manner as in FIG. 16. A plurality of current injection elements H1 and H2 constituting a plurality of the light deflectors H receive a bias voltage $V'_{GK}$ through load resistors $R'_L$ at their gate electrodes. The gate electrodes are electrically connected through resistors $R'_J$ so as to provide an interaction These laser thyristors T and the current injection elements H1 and H2 are connected so that currents $I_T$ controlled by light-emission signals $\phi_I$, $\phi_I'$ and $\phi_I''$ flow in the elements through lines $\phi_1$, $\phi_2$, $\phi_3$, $\phi_1'$, $\phi_2'$, $\phi_3'$, $\phi_1''$, $\phi_2''$ and $\phi_3''$.

Figure 54:
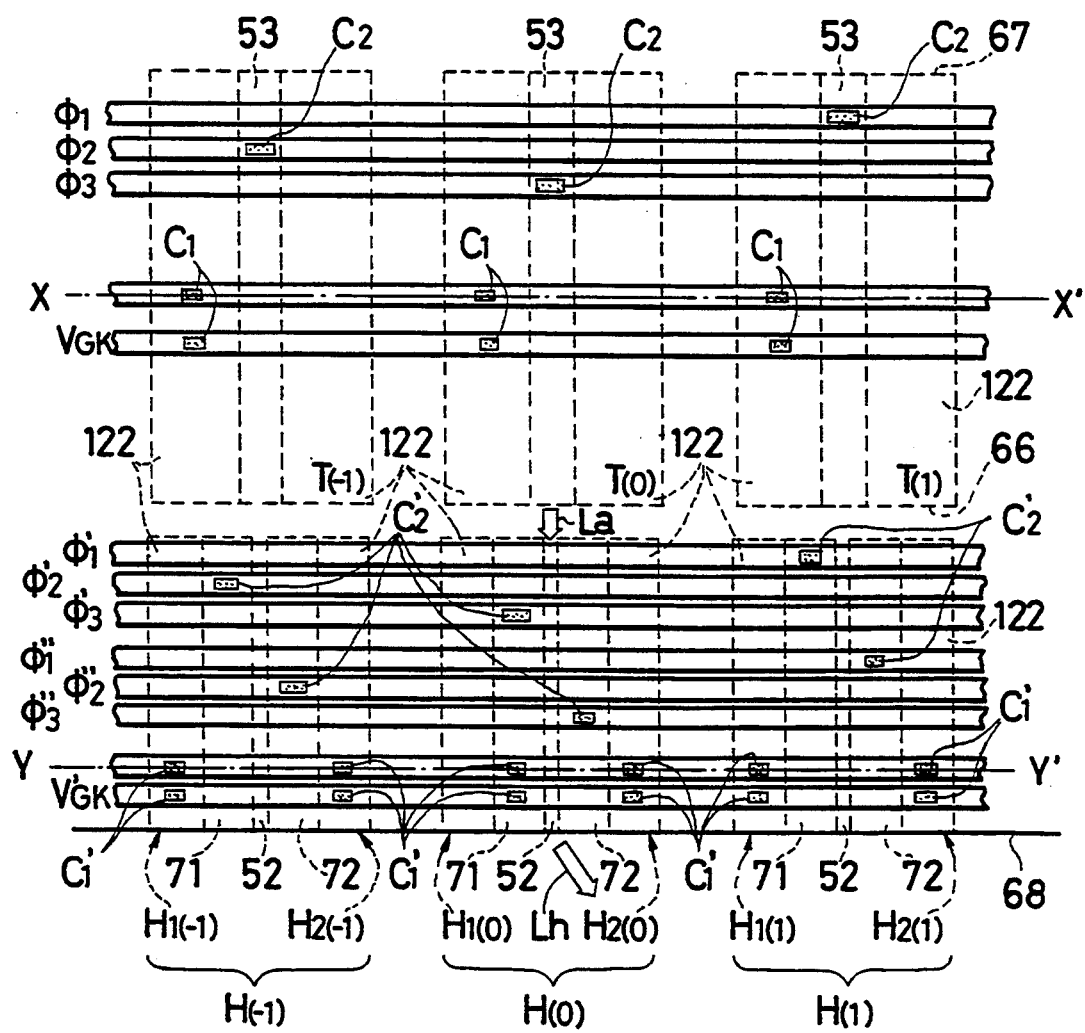
FIG. 54 is a partial plan view of the embodiment H-1.
Figure 55:
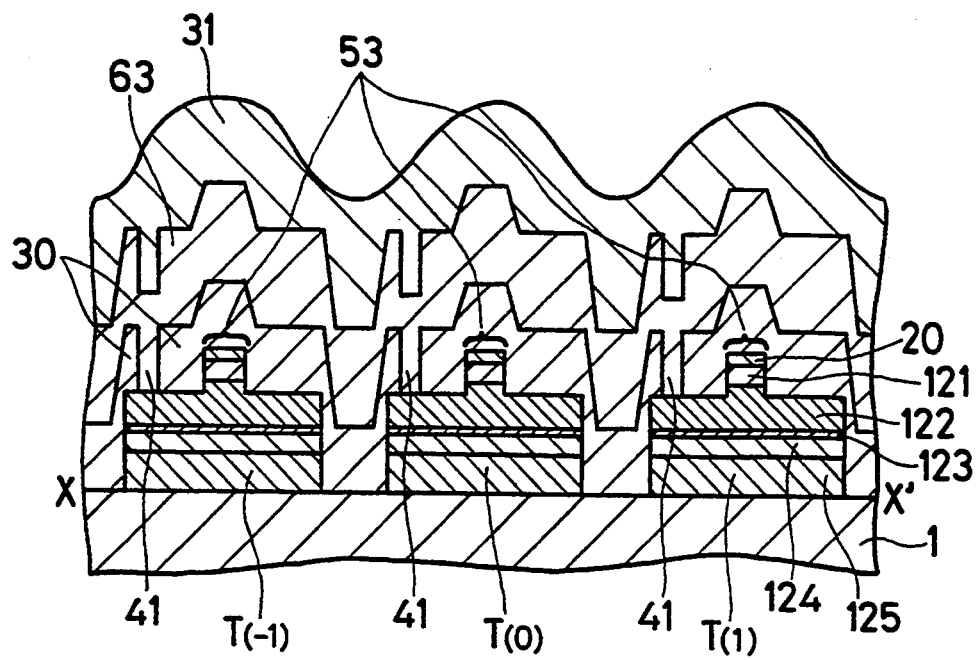
FIG. 55 is a sectional view of a laser thyristor portion of the embodiment H-1.
Figure 56:
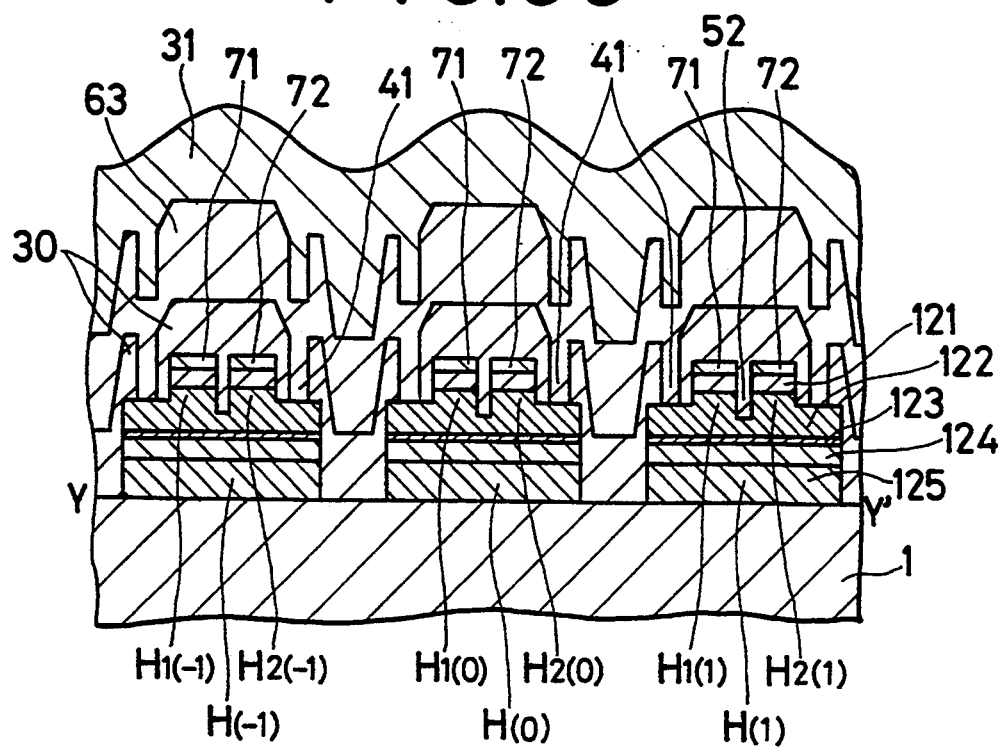
FIG. 56 is a sectional view of a light deflector portion of the embodiment H-1.

FIG. 54 is a partial plan view of a composite element array for realizing the above-mentioned electrical connection and light coupling. This arrangement is an example, and a different electrical wiring pattern may be employed as long as the elements are arranged so that laser output beams La from the laser thyristors T are efficiently incident on the light deflectors H. The relay resistors $R_J$ in this embodiment may be replaced with diodes as described in embodiments F. Thus, the number of clock lines can be decreased to two. FIGS. 55 and 56 show sectional structures corresponding to an Al-GaAs/GaAs-type laser thyristor array portion T (X—X' in FIG. 54) and a light deflector portion H (Y—Y' in FIG. 54).

The device structure of the composite element will be briefly described. The laser thyristor T and the light deflector H have a common crystal layer structure. This is not a necessary condition. However, in order to simplify a manufacturing process, a common crystal layer is preferably used. An appropriate n-type GaAs buffer layer (although not shown in FIG. 55) is formed on an n-type GaAs substrate 1. An n-type AlGaAs layer 125, a p-type AlGaAs layer 124, an i-type (non-doped) GaAs layer 123, an n-type AlGaAs layer 122, and a p-type AlGaAs layer 121 are sequentially formed on the buffer layer. A p-type GaAs layer may be formed as an uppermost contact layer on the resultant structure. The i-type (non-doped) GaAs layer 123 serves as an active layer of the laser, and AlGaAs layers 122 and 124 formed on the two major surfaces of the layer 123 serve as cladding layers. In the laser thyristor T of this embodiment, ridges or anodes 53 are formed on a layer 20 by partially removing the uppermost layer 121 to the halfway of the upper cladding layer 122 and are connected to clock lines $\phi_1$ to $\phi_3$ in every third fashion through contact holes $C_2$ provided on insulating layers 30 and 31. The laser structure is not always limited to this, and a burying structure may be used. Gate electrodes 41 are formed on the n-type AlGaAs layer 122 serving as the upper cladding layer and are connected to a two-dimensional sheet resistor (not shown) through upper contact holes $C_1$ provided on the insulating layer 30 with a predetermined pitch. The upper side of the sheet resistor is connected to a longitudinal bias line $V_{GK}$ through lower contact holes $C_1$ to provide load or pull-up resistors $R_L$ and relay resistors $R_J$. An end face 66 (FIG. 54) on the side of the deflector H of an optical resonator of the laser thyristor T is formed by, e.g., dry etching. The other end face 67 may be formed by a cleavage method.

The light deflector H is constituted by the same multilayer structure as that of the laser thyristor T. The current injection elements H1 and H2 are arranged at symmetrical positions with respect to a light propagation direction, and have the same thyristor structures as that of the laser thyristor T. The p-type AlGaAs layers 121 immediately under anode electrodes 71 and 72 each connected to clock lines $\phi'_1$ to $\phi'_3$, and $\phi''_1$ to $\phi''_3$, respectively, in every third fashion are isolated by a crosswise groove 52 so as to prevent a lateral current. Gate electrodes 41 are formed on the n-type AlGaAs layer 122 by removing the upper layers in the same manner as in the laser thyristor portion. Each light deflector H is arranged at a position capable of efficiently receiving a beam La output from the laser. However, the laser and the deflector must be electrically isolated.

FIG. 57 is a perspective view of a composite element described in the above-mentioned article ( Electronic Letters, 1987).

Crystal growth used in the above element formation can be achieved by LP-CVD, MO-CVD, or MBE. In this embodiment, since the laser employs a GaAs active layer, a light-emission wavelength is about 900 μm. However, the material is not limited to GaAs. If AlGaAs is used, the wavelength can be shortened to about 780 μm, while if InGaP or AlGaInP is used, it can be shortened to the order of 600 μm. These materials may be selected depending on applications.

Figure 58:
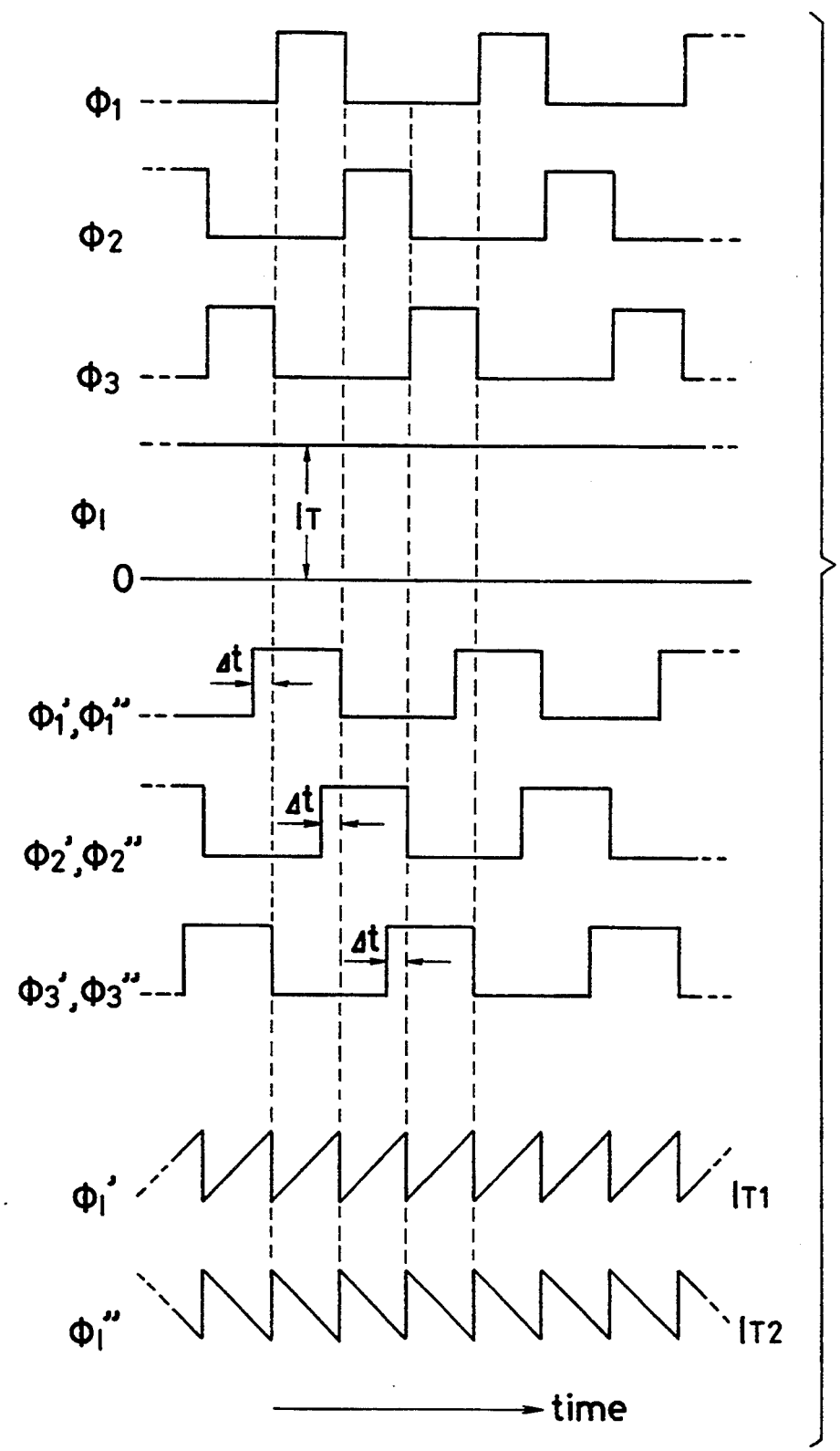
FIG. 58 is a drive timing chart of the embodiment H-1.

A drive method of the optical scanning composite element will be described below. Under the connection relationship shown in FIG. 53, clock pulses are sequentially applied to the laser thyristors $T_{(-1)}$, $T_{(0)}$ and $Te_{(1)}$ through the lines $\phi_2$, $\phi_3$, and $\phi_1$ at timings shown in FIG. 58 so as to transfer its minimum ON state. A laser drive current is supplied from the line $\phi_1$ to turn on and scan each laser. Pulses which rise earlier by $\Delta t$ than the clock pulses $\phi_1$ to $\phi_3$ are sequentially applied to pairs of thyristors $H1_{(-1)}$ and $H2_{(-1)}$ to $H1_{(1)}$ and $H2_{(1)}$ of the light deflectors $H_{(-1)}$, $H_{(0)}$ and $H_{(1)}$ through clock lines $\phi_1'$ to $\phi_3'$ and $\phi''_1$ to $0''_3$, respectively to minimum turn on the thyristors H1 and H2 corresponding to the maximum ON state laser thyristor. For example, the clock pulse is applied to the line $\phi_3$, and pulses are applied to the two thyristors $H1_{(0)}$ and $H2_{(0)}$ of the light deflector $H_{(0)}$ from the lines $\phi_3'$ and $\phi_3''$ immediately before the laser $T_{(0)}$ is turned on minimally, so that these thyristors are turned on minimally. When the laser T(0) is turned on maximally, symmetrical ramp signals $I_{T1}$ and $I_{T2}$ are applied via the clock lines $\phi_3'$ and $\phi_3''$, respectively, to the thyristors $H1_{(0)}$ and $H2_{(0)}$ to deflect or sweep the more intensive light from the laser thyristor $T_{(0)}$. The clock pulse becomes zero when the next clock pulse is sent to the line $\phi_1$, and the ramp currents are returned to the initial values. Thus, the thyristors $H1_{(0)}$ and $H2_{(0)}$ are turned off. At this time, the thyristors $H1_{(1)}$ and $H2_{(1)}$ of the adjacent light deflector $H_{(1)}$ have already been turned on, and start a deflection operation when the adjacent laser $T_{(1)}$ is turned on maximally. Thereafter, the elements are operated at the similar timings.

(Embodiment H-2)

Figure 60:
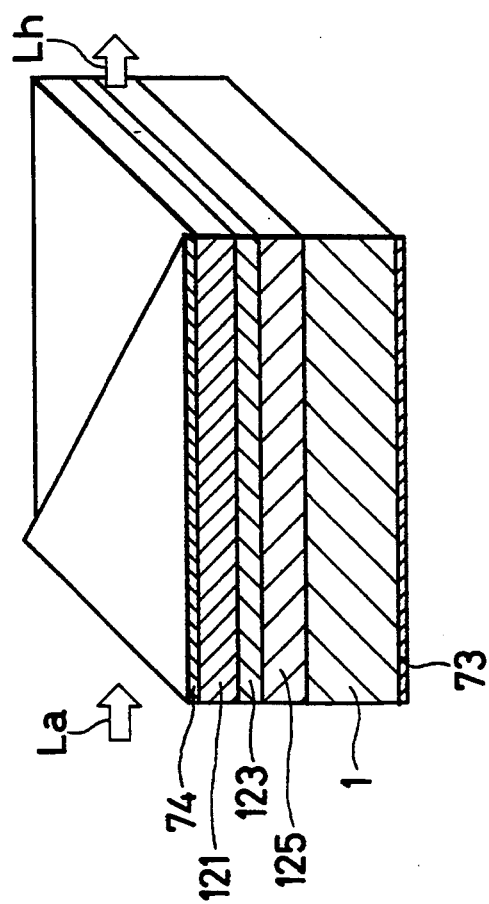
FIG. 60 is a perspective view showing a structure of a light deflector used in the embodiment H-2.

In an embodiment H-2, a light deflector of a type of controlling a refractive index by an electrical field is employed as the light deflector H to constitute a composite element. As is well known, the light deflector utilizing such an effect can be realized by using a dielectric crystal prism having an electro-optical effect. In the case of a semiconductor, not only the electro-optical effect but also Franz-Keldysh effect or a quantum trapping Stark effect using a quantum well can be utilized by applying a reverse bias to a junction. If such a composite effect is applied to a semiconductor waveguide, a semiconductor deflector can be easily analyzed from the above dielectric element. FIG. 60 shows its structure.

In this structure, an n-type AlGaAs layer 125, an i-type (non-doped) GaAs layer 123, and a p-type AlGaAs layer 121 are formed on an n-type GaAs substrate 1, and electrodes 73 and 74 are formed on two major surfaces of the resultant structure. A negative voltage is applied to the electrode 74 relative to the electrode 73, the i-type (non-doped) GaAs layer 123 is depleted, and an electric field is applied thereto. Depending on this electric field intensity, the refractive index of the i-type (non-doped) GaAs layer 123 is changed. Therefore, the refractive index under the electrode 74 is different from that of other regions, and this difference can be externally controlled. Thus, the direction of an output beam Lh can be controlled.

Figure 59A:
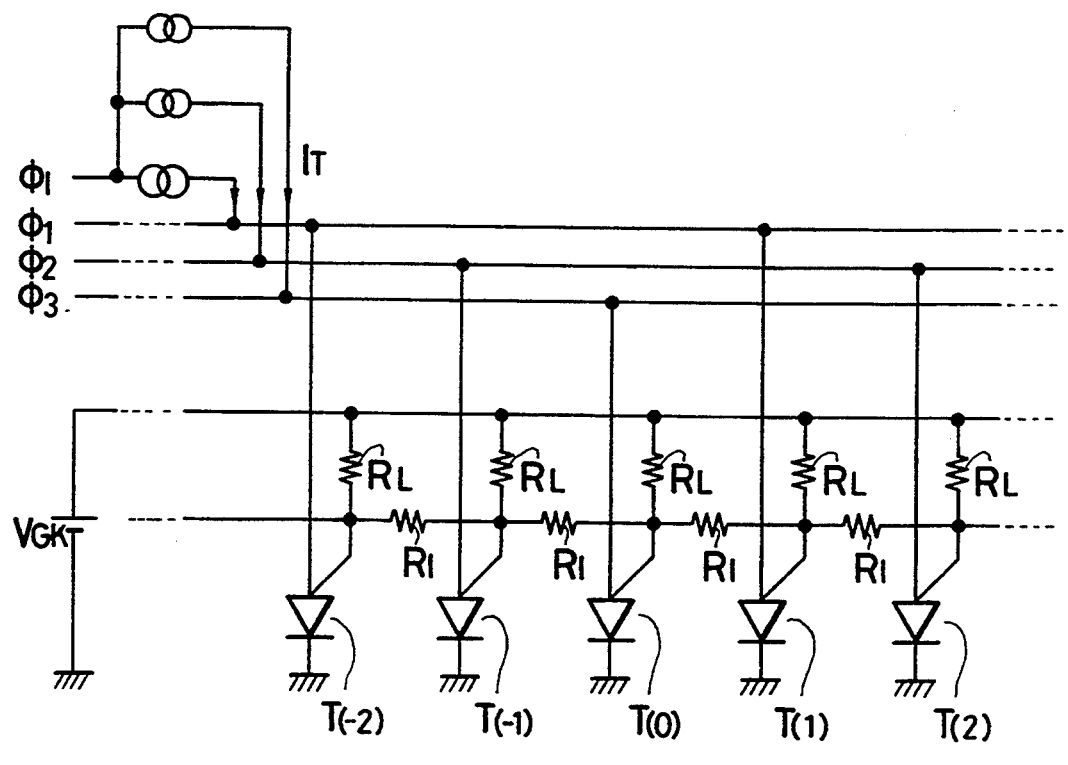
FIGS. 59A and 59B is an equivalent circuit diagram of an embodiment H-2.
Figure 59B:
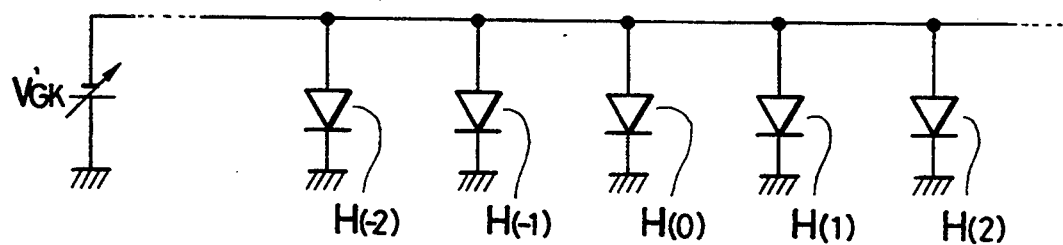

The light deflector H and the laser thyristor T are combined to realize a composite element. The same laser thyristor and arrangement as in the embodiment H-1 may be employed. However, since the light deflector of this embodiment is used in a reverse bias state, power consumption is small, and no problem is posed even if all the elements are always operated. In this case, the clock line need only be formed for the light-emitting element T, as shown in FIG. 59, and no gate electrodes are required for the light deflector H. Only a line for supplying a common ramp voltage $V'_{GK}$ is formed. Of course, the start and end points of this ramp voltage must be caused to coincide with turn-on and turn-off timings of each laser.

Note that the light deflector H in FIG. 60 has a simplest structure, and may employ another structure. For example, a light waveguide layer may comprise a quantum well layer. In this case, a quantum well laser thyristor is preferably employed to facilitate a manufacturing process.

The electrode shape is not limited to that shown in FIG. 60 as long as it can effectively form asymmetrical refractive index distribution. Furthermore, constituting materials need only be those having the above-mentioned effect, and at least materials described in the embodiment H-1 can be utilized.

As described above, when light deflectors are added to light-emitting elements, resolution of scanning light spots can be improved as compared to a composite element including only a light-emitting element array without increasing the number of light-emitting elements. Since the threshold current or voltage of the light-emitting elements can be controlled and their control electrodes are connected through electrical means, a simple scan system can be established only by applying drive clocks. Drive circuits are not complicated for an arrangement including the light deflectors.

What is claimed is:

1. A self-scanning light-emitting element array comprising:

an array of pnpn light-emitting elements disposed with a predetermined pitch along a longitudinal direction and separated by a grooved structure provided on said pnpn structure, integral to a common cathode layer and each having an anode and a gate for controlling its turn-on threshold;

a first insulating film covering the entire upper surface of said grooved structure, said film having a plurality of contact holes therein;

a plurality of crosswise electrodes provided on said first insulating film and each connected to said anode through a contact hole provided in said first insulating film;

a plurality of coupling means each of which is coupled between said gates of neighboring light-emitting elements through said contact holes a second insulating film covering the whole upper surface of said first insulating film having another set of contact holes therein; and first, second and third longitudinal clock lines provided on said second insulating film, each connected via said crosswise electrode through said contact holes in said second insulating film to said anodes of said first, second and third groups of said light-emitting elements in every third fashion.

2. An array according to claim 1, in which said coupling means consist of a resistor integral to said p or n layer connected between said gates of adjacent light-emitting elements.

3. An array according to claim 1, in which said coupling means comprises a 2-dimensional thin film resistor provided on said insulating film and connected to said gates of adjacent light-emitting elements through equidistant aligned contact holes provided in said first insulating film.

4. An array according to claim 1 further comprising;

a plurality of pull-up means includes separated p- or n-layers of the remaining npnp structure each coupled to said gate of said light-emitting element through a contact hole provided in said first insulating film; and a longitudinal bias line for supplying said bias current to said gates of said light-emitting elements through said pull-up means.

5. A self-scanning light-emitting element array comprising:

an array of pnpn light-emitting elements disposed in a line with a predetermined pitch along a longitudinal direction and separated by a groove provided on said pnpn structure, integral to a common cathode layer and each having an anode and a gate for controlling its turn-on threshold;

an insulating film covering the entire upper surface of the grooved structure;

a plurality of uni-directional coupling means provided on respective portions of said light-emitting elements partitioned by second grooves, respectively, each coupled to the next gate of said light-emitting elements via an electrode provided on said insulating film through a contact hole provided in said insulating film; and first and second longitudinal clock lines provided on said insulating film, each connected through another contact hole provided in said insulating film to said anodes of said every other light-emitting elements.

6. An array according to claim 5, in which said uni-directional coupling means comprises a diode connected between said first gates.

7. An array according to claim 5, in which said light-emitting elements have a second gate; and said uni-directional coupling means comprises a transistor having a base connected to said first gate of one of said light-emitting elements, a collector integral to said one of said light-emitting elements and an emitter connected to said first gate of said neighboring light-emitting element.

8. An array according to claim 5, in which said light-emitting elements have a second gate; and said uni-directional coupling means comprises an emitter grounded transistor having a base connected to said second gate of one of said light-emitting elements and a collector connected to said first gate of said neighboring light-emitting element.

9. An array according to claim 5, further comprising:

a plurality of crosswise electrodes provided on said insulating film, each connected to said anode through said contact hole and to one of said first and second longitudinal clock lines in every other fashion through a second contact hole provided in a second insulating film covering said insulating film;

a plurality of pull-up means each coupled to said gate of said light-emitting element through a contact hole provided in said insulating film; and a longitudinal bias line for supplying said bias current to said gates of said light-emitting elements through said pull-up means.

10. A self-scanning light-emitting element array comprising:

an array of cathode-common light-emitting elements disposed with a predetermined pitch along a longitudinal direction and separated by a groove provided on a multilayer structure, and each having an anode and a gate;

a first insulating film covering the entire upper surface of the grooved multilayer structure;

a plurality of crosswise electrodes provided on said first insulating film and each connected to said anode through a contact hole provided in said first insulating film;

a plurality of coupling means each coupled between said gates of neighboring light-emitting elements through said contact holes;

a second insulating film covering the entire upper surface of said first insulating film;

first, second and third longitudinal clock lines provided on said second insulating film, each connected through another contact hole provided in said insulating film to said anodes of said first, second and third light-emitting elements in every third fashion via said crosswise electrode;

first, second and third phase pulses having leading and trailing edge portions applied to said first, second and third longitudinal clock lines, respectively and said trailing edge portion of said phase pulse being overlapped to said leading edge portion of the next said phase pulse for transferring an ON state of said light-emitting elements; and three controllable current sources connected to said first, second and third longitudinal clock lines, respectively and controlled synchronously with said phase pulses for supplying an additional current to said ON state light-emitting element.

11. An array according to claim 10 further comprising:

a plurality of pull-up means includes separated p- or n-layers of the remaining multilayer structure each coupled to said gate of said light-emitting element through a contact hole provided in said first insulating film; and a longitudinal bias line for supplying said bias current to said gates of said light-emitting elements through said pull-up means.

12. A self-scanning light-emitting element array comprising:

an array of cathode-common light-emitting elements disposed with a predetermined pitch along a longitudinal direction and separated by a groove provided on a multilayer structure, and each having an anode and a gate;

a first insulating film covering the entire upper surface of the grooved structure;

a plurality of uni-directional coupling means provided on respective portions of said light-emitting elements partitioned by second grooves, respectively, each coupled to the next gate of said light-emitting elements via an electrode provided on said insulating film through another contact hole provided in said insulating film;

first and second longitudinal clock lines each connected to said anodes of said first and second light-emitting elements in every other fashion;

first and second phase pulses having leading and trailing edge portions applied to said first and second longitudinal clock lines, respectively and said trailing edge portion of said phase pulse being overlapped to said leading edge portion of next said phase pulse for transferring an ON state of said light-emitting elements; and two controllable current sources connected to said first and second longitudinal clock lines, respectively and controlled synchronously with said phase pulses for supplying an additional current to said ON state light-emitting element.

13. A self-scanning light-emitting element array comprising:

an array on pnpn laser thyristors disposed with a predetermined pitch along a longitudinal direction and separated by crosswise grooves provided on a pnpn structure, integral to a common cathode layer and each having a crosswise anode and a crosswise gate for controlling its turn-on threshold;

a first insulating film covering the entire upper surface of the grooved structure;

a two-dimensional resistive film provided on said first insulating film, connected to said gates of said laser thyristors through equidistant upper contact holes provided in said first insulating film to provide a plurality of coupling means.

a second insulating film covering the whole upper surface of said first insulating film;

a bias line provided on lower side of said resistive film through a longitudinal contact hole to provide a plurality of pull-up means; and first, second and third longitudinal clock lines provided on said second insulating film above said laser thyristors, each connected through other contact holes provided in said first and second insulating films to said anodes of said first, second and third groups of said laser thyristors in every third fashion.

14. A self-scanning light-emitting element array comprising:

an array on pnpn laser thyristors disposed in a line with a predetermined pitch along a longitudinal direction and separated by crosswise grooves provided on a pnpn structure, integral to a common cathode layer and a notched lower gate layer and each having a crosswise anode, said notched lower gate layer having a plurality of narrow portions equivalent to coupling means between gates thereof;

an insulating film covering the entire upper surface of the grooved structure; and first, second and third longitudinal clock lines provided on said insulating film above said laser thyristors, each connected through other contact holes provided in said insulating film to said anodes of said first, second and third groups of said laser thyristors in every third fashion.

15. A self-scanning light-emitting element array comprising:

an array of pnpn laser thyristors disposed in a line with a predetermined pitch along a longitudinal direction and separated by crosswise grooves provided on a pnpn structure, integral to a common cathode layer, and each having a central crosswise anode and a right-side gate;

an insulating film covering the entire upper surface of the grooved structure;

a plurality of uni-directional coupling means provided on left-side portions of said laser thyristors partitioned by second grooves, respectively;

a plurality of electrodes provided on said insulating film and each connecting one of said uni-directional coupling means with the next gate of said laser thyristor through a contact hole provided in said insulating film; and first and second longitudinal lines provided on said insulating film, each connected through another contact hole provided in said insulating film to said anodes of said every other light-emitting elements.

* * * * *

UNITED STATES PATENT AND TRADEMARK OFFICE
CERTIFICATE OF CORRECTION

PATENT NO. : 5,451,977

DATED : Sept. 19, 1995

INVENTOR(S) : Yukihisa Kusuda, et al

Figure 22:
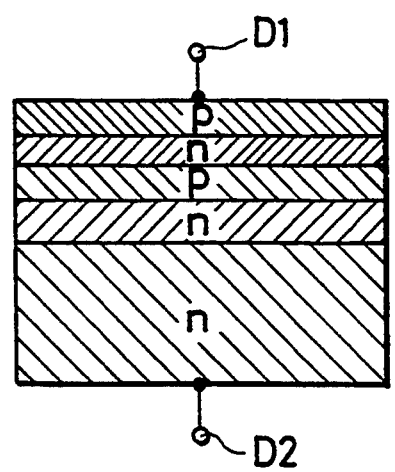
FIG. 22 is a schematic sectional view showing a structure of a light-emitting thyristor.

It is certified that error appears in the above-indentified patent and that said Letters Patent is hereby corrected as shown below:

Drawing sheet 1 of 38, consisting of Figs. 21 and 22, should be deleted to be replaced with the following attached page.

Signed and Sealed this

Fifth Day of August, 1997

Attest:

Attesting Officer

BRUCE LEHMAN

Commissioner of Patents and Trademarks